(12) United States Patent
Endo

(10) Patent No.: US 9,508,448 B2
(45) Date of Patent: Nov. 29, 2016

(54) MEMORY ELEMENT AND SIGNAL PROCESSING CIRCUIT

(75) Inventor: Masami Endo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 680 days.

(21) Appl. No.: 13/405,422

(22) Filed: Feb. 27, 2012

(65) Prior Publication Data

US 2012/0230138 A1 Sep. 13, 2012

(30) Foreign Application Priority Data

Mar. 8, 2011 (JP) ................ 2011-050025
May 14, 2011 (JP) ................ 2011-108904

(51) Int. Cl.
*G11C 11/40* (2006.01)
*G11C 19/28* (2006.01)
*G11C 19/18* (2006.01)
*G11C 16/04* (2006.01)

(52) U.S. Cl.
CPC ............. *G11C 19/28* (2013.01); *G11C 19/184* (2013.01); *G11C 16/0441* (2013.01)

(58) Field of Classification Search
CPC .................................................. G11C 11/40
USPC ...................................... 365/182, 150, 187
See application file for complete search history.

(56) References Cited

U.S. PATENT DOCUMENTS 5,218,607 A 6/1993 Saito et al.
5,699,317 A * 12/1997 Sartore et al. ........... 365/230.06
5,731,856 A 3/1998 Kim et al.
5,744,864 A 4/1998 Cillessen et al.
5,838,604 A * 11/1998 Tsuboi et al. .................. 365/63

(Continued)

FOREIGN PATENT DOCUMENTS

EP 0 404 061 A2 12/1990
EP 1 737 044 A1 12/2006

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Hoai V Ho
*Assistant Examiner* — Jay Radke
(74) *Attorney, Agent, or Firm* — Fish & Richardson P.C.

(57) ABSTRACT

A memory element having a novel structure and a signal processing circuit including the memory element are provided. A first circuit, including a first transistor and a second transistor, and a second circuit, including a third transistor and a fourth transistor, are included. A first signal potential and a second signal potential, each corresponding to an input signal, are respectively input to a gate of the second transistor via the first transistor in an on state and to a gate of the fourth transistor via the third transistor in an on state. After that, the first transistor and the third transistor are turned off. The input signal is read out using both the states of the second transistor and the fourth transistor. A transistor including an oxide semiconductor in which a channel is formed can be used for the first transistor and the third transistor.

31 Claims, 37 Drawing Sheets

(56) References Cited

U.S. PATENT DOCUMENTS

| | | | |
|---|---|---|---|
| 5,847,577 A * | 12/1998 | Trimberger | 326/38 |
| 5,936,881 A * | 8/1999 | Kawashima et al. | 365/149 |
| 6,108,229 A * | 8/2000 | Shau | 365/52 |
| 6,294,274 B1 | 9/2001 | Kawazoe et al. | |
| 6,344,990 B1 * | 2/2002 | Matsumiya et al. | 365/63 |
| 6,507,523 B2 | 1/2003 | Pekny | |
| 6,515,892 B1 | 2/2003 | Itoh et al. | |
| 6,563,174 B2 | 5/2003 | Kawasaki et al. | |
| 6,727,522 B1 | 4/2004 | Kawasaki et al. | |
| 6,762,951 B2 | 7/2004 | Itoh et al. | |
| 6,876,569 B2 | 4/2005 | Itoh et al. | |
| 7,023,721 B2 | 4/2006 | Itoh et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,102,862 B1 * | 9/2006 | Lien et al. | 361/56 |
| 7,105,868 B2 | 9/2006 | Nause et al. | |
| 7,189,992 B2 | 3/2007 | Wager, III et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,339,187 B2 | 3/2008 | Wager, III et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,888,207 B2 | 2/2011 | Wager, III et al. | |
| 8,004,481 B2 | 8/2011 | Yamazaki et al. | |
| 8,202,365 B2 | 6/2012 | Umeda et al. | |
| 8,547,753 B2 | 10/2013 | Takemura et al. | |
| 8,860,108 B2 | 10/2014 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0058731 A1 * | 3/2003 | Park | 365/233 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0047184 A1 | 3/2004 | Tran et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Theiss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0001205 A1 * | 1/2007 | Kimura | 257/296 |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0165441 A1 * | 7/2007 | Kurjanowicz et al. | 365/96 |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0217260 A1 * | 9/2007 | Kitagawa | 365/185.05 |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0108198 A1 | 5/2008 | Wager, III et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0147578 A1 | 6/2009 | Scade et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0202183 A1 * | 8/2010 | Kurjanowicz | 365/94 |
| 2010/0304529 A1 | 12/2010 | Sasaki et al. | |
| 2011/0089417 A1 | 4/2011 | Yamazaki et al. | |
| 2011/0156024 A1 | 6/2011 | Koyama et al. | |
| 2011/0176357 A1 | 7/2011 | Koyama et al. | |
| 2012/0032730 A1 * | 2/2012 | Koyama | G11C 8/04 327/530 |
| 2012/0170355 A1 | 7/2012 | Ohmaru et al. | |
| 2012/0182782 A1 * | 7/2012 | Kurjanowicz et al. | 365/94 |
| 2012/0182788 A1 | 7/2012 | Kurokawa | |
| 2012/0206956 A1 | 8/2012 | Fujita | |

FOREIGN PATENT DOCUMENTS

| | | |
|---|---|---|
| EP | 2 226 847 A2 | 9/2010 |
| JP | 58-205226 A | 11/1983 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-027419 A | 2/1991 |
| JP | 05-251705 A | 9/1993 |
| JP | 06-119257 A | 4/1994 |
| JP | 08-264794 A | 10/1996 |
| JP | 10-078836 A | 3/1998 |
| JP | 10-223776 A | 8/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-368226 A | 12/2002 |
| JP | 2003-086000 A | 3/2003 |

(56) References Cited

FOREIGN PATENT DOCUMENTS

| | | | |
|---|---|---|---|
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2006-502597 | 1/2006 | |
| JP | 2006-050208 A | 2/2006 | |
| JP | 2007-096055 A | 4/2007 | |
| JP | 2007-123861 A | 5/2007 | |
| JP | 2007-125823 A | 5/2007 | |
| JP | 2009-167087 A | 7/2009 | |
| JP | 2010-040815 A | 2/2010 | |
| WO | WO-00/70682 | 11/2000 | |
| WO | WO-2004/038757 | 5/2004 | |
| WO | 2004/114391 A1 | 12/2004 | |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

(56) References Cited

OTHER PUBLICATIONS

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with new Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," JPN. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Toshio Kamiya et al.; "Carrier Transport Properties and Electronic Structures of Amorphous Oxide Semiconductors: The present status"; Engineering Application of Solid State Physics; 2009; pp. 621-633; vol. 44, Issue 9 with English language translation.

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6-8, 2010; pp. 504-507.

Taiwanese Office Action (Application No. 101106752) Dated Apr. 18, 2016.

* cited by examiner

FIG. 27A    FIG. 27B
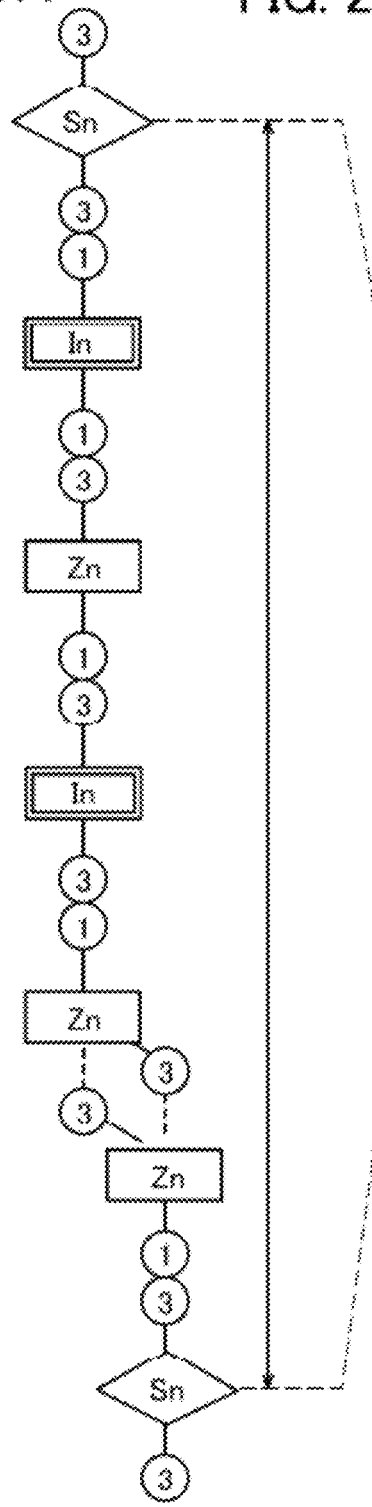
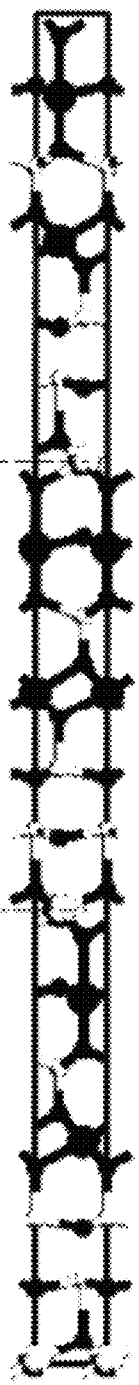
FIG. 27C
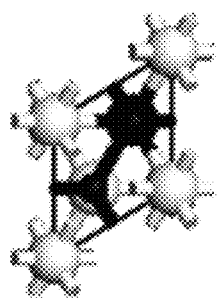
● In
◐ Sn
○ Zn
• O

FIG. 29A $$\mu = \mu_0 \exp\left(-\frac{E}{kT}\right)$$

FIG. 29B $$E = \frac{e^2 N^2}{8\varepsilon n} = \frac{e^3 N^2 t}{8\varepsilon C_{ox} V_g}$$

FIG. 29C $$I_d = \frac{W \mu V_g V_d C_{ox}}{L} \exp\left(-\frac{E}{kT}\right)$$

FIG. 29D $$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8 kT \varepsilon C_{ox} V_g}$$

FIG. 29E $$\frac{1}{\mu_1} = \frac{1}{\mu_0} + \frac{D}{B} \exp\left(-\frac{x}{l}\right)$$

MEMORY ELEMENT AND SIGNAL PROCESSING CIRCUIT

BACKGROUND OF THE INVENTION

1. Field of the Invention

The present invention relates to a memory element, and to a memory device and a signal processing circuit including the memory element. Furthermore, the present invention relates to an electronic device including the signal processing circuit.

2. Description of the Related Art

A signal processing circuit such as a central processing unit (CPU) has a variety of configurations depending on its application but is generally provided with some kinds of memory devices such as a register and a cache memory as well as a main memory for storing data or a program. A register has a function of temporarily holding data for carrying out arithmetic processing, holding a program execution state, or the like. In addition, a cache memory is located between an arithmetic circuit and a main memory in order to reduce low-speed access to the main memory and speed up the arithmetic processing.

In a storage device such as a register or a cache memory, writing of data needs to be performed at higher speed than in a main memory. Thus, in general, a flip-flop or the like is used as a register, and a static random access memory (SRAM) or the like is used as a cache memory. That is, for such a register, a cache memory, or the like, a volatile memory device in which data is erased when supply of a power voltage is stopped.

In order to reduce power consumption, a method for temporarily stopping a supply of a power supply voltage to a signal processing circuit in a period during which data is not input and output has been suggested. In the method, a nonvolatile memory device is located in the periphery of a volatile memory device such as a register or a cache memory, so that the data is temporarily stored in the non-volatile memory device. Thus, the register, the cache memory, or the like holds data even while supply of power supply potential is stopped in the signal processing circuit (for example, see Patent Document 1).

In addition, in the case where supply of the power supply voltage is stopped for a long time in a signal processing circuit, data in a volatile memory device is transferred to an external memory device such as a hard disk or a flash memory before the supply of the power supply voltage is stopped, so that the data can be prevented from being erased.

REFERENCE

Patent Document

[Patent Document 1] Japanese Published Patent Application No. H10-078836

SUMMARY OF THE INVENTION

In such a signal processing circuit disclosed in Patent Document 1, a ferroelectric is used for a memory element included in a non-volatile memory device. In the memory element including a ferroelectric, a ferroelectric material is fatigued by repetition of data writing, which causes a problem such as a writing error. As a result, the number of rewriting times is limited.

In the case where a flash memory is used as the non-volatile memory device, a high voltage is applied to generate a tunnel current, whereby injection or release of electrons is performed. Therefore, there are problems such that memory elements intensively deteriorate by repeatedly performing data rewriting, so that the number of rewriting times is limited.

In the case where data of a volatile memory device is stored in an external memory device while supply of a power supply voltage is stopped in the signal processing circuit, it takes a long time until the data is returned from the external memory device to the volatile memory device. Therefore, such a signal processing circuit is not suitable for a short-time stop of power supply for the purpose of a reduction in power consumption.

In view of the above problems, one object of an embodiment of the present invention is to provide a memory element having a novel structure. One object of an embodiment of the present invention is to provide a signal processing circuit including the memory element.

A memory element that is one embodiment of the present invention includes a first circuit and a second circuit. The first circuit includes a first transistor and a second transistor. The second circuit includes a third transistor and a fourth transistor. A signal potential corresponding to a first signal is input to a gate of the second transistor via the first transistor which is in an on state. A signal potential corresponding to a second signal is input to a gate of the fourth transistor via the third transistor which is in an on state. After that, the first transistor is turned off, so that the first circuit holds the signal potential corresponding to the first signal in the gate of the second transistor; the third transistor is turned off, so that the second circuit holds the signal potential corresponding to the second signal in the gate of the fourth transistor (hereinafter, such operation is referred to as data writing to the memory element). Then, the first signal or the second signal is read out using both of the state of the second transistor and the state of the fourth transistor (hereinafter, such operation is referred to as data reading from the memory element). Here, the state of a transistor denotes whether the transistor is in an on state or in an off state. Note that the second signal may be an inverted signal of the first signal or the same signal as the first signal. In addition, the polarity of the second transistor may be different from or the same as the polarity of the fourth transistor. Here, the polarity of a transistor denotes whether the transistor is an n-channel transistor or is a p-channel transistor. "The polarity of one transistor is the same as the polarity of another transistor" indicates that both of the two transistors are n-channel transistors or p-channel transistors; "the polarity of one transistor is different from the polarity of another transistor" indicates that one of the two transistors is an n-channel transistor and the other is a p-channel transistor.

The use of transistors with extremely small off-state current as the first transistor and the third transistor makes it possible to hold potentials (signal potentials) of the gates of the second transistor and the fourth transistor for a long time. Accordingly, it is possible that the memory element holds the first signal and the second signal for a long time. In this manner, in the memory element, it is possible that periodic data rewriting operation (hereinafter, referred to as refresh operation) is unnecessary or the frequency of the refresh operation is greatly reduced, whereby the memory element can substantially function as a non-volatile memory element. As the transistor with extremely small off-state current, a transistor whose channel is formed in a layer or in a substrate including a semiconductor having a wider bandgap than silicon can be used. As the semiconductor having a wider bandgap than silicon, compound semiconductors such as an oxide semiconductor and a nitride semiconductor can be given. For example, a transistor including an oxide semiconductor in which a channel is formed can be used for the first transistor and the third transistor.

(Structure Using Sense Amplifier)

The reading of the first signal or the second signal using both of the state of the second transistor and the state of the fourth transistor can be performed using a sense amplifier. The structure of the reading can be varied depending on a relation between the polarity of the second transistor and the polarity of the fourth transistor, a relation between the first signal and the second signal, and a relation between a potential applied to one of a source and a drain of the second transistor and a potential applied to one of a source and a drain of the fourth transistor. Specific examples of the structure are described below.

(Specific Example 1)

An example of the structure of the reading is described in which the second signal is an inverted signal of the first signal, the polarity of the second transistor is different from the polarity of the fourth transistor, and the potential applied to the one of the source and the drain of the second transistor is the same as the potential applied to the one of the source and the drain of the fourth transistor.

Here, "the potential applied to one of the source and the drain of the second transistor is the same as the potential applied to one of the source and the drain of the fourth transistor" indicates, for example, that a low power supply potential is applied to the one of the source and the drain of the second transistor and the one of the source and the drain of the fourth transistor, or that a high power supply potential is applied to the one of the source and the drain of the second transistor and the one of the source and the drain of the fourth transistor. Here, the low power supply potential can be a ground potential.

The memory element can further include a sense amplifier and a precharge circuit. The precharge circuit can include a first switch, a second switch, and a wiring (or a terminal) to which a precharge potential is applied. The other of the source and the drain of the second transistor and the other of the source and the drain of the fourth transistor are electrically connected to each other and electrically connected to an input terminal of the sense amplifier via the first switch. In addition, the wiring to which the precharge potential is applied is electrically connected to the input terminal of the sense amplifier via the second switch. Then, the sense amplifier amplifies and outputs a potential which is input to the input terminal. Note that the sense amplifier may output a result of a comparison between a reference potential and the potential which is input to the input terminal. With the output of the sense amplifier, the first signal or the second signal can be read out. As the sense amplifier, for example, an inverter, a clocked inverter, a buffer, a latch circuit, an operational amplifier, or the like can be used. When the precharge circuit is provided, the first switch is turned off and the second switch is turned on so that the input terminal of the sense amplifier can have a precharge potential, and then the first switch is turned on and the second switch is turned off so that the potential of the input terminal of the sense amplifier can be set at a predetermined potential corresponding to stored data. Thus, a time until the potential of the input terminal of the sense amplifier is set at the predetermined potential corresponding to the stored data can be shortened. As a result, the data stored in the memory element can be read out speedily.

(Specific Example 2)

An example of the structure of the reading is described in which the second signal is of the same signal as the first signal, the polarity of the second transistor is different from the polarity of the fourth transistor, and the potential applied to the one of the source and the drain of the second transistor is the same as the potential applied to the one of the source and the drain of the fourth transistor.

The memory element can further include a sense amplifier, a first precharge circuit, and a second precharge circuit. The first precharge circuit can include a first switch, a second switch, and a first wiring (or terminal) to which a precharge potential is applied. The second precharge circuit can include a third switch, a fourth switch, and a second wiring (or terminal) to which a precharge potential is applied. The other of the source and the drain of the second transistor is electrically connected to a first input terminal of the sense amplifier via the first switch. The other of the source and the drain of the fourth transistor is electrically connected to a second input terminal of the sense amplifier via the third switch. The first wiring to which the precharge potential is applied is electrically connected to the first input terminal of the sense amplifier via the second switch, and the second wiring to which the precharge potential is applied is electrically connected to the second input terminal of the sense amplifier via the fourth switch. The sense amplifier outputs a result of a comparison between the potential which is input to the first input terminal and the potential which is input to the second terminal. With the output, the first signal or the second signal can be read out. As the sense amplifier, for example, a latch circuit, an operational amplifier, or the like can be used. When the first precharge circuit is provided, the first switch is turned off and the second switch is turned on so that the first input terminal of the sense amplifier can have the precharge potential, and then the first switch is turned on and the second switch is turned off so that the potential of the first input terminal of the sense amplifier can be set at a predetermined potential corresponding to stored data. In addition, when the second precharge circuit is provided, the third switch is turned off and the fourth switch is turned on so that the second input terminal of the sense amplifier can have the precharge potential, and then the third switch is turned on and the fourth switch is turned off so that the potential of the second input terminal of the sense amplifier can be set at the predetermined potential corresponding to the stored data. Thus, a time until the potentials of the first input terminal and the second input terminal of the sense amplifier each become the predetermined potential corresponding to the stored data can be shortened. As a result, the data stored in the memory element can be read out speedily.

(Specific Example 3)

An example of the structure of the reading is described in which the second signal is an inverted signal of the first signal, the polarity of the second transistor is the same as the polarity of the fourth transistor, and the potential applied to the one of the source and the drain of the second transistor is the same as the potential applied to the one of the source and the drain of the fourth transistor.

The memory element can further include a sense amplifier, a first precharge circuit, and a second precharge circuit. The first precharge circuit can include a first switch, a second switch, and a first wiring (or terminal) to which a precharge potential is applied. The second precharge circuit can include a third switch, a fourth switch, and a second wiring (or terminal) to which a precharge potential is applied. The other of the source and the drain of the second transistor is electrically connected to a first input terminal of the sense amplifier via the first switch. The other of the source and the drain of the fourth transistor is electrically connected to a second input terminal of the sense amplifier via the third switch. The first wiring to which the precharge potential is applied is electrically connected to the first input terminal of the sense amplifier via the second switch, and the second wiring to which the precharge potential is applied is electrically connected to the second input terminal of the sense amplifier via the fourth switch. The sense amplifier outputs a result of a comparison between the potential which is input to the first input terminal and the potential which is input to the second terminal. With the output, the first signal or the second signal can be read out. As the sense amplifier, for example, a latch circuit, an operational amplifier, or the like can be used. When the first precharge circuit is provided, the first switch is turned off and the second switch is turned on so that the first input terminal of the sense amplifier can have the precharge potential, and then the first switch is turned on and the second switch is turned off so that the potential of the first input terminal of the sense amplifier can be set at a predetermined potential corresponding to stored data. In addition, when the second precharge circuit is provided, the third switch is turned off and the fourth switch is turned on so that the second input terminal of the sense amplifier can have the precharge potential, and then the third switch is turned on and the fourth switch is turned off so that the potential of the second input terminal of the sense amplifier can be set at the predetermined potential corresponding to the stored data. Thus, a time until the potentials of the first input terminal and the second input terminal of the sense amplifier each become the predetermined potential corresponding to the stored data can be shortened. As a result, the data stored in the memory element can be read out speedily.

(Specific Example 4)

An example of the structure of the reading is described in which the second signal is the same signal as the first signal, the polarity of the second transistor is the same as the polarity of the fourth transistor, and the potential applied to the one of the source and the drain of the second transistor is the same as the potential applied to the one of the source and the drain of the fourth transistor.

The memory element can further include a sense amplifier and a precharge circuit. The precharge circuit can include a first switch, a second switch, and a wiring (or a terminal) to which a precharge potential is applied. The other of the source and the drain of the second transistor and the other of the source and the drain of the fourth transistor are electrically connected to each other and electrically connected to an input terminal of the sense amplifier via the first switch. In addition, the wiring to which the precharge potential is applied is electrically connected to the input terminal of the sense amplifier via the second switch. Then, the sense amplifier amplifies and outputs a potential which is input to the input terminal. Note that the sense amplifier may output a result of a comparison between a reference potential and the potential which is input to the input terminal. With the output of the sense amplifier, the first signal or the second signal can be read out. As the sense amplifier, for example, an inverter, a clocked inverter, a buffer, a latch circuit, an operational amplifier, or the like can be used. When the precharge circuit is provided, the first switch is turned off and the second switch is turned on so that the input terminal of the sense amplifier can have a precharge potential, and then the first switch is turned on and the second switch is turned off so that the potential of the input terminal of the sense amplifier can be set at a predetermined potential corresponding to stored data. Thus, a time until the potential of the input terminal of the sense amplifier is set at the predetermined potential corresponding to the stored data can be shortened. As a result, the data stored in the memory element can be read out speedily.

(Specific Example 5)

An example of the structure of the reading is described in which the second signal is an inverted signal of the first signal, the polarity of the second transistor is different from the polarity of the fourth transistor, and the potential applied to the one of the source and the drain of the second transistor is different from the potential applied to the one of the source and the drain of the fourth transistor.

Here, "the potential applied to one of the source and the drain of the second transistor is different from the potential applied to one of the source and the drain of the fourth transistor" indicates, for example, that a low power supply potential is applied to the one of the source and the drain of the second transistor and a high potential is applied to the one of the source and the drain of the fourth transistor, or that a high power supply potential is applied to the one of the source and the drain of the second transistor and a low power supply potential is applied to the one of the source and the drain of the fourth transistor.

The memory element can further include a sense amplifier, a first precharge circuit, and a second precharge circuit. The first precharge circuit can include a first switch, a second switch, and a first wiring (or terminal) to which a precharge potential is applied. The second precharge circuit can include a third switch, a fourth switch, and a second wiring (or terminal) to which a precharge potential is applied. The other of the source and the drain of the second transistor is electrically connected to a first input terminal of the sense amplifier via the first switch. The other of the source and the drain of the fourth transistor is electrically connected to a second input terminal of the sense amplifier via the third switch. The first wiring to which the precharge potential is applied is electrically connected to the first input terminal of the sense amplifier via the second switch, and the second wiring to which the precharge potential is applied is electrically connected to the second input terminal of the sense amplifier via the fourth switch. The sense amplifier outputs a result of a comparison between the potential which is input to the first input terminal and the potential which is input to the second terminal. With the output, the first signal or the second signal can be read out. As the sense amplifier, for example, a latch circuit, an operational amplifier, or the like can be used. When the first precharge circuit is provided, the first switch is turned off and the second switch is turned on so that the first input terminal of the sense amplifier can have the precharge potential, and then the first switch is turned on and the second switch is turned off so that the potential of the first input terminal of the sense amplifier can be set at a predetermined potential corresponding to stored data. In addition, when the second precharge circuit is provided, the third switch is turned off and the fourth switch is turned on so that the second input terminal of the sense amplifier can have the precharge potential, and then the third switch is turned on and the fourth switch is turned off so that the potential of the second input terminal of the sense amplifier can be set at the predetermined potential corresponding to the stored data. Thus, a time until the potentials of the first input terminal and the second input terminal of the sense amplifier each become the predetermined potential corresponding to the stored data can be shortened. As a result, the data stored in the memory element can be read out speedily.

(Specific Example 6)

An example of the structure of the reading is described in which the second signal is of the same signal as the first signal, the polarity of the second transistor is different from the polarity of the fourth transistor, and the potential applied to the one of the source and the drain of the second transistor is different from the potential applied to the one of the source and the drain of the fourth transistor.

The memory element can further include a sense amplifier and a precharge circuit. The precharge circuit can include a first switch, a second switch, and a wiring (or a terminal) to which a precharge potential is applied. The other of the source and the drain of the second transistor and the other of the source and the drain of the fourth transistor are electrically connected to each other and electrically connected to an input terminal of the sense amplifier via the first switch. In addition, the wiring to which the precharge potential is applied is electrically connected to the input terminal of the sense amplifier via the second switch. Then, the sense amplifier amplifies and outputs a potential which is input to the input terminal. Note that the sense amplifier may output a result of a comparison between a reference potential and the potential which is input to the input terminal. With the output of the sense amplifier, the first signal or the second signal can be read out. As the sense amplifier, for example, an inverter, a clocked inverter, a buffer, a latch circuit, an operational amplifier, or the like can be used. When the precharge circuit is provided, the first switch is turned off and the second switch is turned on so that the input terminal of the sense amplifier can have a precharge potential, and then the first switch is turned on and the second switch is turned off so that the potential of the input terminal of the sense amplifier can be set at a predetermined potential corresponding to stored data. Thus, a time until the potential of the input terminal of the sense amplifier is set at the predetermined potential corresponding to the stored data can be shortened. As a result, the data stored in the memory element can be read out speedily.

(Specific Example 7)

An example of the structure of the reading is described in which the second signal is an inverted signal of the first signal, the polarity of the second transistor is the same as the polarity of the fourth transistor, and the potential applied to the one of the source and the drain of the second transistor is different from the potential applied to the one of the source and the drain of the fourth transistor.

The memory element can further include a sense amplifier and a precharge circuit. The precharge circuit can include a first switch, a second switch, and a wiring (or a terminal) to which a precharge potential is applied. The other of the source and the drain of the second transistor and the other of the source and the drain of the fourth transistor are electrically connected to each other and electrically connected to an input terminal of the sense amplifier via the first switch. In addition, the wiring to which the precharge potential is applied is electrically connected to the input terminal of the sense amplifier via the second switch. Then, the sense amplifier amplifies and outputs a potential which is input to the input terminal. Note that the sense amplifier may output a result of a comparison between a reference potential and the potential which is input to the input terminal. With the output of the sense amplifier, the first signal or the second signal can be read out. As the sense amplifier, for example, an inverter, a clocked inverter, a buffer, a latch circuit, an operational amplifier, or the like can be used. When the precharge circuit is provided, the first switch is turned off and the second switch is turned on so that the input terminal of the sense amplifier can be have a precharge potential, and then the first switch is turned on and the second switch is turned off so that the potential of the input terminal of the sense amplifier can be set at a predetermined potential corresponding to stored data. Thus, a time until the potential of the input terminal of the sense amplifier is set at the predetermined potential corresponding to the stored data can be shortened. As a result, the data stored in the memory element can be read out speedily.

(Specific Example 8)

An example of the structure of the reading is described in which the second signal is the same signal as the first signal, the polarity of the second transistor is the same as the polarity of the fourth transistor, and the potential applied to the one of the source and the drain of the second transistor is different from the potential applied to the one of the source and the drain of the fourth transistor.

The memory element can further include a sense amplifier, a first precharge circuit, and a second precharge circuit. The first precharge circuit can include a first switch, a second switch, and a first wiring (or terminal) to which a precharge potential is applied. The second precharge circuit can include a third switch, a fourth switch, and a second wiring (or terminal) to which a precharge potential is applied. The other of the source and the drain of the second transistor is electrically connected to a first input terminal of the sense amplifier via the first switch. The other of the source and the drain of the fourth transistor is electrically connected to a second input terminal of the sense amplifier via the third switch. The first wiring to which the precharge potential is applied is electrically connected to the first input terminal of the sense amplifier via the second switch, and the second wiring to which the precharge potential is applied is electrically connected to the second input terminal of the sense amplifier via the fourth switch. The sense amplifier outputs a result of a comparison between the potential which is input to the first input terminal and the potential which is input to the second terminal. With the output, the first signal or the second signal can be read out. As the sense amplifier, for example, a latch circuit, an operational amplifier, or the like can be used. When the first precharge circuit is provided, the first switch is turned off and the second switch is turned on so that the first input terminal of the sense amplifier can have the precharge potential, and then the first switch is turned on and the second switch is turned off so that the potential of the first input terminal of the sense amplifier can be set at a predetermined potential corresponding to stored data. In addition, when the second precharge circuit is provided, the third switch is turned off and the fourth switch is turned on so that the second input terminal of the sense amplifier can have the precharge potential, and then the third switch is turned on and the fourth switch is turned off so that the potential of the second input terminal of the sense amplifier can be set at the predetermined potential corresponding to the stored data. Thus, a time until the potentials of the first input terminal and the second input terminal of the sense amplifier each become the predetermined potential corresponding to the stored data can be shortened. As a result, the data stored in the memory element can be read out speedily.

Those described above are the specific examples of the structure in which the first signal or the second signal is read out using both of the state of the second transistor and the state of the fourth transistor.

(Variations of Precharge Circuit)

The precharge potential can be any of a high power supply potential, a low power supply potential, and an intermediate potential between the high power supply potential and the low power supply potential. Note that in (Specific Example 2), (Specific Example 3), (Specific Example 5), and (Specific Example 8), the precharge potential which is applied to the first wiring may be the same as or different from the precharge potential which is applied to the second wiring. In the case where the precharge potential which is applied to the first wiring is the same as the precharge potential which is applied to the second wiring, a single wiring can be used to serve as the first wiring and the second wiring. In addition, a single switch can be provided to serve as the second switch and the fourth switch.

Further, in (Specific Example 1), (Specific Example 4), (Specific Example 6), and (Specific Example 7), instead of providing the second switch of the precharge circuit, the input terminal of the sense amplifier may be electrically connected to the wiring to which the precharge potential is applied via a load. In this manner, when both of the second transistor and the fourth transistor are in an off state, the precharge potential can be input to the input terminal of the sense amplifier with the signal potential corresponding to the first signal and the signal potential corresponding to the second signal. In addition, (Specific Example 2), (Specific Example 3), (Specific Example 5), and (Specific Example 8), instead of providing the second switch of the first precharge circuit, the first input terminal of the sense amplifier may be electrically connected to the first wiring to which the precharge potential is applied via a load; and instead of providing the fourth switch of the second precharge circuit, the second input terminal of the sense amplifier may be electrically connected to the second wiring to which the precharge potential is applied via a load. In this manner, when both of the second transistor and the fourth transistor are in an off state, the precharge potentials can be input to the first input terminal and the second input terminal of the sense amplifier with the signal potential corresponding to the first signal and the signal potential corresponding to the second signal. Note that, as described above, in the case where the wiring to which the precharge potential is applied (or the first wiring and the second wiring) is electrically connected to the input terminal of the sense amplifier via the load without the second switch (or the second switch and the fourth switch) of the precharge circuit, the first switch (or the first switch and the third switch) can be omitted.

(Variations of Memory Element)

The memory element that is one embodiment of the present invention may further include a capacitor including a pair of electrodes one of which is electrically connected to the input terminal of the sense amplifier. Alternatively, in the case where the sense amplifier includes the first input terminal and the second input terminal, the memory element may further include a capacitor including a pair of electrodes one of which is electrically connected to the first input terminal of the sense amplifier and another capacitor including a pair of electrodes one of which is electrically connected to the second input terminal of the sense amplifier. That is, the memory element may further include a storage capacitor which holds the potential of the input terminal of the sense amplifier (or storage capacitors which hold the potentials of the first input terminal and the second input terminal of the sense amplifier). Note that a parasitic capacitance of an element included in the wiring or the sense amplifier or the like is positively used, whereby the parasitic capacitance can be used as a substitute for the storage capacitor. The memory element that is one embodiment of the present invention may further include a capacitor including a pair of electrodes one of which is electrically connected to the gate of the second transistor, and a capacitor including a pair of electrodes one of which is electrically connected to the gate of the fourth transistor. That is, the memory element may further include a storage capacitor which holds the potential of the gate of the second transistor and a storage capacitor which holds the potential of the gate of the fourth transistor. Note that a parasitic capacitance of the transistor, the wiring, or the like is positively used, whereby the parasitic capacitance can be used as a substitute for the storage capacitor.

The first transistor and the third transistor may be each a transistor including two gate electrodes between which an oxide semiconductor layer is provided. The threshold voltage or the like of such a transistor can be controlled by using a signal input to one of the two gate electrodes, and the off-state current of the transistor can also be reduced. In addition, the on-state current of the transistor can also be increased. When the on-state current of each of the first transistor and the third transistor is increased, data writing to the memory element can be performed more speedily.

The memory element that is one embodiment of the present invention may have a structure which further includes a volatile memory circuit and in which a signal corresponding to data stored in the volatile memory circuit is the first signal or the second signal, and an output signal or an inverted signal of the output signal of the sense amplifier is input to the volatile memory circuit. This structure allows the memory element including the first circuit and the second circuit to hold the data stored in the volatile memory circuit before supply of a power supply voltage to the memory element is stopped. After that, when the supply of the power supply voltage is stopped, the data stored in the volatile memory circuit is lost. However, the data stored in the memory element including the first circuit and the second circuit is not lost. Thus, the data can be held during a period in which the supply of the power supply voltage is stopped. Then, after the supply of the power supply voltage restarts, the data held in the memory element including the first circuit and the second circuit is returned to the volatile memory circuit. In this manner, it is possible to back up the data held in the volatile memory circuit.

One embodiment of the present invention may be a signal processing circuit including the memory element.

It is possible to provide a memory element in which periodic data rewriting operation (hereinafter, referred to as refresh operation) is unnecessary or the frequency of the refresh operation can be greatly reduced. Here, the memory element is one which stores data in such a manner that a signal potential is input to predetermined nodes (the gate of the second transistor and the gate of the fourth transistor), transistors with extremely small off-state current (the first transistor and the third transistor) are turned off, and the nodes are made in a floating state. Therefore, it is possible to reduce degradation of the element due to repetition of data rewriting and increase the number of rewritable times of data.

Further, a piece of data is written in the memory element as two signals, i.e., the first signal and the second signal. In other words, in the memory element, the signal potential corresponding to the first signal is input and held in the gate of the second transistor in the first circuit and the signal potential corresponding to the second signal is input and held in the gate of the fourth transistor in the second circuit. Then, the piece of the data is read out from the memory element using both of the state of the second transistor which is determined by the first signal and the state of the fourth transistor which is determined by the second signal. Therefore, even if one of the potentials of the gates of the second transistor and the fourth transistor is not the predetermined signal potential, when the other of the potentials of the gates of the second transistor and the fourth transistor becomes the predetermined signal potential, it is possible to write, hold, and read out the predetermined data. Thus, writing errors or reading errors of data can be reduced. In addition, a period needed for data writing to the memory element can be set short, so that the memory element whose writing speed is high can be provided.

The use of the memory element in a signal processing circuit allows the signal processing circuit to hold data for a long time even after the supply of the power supply voltage is stopped. Thus, when supply of a power supply voltage restarts, the signal processing circuit can immediately start predetermined processing using the stored data. Therefore, stop of the power supply for a short time can be performed frequently in the signal processing circuit, so that power consumption can be further reduced. In addition, as described above, it is possible to increase the number of rewritable times of data, and when the memory element in which writing errors and reading errors of data hardly occur is used in the signal processing circuit, the reliability of the signal processing circuit can be improved. In addition, as described above, the use of the memory element whose writing speed is high in the signal processing circuit makes it possible to also improve the operation speed of the signal processing circuit.

BRIEF DESCRIPTION OF THE DRAWINGS

In the accompanying drawings:

FIGS. 27A to 27C illustrate the crystal structure of an oxide material;

FIGS. 29A to 29E are formulae for calculating mobility;

DETAILED DESCRIPTION OF THE INVENTION

Figure 1:
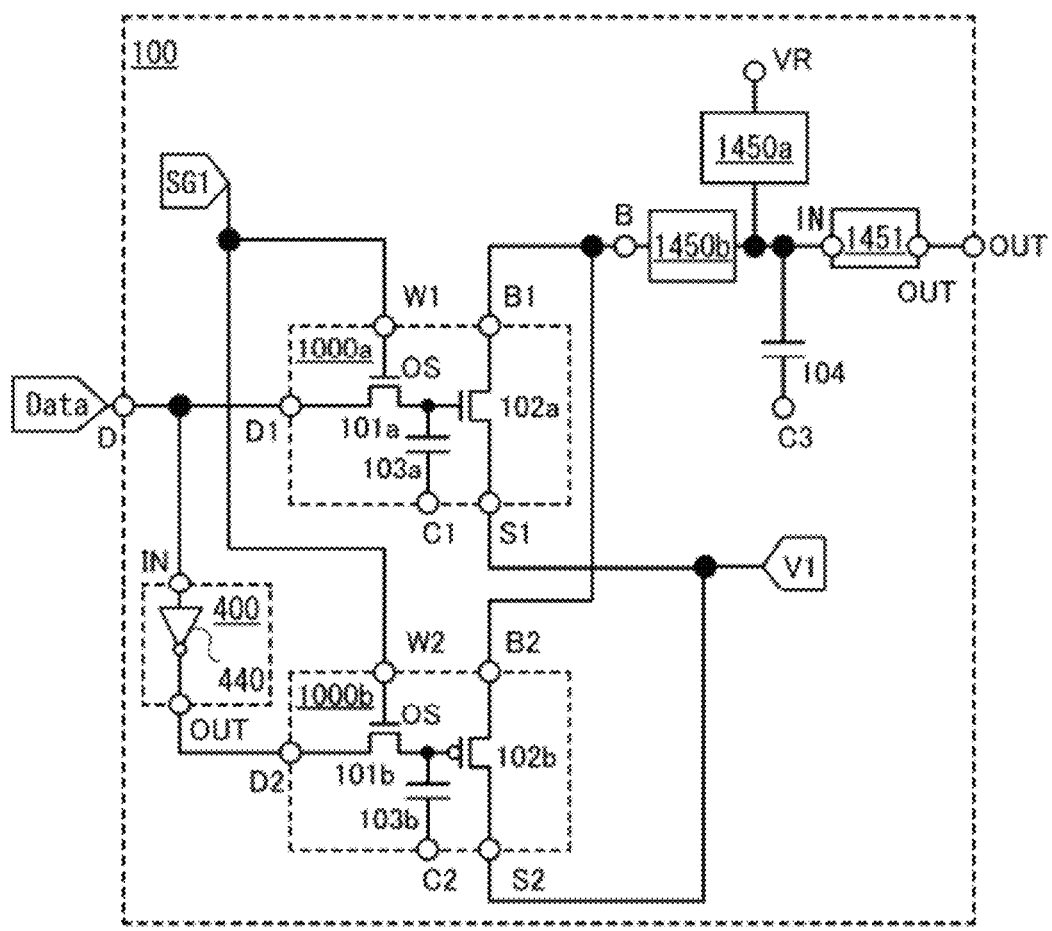
FIG. 1 illustrates the structure of a memory element.

Embodiments and examples of the present invention will be described below with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments and examples below.

Note that functions of the "source" and "drain" may be switched in the case where transistors of different polarities are employed or in the case where the direction of a current flow changes in a circuit operation, for example. Therefore, the terms "source" and "drain" can be used to denote the drain and the source, respectively, in this specification.

In addition, even when independent components are electrically connected to each other in a circuit diagram, there is the case where one conductive film has functions of a plurality of components, such as the case where part of a wiring functions as a terminal or an electrode. The "electrical connection" in this specification includes in its category such a case where one conductive film has functions of a plurality of components.

In this specification and the like, the terms "over" and "below" do not necessarily mean "directly on" and "directly below", respectively, in the description of a physical relationship between components. For example, the expression "a gate electrode over a gate insulating layer" can mean the case where there is an additional component between the gate insulating layer and the gate electrode.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

The ordinal number such as "first", "second", and "third" are used in order to avoid confusion among components.

(Embodiment 1)

(Structure 1 of Memory Element)

FIG. 1 illustrates a memory element that is one embodiment of the present invention. In FIG. 1, a memory element 100 includes a circuit 1000*a*, a circuit 1000*b*, an inverter circuit 400, a sense amplifier 1451, a switch 1450*a*, a switch 1450*b*, and a capacitor 104. Data is input to a terminal D, and the memory element 100 holds a signal corresponding to the data and outputs the signal corresponding to the data from a terminal OUT. The circuit 1000*a* includes a transistor 101*a*, a transistor 102*a*, and a capacitor 103*a*. The circuit 1000*b* includes a transistor 101*b*, a transistor 102*b*, and a capacitor 103*b*. Note that one or all of the capacitor 103*a*, the capacitor 103*b*, and the capacitor 104 can be omitted by positively using a parasitic capacitance or the like.

In the circuit 1000*a*, a gate of the transistor 101*a* is electrically connected to a terminal W1, one of a source and a drain of the transistor 101*a* is electrically connected to a terminal D1, and the other of the source and the drain of the transistor 101*a* is electrically connected to a gate of the transistor 102*a*. One of a source and a drain of the transistor 102*a* is electrically connected to a terminal B1, and the other of the source and the drain of the transistor 102*a* is electrically connected to a terminal S1. One electrode of a pair of electrodes of the capacitor 103*a* is electrically connected to the gate of the transistor 102*a*, and the other electrode of the pair of electrodes of the capacitor 103*a* is electrically connected to a terminal C1. In the circuit 1000*b*, a gate of the transistor 101*b* is electrically connected to a terminal W2, one of a source and a drain of the transistor 101*b* is electrically connected to a terminal D2, and the other of the source and the drain of the transistor 101*b* is electrically connected to a gate of the transistor 102*b*. One of a source and a drain of the transistor 102*b* is electrically connected to a terminal B2, and the other of the source and the drain of the transistor 102*b* is electrically connected to a terminal S2. One electrode of a pair of electrodes of the capacitor 103*b* is electrically connected to the gate of the transistor 102*b*, and the other electrode of the pair of electrodes of the capacitor 103*b* is electrically connected to a terminal C2.

Transistors with extremely low off-state current are used as the transistor 101*a* and the transistor 101*b*. As the transistor with extremely small off-state current, a transistor whose channel is formed in a layer or in a substrate including a semiconductor having a wider bandgap than silicon can be used. As the semiconductor having a wider bandgap than silicon, compound semiconductors such as an oxide semiconductor and a nitride semiconductor can be given. For example, a transistor including an oxide semiconductor in which a channel is formed can be used for the transistor 101*a* and the transistor 101*b*. In FIG. 1, "OS" is written beside each of the transistor 101*a* and the transistor 101*b* in order to indicate the transistor 101*a* and the transistor 101*b* each including an oxide semiconductor layer in which a channel is formed.

In the memory element 100 illustrated in FIG. 1, a signal which is input to the terminal D2 of the circuit 1000*b* is an inverted signal of a signal which is input to the terminal D1 of the circuit 1000*a*, which is obtained by inversion by the inverter circuit 400. As the inverter circuit 400, an inverter 440 can be used, for example. In addition, the polarity of the transistor 102*a* included in the circuit 1000*a* and the polarity of the transistor 102*b* included in the circuit 1000*b* are different from each other. Although FIG. 1 illustrates the example in which the transistor 102*a* is an n-channel transistor and the transistor 102*b* is a p-channel transistor, this embodiment is not limited thereto. The transistor 102*a* may be a p-channel transistor and the transistor 102*b* may be an n-channel transistor. A potential which is applied to the terminal S1 and a potential which is applied to the terminal S2 are the same potential, i.e., a potential V1.

The terminal B1 and the terminal B2 are electrically connected to each other to be electrically connected to an input terminal IN of the sense amplifier 1451 via the switch 1450*b*. In other words, the switch 1450*b* selectively and electrically connects the input terminal IN of the sense amplifier 1451 and the terminals B1 and B2. Here, it can be considered that the terminal B1 and the terminal B2 are electrically connected to a terminal B and the switch 1450*b* selectively and electrically connects the input terminal IN of the sense amplifier 1451 and the terminal B. One electrode of a pair of electrodes of the capacitor 104 is electrically connected to the input terminal IN of the sense amplifier 1451, and the other electrode of the pair of electrodes of the capacitor 104 is electrically connected to a terminal C3. In addition, a terminal VR is electrically connected to the input terminal IN of the sense amplifier 1451 via the switch 1450*a*. That is, the switch 1450*a* selectively and electrically connects the input terminal IN of the sense amplifier 1451 and the terminal VR. Here, the switch 1450*a*, the switch 1450*b*, and the terminal VR can be collectively referred to as a precharge circuit. A precharge potential can be applied to the terminal VR (or a wiring electrically connected to the terminal VR). The precharge potential can be a high power supply potential, a low power supply potential, or an intermediate potential between the high power supply potential and the low power supply potential. Then, the sense amplifier 1451 amplifies and outputs the potential which is input to the input terminal iN, from an output terminal OUT.

Here, the same potential may be input to the terminals C1, C2, and C3 or different potentials may be input thereto. For example, the potential V1 may be input to the terminals C1, C2, and C3.

Figure 2A:
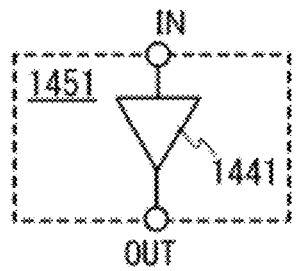
FIGS. 2A to 2D each illustrate the structure of a sense amplifier.
Figure 2B:
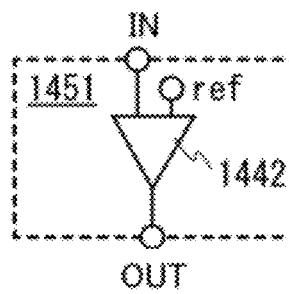
Figure 2C:
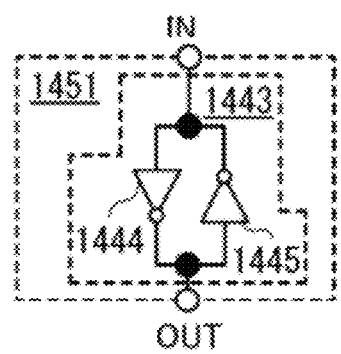
Figure 2D:
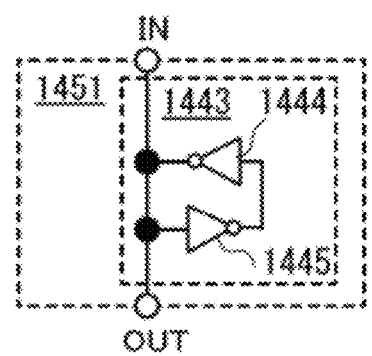

As the sense amplifier 1451, for example, an inverter, a clocked inverter, a buffer, a latch circuit, an operational amplifier, or the like can be used. FIG. 2A illustrates an example in which a buffer 1441 is used as the sense amplifier 1451. As illustrated in FIG. 2B, the sense amplifier 1451 may output a result of a comparison between a reference potential ref and the potential input to the input terminal IN. The sense amplifier 1451 having such a structure can be referred to as a comparator 1442. The comparator 1442 can be formed using an operational amplifier or a latch circuit, for example. Alternatively, as illustrated in FIGS. 2C and 2D, a latch circuit 1443 may be used as the sense amplifier 1451. The latch circuit 1443 can be formed using an inverter 1444 and an inverter 1445, for example. Note that a power supply voltage may be selectively applied to elements (e.g., the inverter 1444 and the inverter 1445) included in the latch circuit. For example, one or both of the inverter 1444 and the inverter 1445 may be clocked inverters.

Figure 3A:
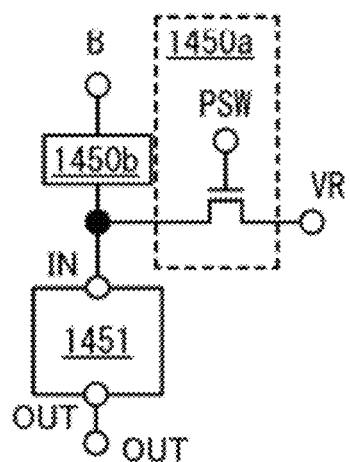
FIGS. 3A to 3D each illustrate the structure of a sense amplifier and the structure of a precharge circuit.
Figure 3B:
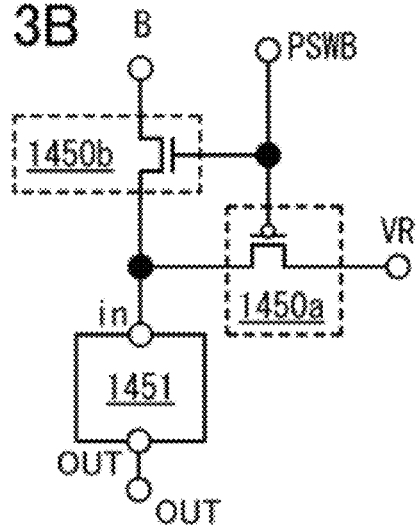
Figure 3C:
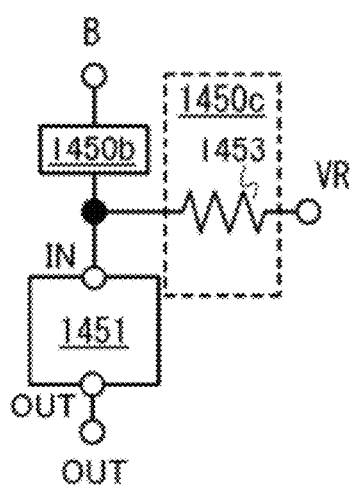
Figure 3D:
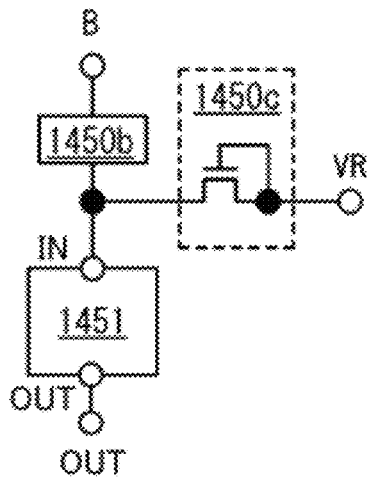

The switch 1450*a* and the switch 1450*b* can be formed using transistors or the like. For example, a transistor including a gate to which a control signal PSW is input can be used as the switch 1450*a* as illustrated in FIG. 3A. Alternatively, a structure may be employed as illustrated in FIG. 3B in which the polarity of a transistor used for the switch 1450a is different from the polarity of a transistor used as the switch 1450b, and the same control signal PSWB is input to gates of these transistors. Thus, with the one control signal PSWB, when one of the switch 1450a and the switch 1450b is turned on, the other thereof can be turned off. Instead of the switch 1450a, a load 1450c may be used. As the load 1450c, a resistor 1453 illustrated in FIG. 3C, a diode-connected transistor illustrated in FIG. 3D, or the like can be used. In the case where the load 1450c is used instead of the switch 1450a, when both of the transistor 102a and the transistor 102b are in an off state, the potential of the terminal VR can be input to the input terminal N of the sense amplifier 1451. Note that in the case where the load 1450c is used instead of the switch 1450a, the switch 1450b can be omitted. That is, the terminal B may be connected to the input terminal IN of the sense amplifier 1451 without the switch.

(Variations of Memory Element)

In (Structure 1 of Memory Element) described above, the memory element may further include a diode, a resistor, an inverter, a buffer, and a switch. As the switch, an analog switch, a transistor, or the like can be used, for example. For example, a switch which selects whether or not the potential of the output terminal OUT of the sense amplifier 1451 is output from the memory element 100 may be included. Note that the sense amplifier 1451 which also functions as the switch may be used. That is, the sense amplifier 1451 may output, from the output terminal OUT, a signal which is amplified in synchronization with the control signal such as a clock signal. As such a sense amplifier 1451, a clocked inverter can be used, for example.

(Driving Method of Memory Element 100)

Figure 4:
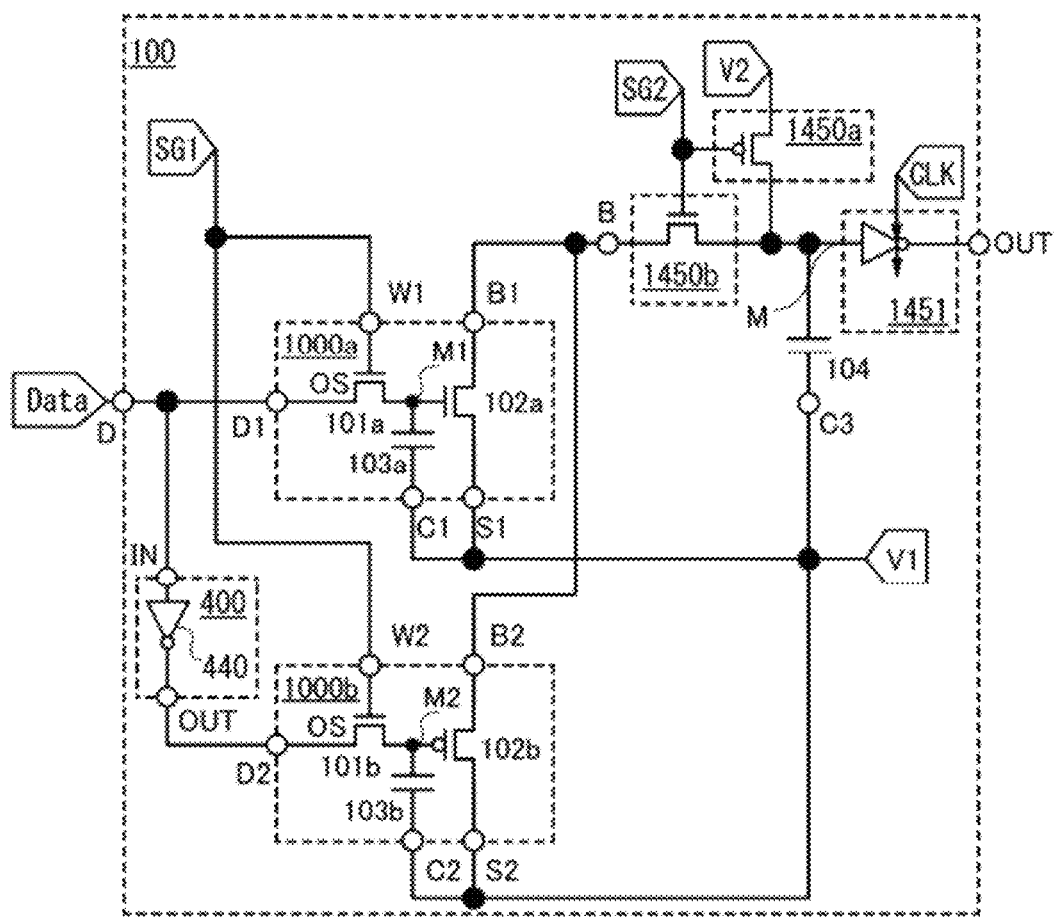
FIG. 4 illustrates the structure of a memory element.

A driving method of a memory element 100 having a structure of FIG. 4 is described. FIG. 4 illustrates an example in which the structure illustrated in FIG. 3B is employed for the switch 1450a and the switch 1450b of FIG. 1; the precharge potential which is applied to the terminal VR is a potential V2; a clocked inverter which outputs a signal in synchronization with a clock signal CLK is used as the sense amplifier 1451; the terminals S1, S2, C1, C2, and C3 are electrically connected to each other and the potential V1 is applied thereto. Here, a control signal SG1 is input to the gates of the transistor 101a and the transistor 101b. Data (Data) is input to the terminal D. A control signal SG2 is input to the gate of the p-channel transistor used for the switch 1450a and the gate of the n-channel transistor used for the switch 1450b. The gate of the transistor 102a is referred to as a node M1 and the gate of the transistor 102b is referred to a node M2. In addition, the input terminal IN of the sense amplifier 1451 is referred to as a node M. The driving method of the memory element 100 having the structure of FIG. 4 is described using a timing chart shown in FIG. 5. Note that in shaded portions in the timing chart in FIG. 5, data, a control signal, a clock signal, the potential of a node, and an output signal each can have an arbitrary value.

Figure 5:
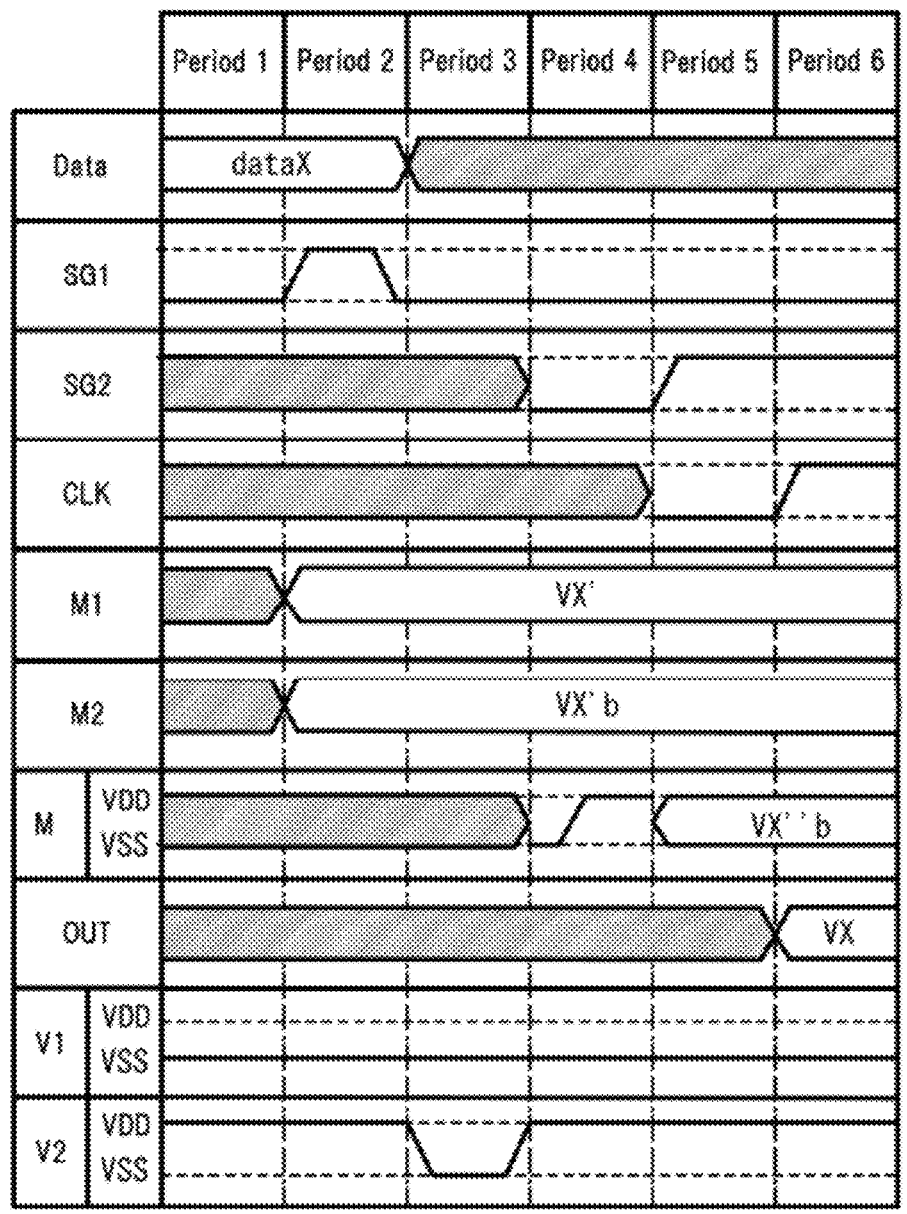
FIG. 5 is a timing chart showing a driving method of a memory element.

The timing chart of FIG. 5 shows an example of the driving method in which the transistor 101a and the transistor 101b are n-channel transistors. The transistor 101a and the transistor 101b are in an on state when the control signal SG1 is at a high level, and are in an off state when the control signal SG1 is at a low level. Further, FIG. 5 shows the example in which the switch 1450b is on state and the switch 1450a is in an off state when the control signal SG2 is at a high level, and the switch 1450b is in an off state and the switch 1450a is in an on state when the control signal SG2 is at a low level. Note that the polarity of each of transistors (transistors used for the transistor 101a, the transistor 101b, the switch 1450a, and the switch 1450b) may be changed. In this case, the levels of the control signals (SG1 and SG2) can be changed so that the state of each of the transistors (an on state or an off state) corresponds to the following description.

The timing chart of FIG. 5 shows the example in which the precharge potential is the potential V2. Note that the precharge potential may be the potential V1 or an intermediate potential between the potential V1 and the potential V2.

Here, a voltage corresponding to a difference between the potential V1 and the potential V2 can be supplied as the power supply voltage to the memory element 100. At this time, the case where the supply of the power supply voltage is stopped corresponds to the case where the difference between the potential V1 and the potential V2 substantially disappears, or corresponds to the case where one of the potential V1 and the potential V2 is not supplied. Although FIG. 5 shows the example in which the supply of the power supply voltage is stopped when the potential V1 is set at the low power supply potential and the potential V2 is changed from the high power supply potential to the low power supply potential, this embodiment is not limited thereto. For example, the supply of the power supply voltage may be stopped in such a manner that the potential V2 is set at the low power supply potential and the potential V1 is changed from the high power supply potential to the low power supply potential.

Respective operations of periods 1 to 6 in the timing chart of FIG. 5 are described below.

In a period 1, data X is input as Data. Here, the potential V1 is a lower power supply potential VSS and the potential V2 is a high power supply potential VDD. In the period 1, the control signal SG1 is at a low level, and thus the transistor 101a and the transistor 101b are in an off state, and the potentials of the node M1 and the node M2 are unrelated to a signal potential corresponding to the data X.

In a period 2, when the control signal SG1 is changed to a high level in the state where the data X is input as Data, the transistor 101a and the transistor 101b are turned on. In this manner, the potential of the node M1 is set at a signal potential VX' of a signal corresponding to the data X, and the potential of the node M2 becomes a signal potential VX'b corresponding to an inverted signal of the signal. Note that actually, after the transistor 101a and the transistor 101b are turned on, it takes a long time until the potential of the node M1 is set at the signal potential VX' and the potential of the node M2 is set at the potential VX'b. After that, the control signal SG1 is set at a low level and the transistor 101a and the transistor 101b are tuned off. In this manner, the data X is written in the memory element 100.

In a period 3, the potential V2 is set at the low power supply potential VSS. In this manner, the potential difference between the potential V1 and the potential V2 disappears and the supply of the power supply voltage to the memory element 100 is stopped. Here, the control signal SG1 is kept at the low level. Since the transistor 101a and the transistor 101b are transistors with extremely low off-state current, even after the supply of the power supply voltage is stopped, the potentials of the node M1 and the node M2 are held for a long time. In this manner, the memory element 100 can hold data even after the supply of the power supply voltage is stopped.

In a period 4, when the potential V2 is set at the high power supply potential VDD, the supply of the power supply voltage to the memory element 100 restarts, and the control signal SG2 is at the low level, the switch 1450a is turned on and the switch 1450b is turned off. Thus, the potential of the node M is precharged to the potential V2. Note that although the timing chart of FIG. 5 shows the example in which the potential of the node M is gradually increased from the low power supply potential VSS to the high power supply potential VDD (or a potential close thereto), this embodiment is not limited thereto. The potential of the node M may be a potential which is higher than the low power supply potential VSS in a period preceding the period 4, and may be gradually increased from the potential in the period 4 to be the high power supply potential VDD (or a potential close thereto).

In a period 5, the control signal SG2 is changed to a high level, so that the switch 1450b is turned on and the switch 1450a is turned off. Here, the potential of the node M is set at a potential VX"b which reflects the states of the transistor 102a and the transistor 102b.

For example, in the case where the data X is a signal corresponding to "1" and corresponds to a high level signal potential, the potential VX' of the node M1 is set at a high level potential and the transistor 102a is turned on. In addition, at this time, the potential VX'b of the node M2 is set at a low level potential and the transistor 102b is turned on. In this manner, the potential VX"b is set at the potential V1, i.e., the low power supply potential VSS (or a potential close thereto) to be a low level potential. That is, the potential VX"b can be a signal potential corresponding to an inverted signal of a signal corresponding to the data X. Note that actually, after the switch 1450b is turned on, it takes a long time until the potential of the node M is lowered to the potential VX"b.

In addition, for example, in the case where the data X is a signal corresponding to "0" and corresponds to a low level signal potential, the potential VX' of the node M1 is set at a low level potential and the transistor 102a is turned off. Further, at this time, the potential VX'b of the node M2 is set at a high level potential and the transistor 102b is turned off. In this manner, the potential VX"b is kept at the potential of the node M after the precharge in the period 4, and becomes the high power supply potential VDD (or a potential close thereto) to be a high level potential. That is, the potential VX"b can be a signal potential corresponding to the inverted signal of the signal corresponding to the data X.

The precharge is performed in the period 4, so that a time in the period 5 until the potential of the node M is set at a predetermined potential (the potential VX"b) corresponding to the stored data can be shortened. In this manner, the data stored in the memory element 100 can be read out speedily.

In the period 5, the clock signal input to the clocked inverter functioning as the sense amplifier 1451 is at a low level, and thus the sense amplifier 1451 does not output a signal but when the clock signal is changed to a high level in a period 6, the sense amplifier 1451 amplifies the potential VX"b of the node M and outputs an inverted signal of a signal corresponding to the potential. In this manner, in the period 6, the terminal OUT has a signal potential VX of the signal corresponding to the data X, so that the input data can be read out from the memory element 100.

Note that in the case of the structure and the driving method of the memory element 100 described using FIG. 4 and FIG. 5, data is read out by performing synchronization with the clock signal, but this embodiment is not limited thereto. For example, in the case where an inverter is used as the sense amplifier 1451, the potential of the node M is set at the potential VX"b, and the sense amplifier 1451 amplifies the potential VX"b of the node M and outputs an inverted signal of a signal corresponding to the potential. In this manner, the terminal OUT has the signal potential VX of the signal corresponding to the data X, so that the input data can be read out from the memory element 100.

This is the driving method of the memory element 100 having the structure of FIG. 4.

In the memory element 100 illustrated in each of FIG. 1 and FIG. 4, the signal potential VX' is input to and held in the gate of the transistor 102a of the circuit 1000a, and the signal potential VX'b is input to and held in the gate of the transistor 102b of the circuit 1000b. Then, one piece of data is read out from the memory element 100 using both of the state of the transistor 102a which is determined by the signal potential VX' and the state of the transistor 102b determined by the signal potential VX'b. Therefore, even if one of the potentials of the gates of the transistor 102a and the transistor 102b is not the predetermined signal potential, when the other of the potentials of the gates of the transistor 102a and the transistor 102b becomes the predetermined signal potential, it is possible to write, hold, and read out the predetermined data. Thus, writing errors or reading errors of data can be reduced. In addition, a period needed for data writing to the memory element 100 can be set short, so that the memory element whose writing speed is high can be provided.

This embodiment can be implemented combining with another embodiment as appropriate.

(Embodiment 2)
(Structure 2 of Memory Element)

Figure 8:
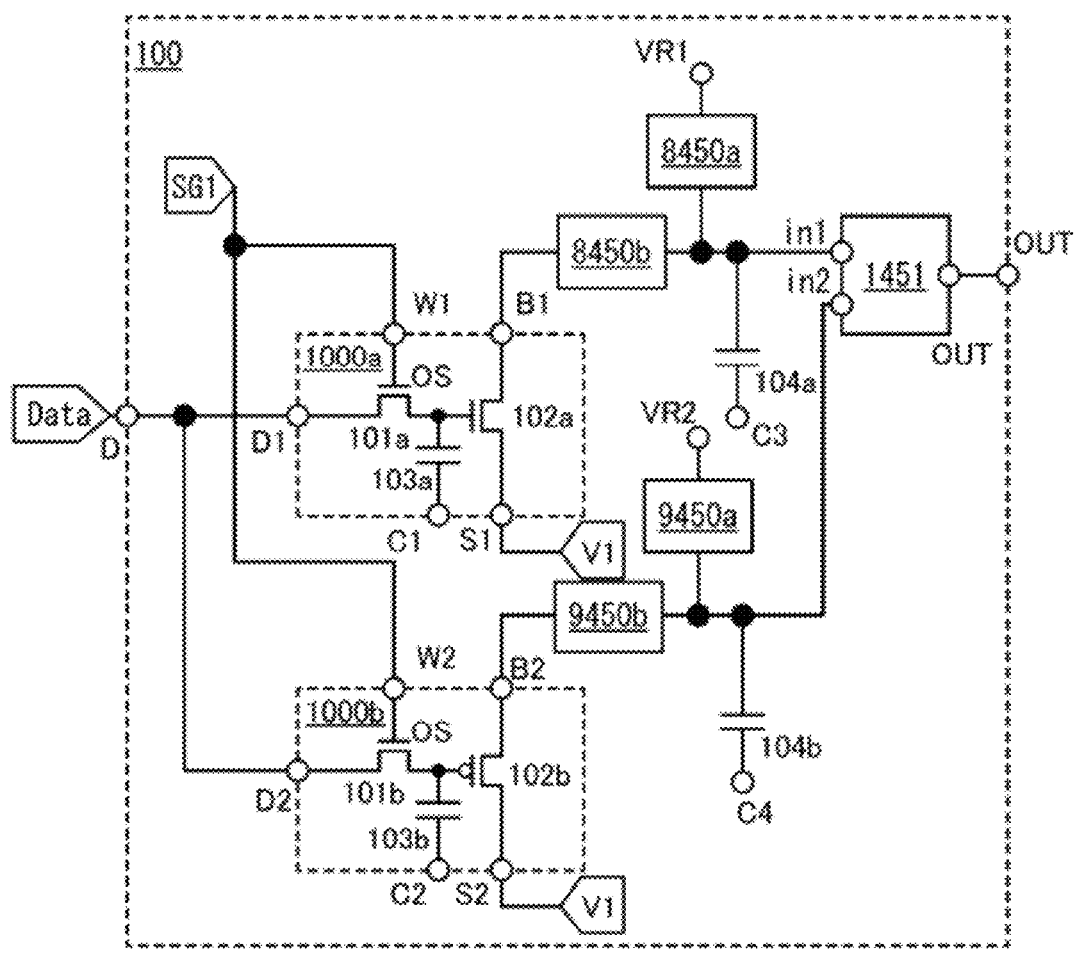
FIG. 8 illustrates the structure of a memory element.

FIG. 8 illustrates a memory element that is another embodiment of the present invention. In FIG. 8, a memory element 100 includes a circuit 1000a, a circuit 1000b, a sense amplifier 1451, a switch 8450a, a switch 8450b, a capacitor 104a, a switch 9450a, a switch 9450b, and a capacitor 104b. Data is input to a terminal D, and the memory element 100 holds a signal corresponding to the data and outputs the signal corresponding to the data from a terminal OUT. The circuit 1000a includes a transistor 101a, a transistor 102a, and a capacitor 103a. The circuit 1000b includes a transistor 101b, a transistor 102b, and a capacitor 103b. Note that one or all of the capacitor 103a, the capacitor 103b, the capacitor 104a, and the capacitor 104b can be omitted by positively using a parasitic capacitance or the like.

In the circuit 1000a, a gate of the transistor 101a is electrically connected to a terminal W1, one of a source and a drain of the transistor 101a is electrically connected to a terminal D1, and the other of the source and the drain of the transistor 101a is electrically connected to a gate of the transistor 102a. One of a source and a drain of the transistor 102a is electrically connected to a terminal B1, and the other of the source and the drain of the transistor 102a is electrically connected to a terminal S1. One electrode of a pair of electrodes of the capacitor 103a is electrically connected to the gate of the transistor 102a, and the other electrode of the pair of electrodes of the capacitor 103a is electrically connected to a terminal C1. In the circuit 1000b, a gate of the transistor 101b is electrically connected to a terminal W2, one of a source and a drain of the transistor 101b is electrically connected to a terminal D2, and the other of the source and the drain of the transistor 101b is electrically connected to a gate of the transistor 102b. One of a source and a drain of the transistor 102b is electrically connected to a terminal B2, and the other of the source and the drain of the transistor 102b is electrically connected to a terminal S2. One electrode of a pair of electrodes of the capacitor 103b is electrically connected to the gate of the transistor 102*b*, and the other electrode of the pair of electrodes of the capacitor 103*b* is electrically connected to a terminal C2.

Transistors with extremely low off-state current are used as the transistor 101*a* and the transistor 101*b*. As the transistor with extremely small off-state current, a transistor whose channel is formed in a layer or in a substrate including a semiconductor having a wider bandgap than silicon can be used. As the semiconductor having a wider bandgap than silicon, compound semiconductors such as an oxide semiconductor and a nitride semiconductor can be given. For example, a transistor including an oxide semiconductor in which a channel is formed can be used for the transistor 101*a* and the transistor 101*b*. In FIG. 8, "OS" is written beside each of the transistor 101*a* and the transistor 101*b* in order to indicate the transistor 101*a* and the transistor 101*b* each including an oxide semiconductor layer in which a channel is formed.

In the memory element 100 illustrated in FIG. 8, a signal which is input to the terminal D1 of the circuit 1000*a* is the same signal as a signal which is input to the terminal D2 of the circuit 1000*b*. In addition, the polarity of the transistor 102*a* included in the circuit 1000*a* and the polarity of the transistor 102*b* included in the circuit 1000*b* are different from each other. Although FIG. 8 illustrates an example in which the transistor 102*a* is an n-channel transistor and the transistor 102*b* is a p-channel transistor, this embodiment is not limited thereto. The transistor 102*a* may be a p-channel transistor and the transistor 102*b* may be an n-channel transistor. A potential which is applied to the terminal S1 and a potential which is applied to the terminal S2 are the same potential, i.e., a potential V1.

The terminal B1 is electrically connected to an input terminal IN1 of the sense amplifier 1451 via the switch 8450*b*. In other words, the switch 8450*b* selectively and electrically connects the input terminal IN1 of the sense amplifier 1451 and the terminal B1. The terminal B2 is electrically connected to an input terminal IN2 of the sense amplifier 1451 via the switch 9450*b*. In other words, the switch 9450*b* selectively and electrically connects the input terminal IN2 of the sense amplifier 1451 and the terminal B2. One electrode of a pair of electrodes of the capacitor 104*a* is electrically connected to the input terminal IN1 of the sense amplifier 1451, and the other electrode of the pair of electrodes of the capacitor 104*a* is electrically connected to a terminal C3. One electrode of a pair of electrodes of the capacitor 104*b* is electrically connected to the input terminal IN2 of the sense amplifier 1451, and the other electrode of the pair of electrodes of the capacitor 104*b* is electrically connected to a terminal C4. In addition, a terminal VR1 is electrically connected to the input terminal IN1 of the sense amplifier 1451 via the switch 8450*a*. That is, the switch 8450*a* selectively and electrically connects the input terminal IN1 of the sense amplifier 1451 and the terminal VR1. In addition, a terminal VR2 is electrically connected to the input terminal IN2 of the sense amplifier 1451 via the switch 9450*a*. That is, the switch 9450*a* selectively and electrically connects the input terminal IN2 of the sense amplifier 1451 and the terminal VR2. Here, the switch 8450*a*, the switch 8450*b*, and the terminal VR1 can be collectively referred to as a first precharge circuit, and the switch 9450*a*, the switch 9450*b*, and the terminal VR2 can be collectively referred to as a second precharge circuit. A precharge potential can be applied to the terminal VR1 and the terminal VR2 (or a wiring electrically connected to the terminal VR1 and a wiring electrically connected to the terminal VR2). The precharge potential can be a high power supply potential, a low power supply potential, or an intermediate potential between the high power supply potential and the low power supply potential. Different precharge potentials may be applied to the terminal VR1 and the terminal VR2. Then, the sense amplifier 1451 compares the potential input to the input terminal IN1 with the potential input to the input terminal IN2 and outputs a result of the comparison from an output terminal OUT.

Here, the same potential may be input to the terminals C1, C2, C3, and C4 or different potentials may be input thereto. For example, the potential V1 may be input to the terminals C1, C2, C3, and C4.

Figure 9A:
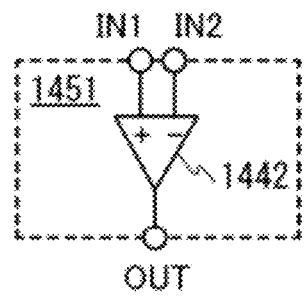
FIGS. 9A to 9C each illustrate the structure of a sense amplifier.
Figure 9B:
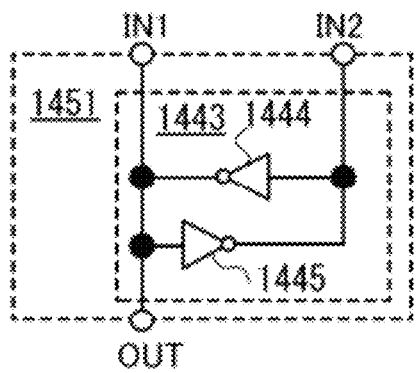
Figure 9C:
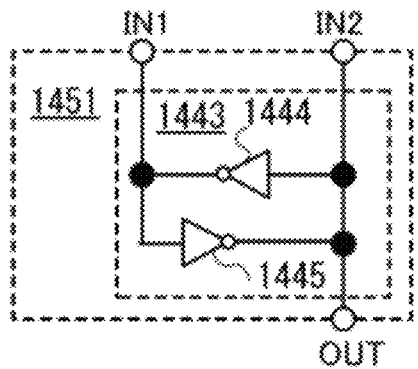

As the sense amplifier 1451, for example, a latch circuit, an operational amplifier, or the like can be used. FIG. 9A illustrates an example in which a comparator 1442 is used as the sense amplifier 1451, and an operational amplifier is used as the comparator 1442. FIGS. 9B and 9C each illustrate an example in which a latch circuit 1443 is used as the sense amplifier 1451. The latch circuit 1443 can be formed using an inverter 1444 and an inverter 1445, for example. Note that a power supply voltage may be selectively applied to an element included in the latch circuit 1443 (e.g., the inverter 1444 and the inverter 1445). For example, one or both of the inverter 1444 and the inverter 1445 may be clocked inverters.

Figure 10A:
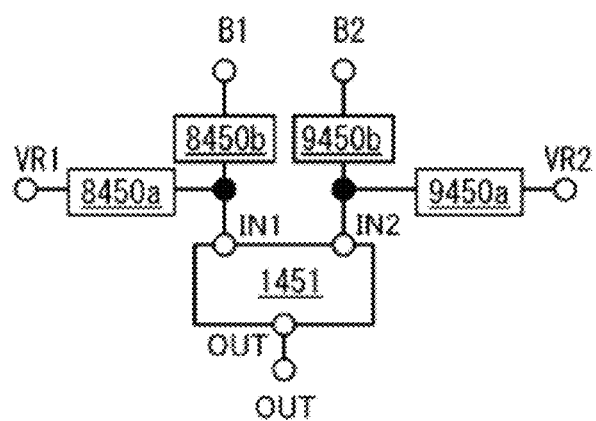
FIGS. 10A and 10B each illustrate the structure of a sense amplifier and the structure of a precharge circuit.
Figure 10B:
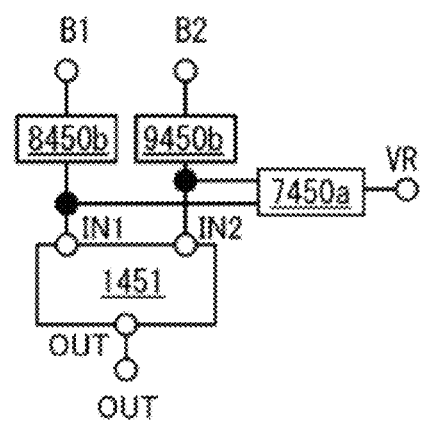

The switches 8450*a* and 8450*b* and the switches 9450*a* and 9450*b* can be formed using transistors or the like. The switches 8450*a* and 8450*b* and the switches 9450*a* and 9450*b* can have structures similar to any of the structures of the switches 1450*a* and 1450*b* illustrated in FIGS. 3A to 3D. For example, a structure may be employed in which the polarity of a transistor used as the switch 8450*a* is different from the polarity of a transistor used as the switch 8450*b*, and the same control signal PSWB is input to gates of these transistors. In this manner, with the one signal control signal PSWB, when one of the switch 8450*a* and the switch 8450*b* is in an on state, the other thereof can be in an off state. A structure may be employed in which the polarity of a transistor used as the switch 9450*a* is different from the polarity of a transistor used as the switch 9450*b*, and the same control signal PSWB is input to gates of these transistors. In this manner, with the signal control signal PSWB, when one of the switch 9450*a* and the switch 9450*b* is in an on state, the other thereof can be in an off state. In addition, loads may be employed instead of the switch 8450*a* and the 9450*a*. In this case, it is possible to omit the switch 8450*b* and the switch 9450*b*. Further, although the structures of the sense amplifier 1451, the switches 8450*a* and 8450*b*, and the switches 9450*a* and 9450*b* in the memory element 100 illustrated in FIG. 8 are those as illustrated in FIG. 10A, structures illustrated in FIG. 10B may be employed. In FIG. 10B, a terminal VR is used to serve as the terminal VR1 and the terminal VR2 in FIG. 10A, and a switch 7450*a* is used to serve as the switches 8450*a* and 9450*a* in FIG. 10A.

(Variations of Memory Element)

In (Structure 2 of Memory Element) described above, the memory element may further include a diode, a resistor, an inverter, a buffer, and a switch. As the switch, an analog switch, a transistor, or the like can be used, for example. For example, a switch which selects whether or not the potential of the output terminal OUT of the sense amplifier 1451 is output from the memory element 100 may be included. Note that the sense amplifier 1451 which also functions as the switch may be used. That is, the sense amplifier 1451 may output, from the output terminal OUT, a signal which is amplified in synchronization with the control signal such as a clock signal.

(Driving Method of Memory Element 100)

Figure 11:
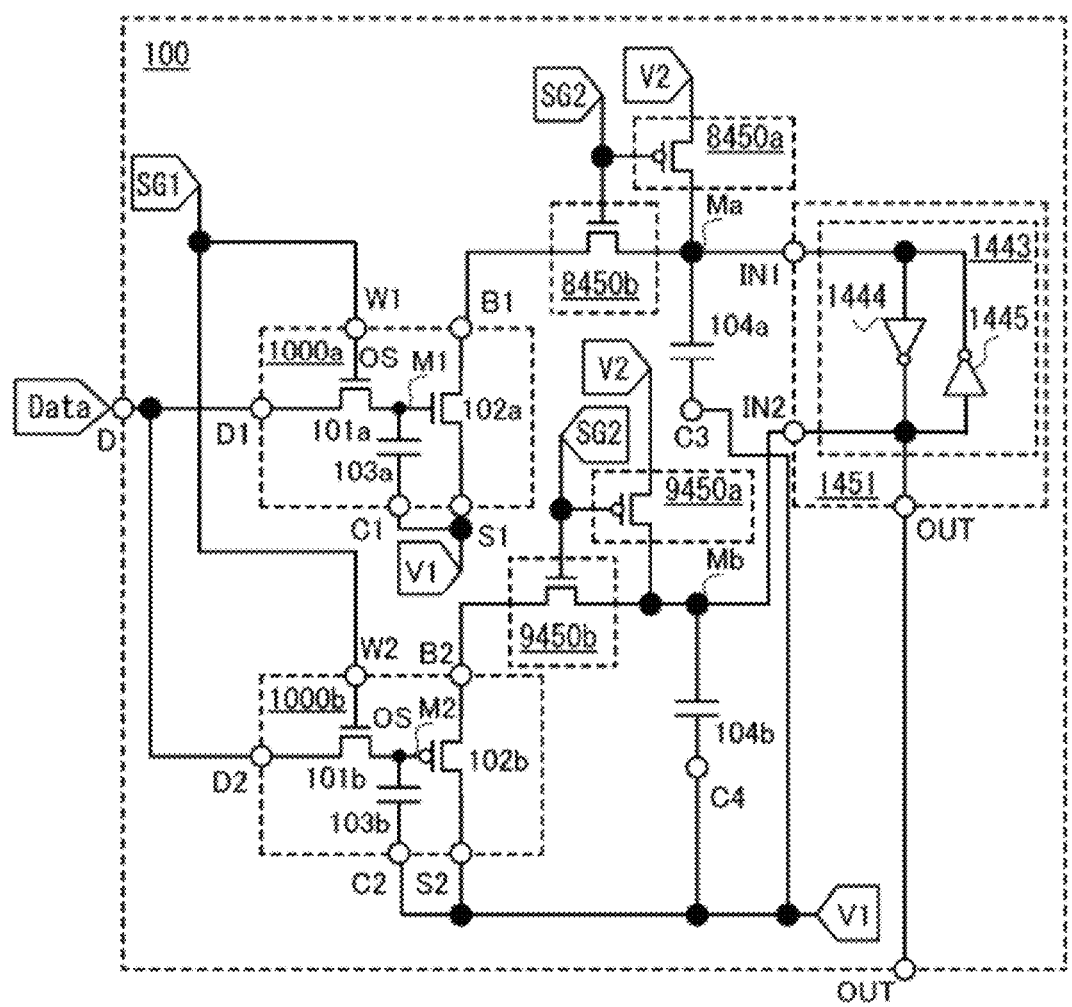
FIG. 11 illustrates the structure of a memory element.

A driving method of a memory element 100 having a structure of FIG. 11 is described. FIG. 11 illustrates an example of the structure of FIG. 8 in which a p-channel transistor is used for the switch 8450a; an n-channel transistor is used for the switch 8450b; a p-channel transistor is used for the switch 9450a; an n-channel transistor is used for the switch 9450b; the precharge potentials which are applied to the terminal VR1 and the terminal VR2 are each a potential V2; the latch circuit 1443 is used as the sense amplifier 1451; the terminals S1, S2, C1, C2, C3, and C4 are electrically connected to each other and the potential V1 is applied thereto. Here, a control signal SG1 is input to the gates of the transistor 101a and the transistor 101b. Data (Data) is input to the terminal D. A control signal SG2 is input to a gate of the p-channel transistor included in the switch 8450a, a gate of the n-channel transistor included in the switch 8450b, a gate of the p-channel transistor included in the switch 9450a, and a gate of the n-channel transistor included in the switch 9450b. The gate of the transistor 102a is referred to as a node M1 and the gate of the transistor 102b is referred to a node M2. In addition, the input terminal IN1 of the sense amplifier 1451 is referred to as a node Ma and the input terminal IN2 of the sense amplifier 1451 is referred to as a node Mb. The driving method of the memory element 100 having the structure of FIG. 11 is described using a timing chart shown in FIG. 12. Note that in shaded portions in the timing chart of FIG. 12, data, a control signal, a clock signal, the potential of a node, and an output signal each can have an arbitrary value.

Figure 12:
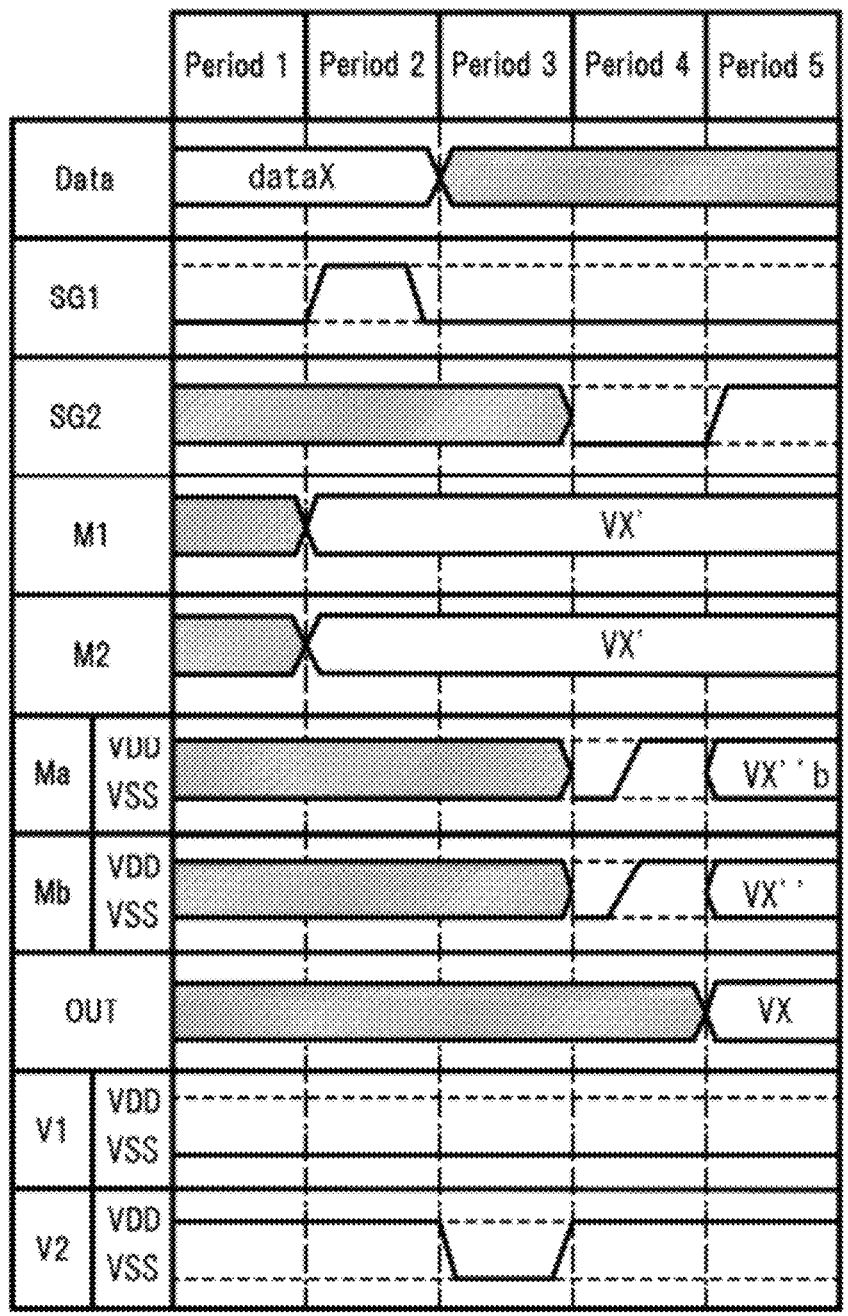
FIG. 12 is a timing chart showing a driving method of a memory element.

The timing chart of FIG. 12 shows an example of the driving method in which the transistor 101a and the transistor 101b are n-channel transistors. The transistor 101a and the transistor 101b are in an on state when the control signal SG1 is at a high level, and are in an off state when the control signal SG1 is at a low level. Further, FIG. 12 shows the example in which the switch 8450b and the switch 9450b are in an on state and the switch 8450a and the switch 9450a are in an off state when the control signal SG2 is at a high level, and the switch 8450b and the switch 9450b are in an off state and the switch 8450a and the switch 9450a are in an on state when the control signal SG2 is at a low level. Note that the polarity of each of transistors (transistors used for the transistor 101a, the transistor 101b, the switch 8450a, the switch 8450b, the switch 9450a, and the switch 9450b) may be changed. In this case, the levels of the control signals (SG1 and SG2) can be changed so that the state of each of the transistors (an on state or an off state) corresponds to the following description.

The timing chart of FIG. 12 shows the example in which the precharge potential is the potential V2. Note that the precharge potential may be the potential V1 or an intermediate potential between the potential V1 and the potential V2.

Here, a voltage corresponding to a difference between the potential V1 and the potential V2 can be supplied as the power supply voltage to the memory element 100. At this time, the case where the supply of the power supply voltage is stopped corresponds to the case where the difference between the potential V1 and the potential V2 substantially disappears, or corresponds to the case where one of the potential V1 and the potential V2 is not supplied. Although FIG. 12 shows the example in which the supply of the power supply voltage is stopped when the potential V1 is set at the low power supply potential and the potential V2 is changed from the high power supply potential to the low power supply potential, this embodiment is not limited thereto. For example, the supply of the power supply voltage may be stopped in such a manner that the potential V2 is set at the low power supply potential and the potential V1 is changed from the high power supply potential to the low power supply potential.

Respective operations of periods 1 to 5 in the timing chart of FIG. 12 are described below.

In a period 1, data X is input as Data. Here, the potential V1 is a lower power supply potential VSS and the potential V2 is a high power supply potential VDD. In the period 1, the control signal SG1 is at a low level, and thus the transistor 101a and the transistor 101b are in an off state, and the potentials of the node M1 and the node M2 are unrelated to a signal potential corresponding to the data X.

In a period 2, when the control signal SG1 is changed to a high level in the state where the data X is input as Data, the transistor 101a and the transistor 101b are turned on. In this manner, the potential of the node M1 and the potential of the node M2 are set at a signal potential VX' of a signal corresponding to the data X. Note that actually, after the transistor 101a and the transistor 101b are turned on, it takes a long time until the potential of the node M1 and the potential of the node M2 are set at the signal potential VX'. After that, the control signal SG1 is set at a low level and the transistor 101a and the transistor 101b are tuned off. In this manner, the data X is written in the memory element 100.

In a period 3, the potential V2 is set at the low power supply potential VSS. In this manner, the potential difference between the potential V1 and the potential V2 disappears and the supply of the power supply voltage to the memory element 100 is stopped. Here, the control signal SG1 is kept at the low level. Since the transistor 101a and the transistor 101b are transistors with extremely low off-state current, even after the supply of the power supply voltage is stopped, the potentials of the node M1 and the node M2 are held for a long time. In this manner, the memory element 100 can hold data even after the supply of the power supply voltage is stopped.

In a period 4, when the potential V2 is set at the high power supply potential VDD, the supply of the power supply voltage to the memory element 100 restarts, and the control signal SG2 is at the low level, the switch 8450a and the switch 9450a are turned on and the switch 8450b and the switch 9450b are turned off. Thus, the potential of the node Ma and the potential of the node Mb are precharged to the potential V2. Note that although the timing chart of FIG. 12 shows the example in which the potentials of the node Ma and the node Mb are gradually increased from the low power supply potential VSS to the high power supply potential VDD (or a potential close thereto), this embodiment is not limited thereto. The potential of the node M may be a potential which is higher than the low power supply potential VSS in a period preceding the period 4, and may be gradually increased from the potential in the period 4 to be the high power supply potential VDD (or a potential close thereto).

In a period 5, the control signal SG2 is changed to a high level, the switch 8450b and the switch 9450b are turned on, and the switch 8450a and the switch 9450a are turned off. Here, the potential of the node Ma is set at a potential VX"b which reflects the state of the transistor 102a, and the potential of the node Mb is set at a potential VX" which reflects the state of the transistor 102b.

For example, in the case where data X is a signal corresponding to "1" and corresponds to a high level signal potential, a potential VX' of the node M1 is set at a high level potential and the transistor 102a is turned on. In addition, at this time, a potential VX' of the node M2 is also a high level potential and the transistor 102*b* is turned off. Thus, the potential VX"b of the node Ma is set at the potential V1, i.e., the low power supply potential VSS (or a potential close thereto) to be a low level potential. That is, the potential VX"b can be a signal potential corresponding to an inverted signal of a signal corresponding to the data X. Note that actually, after the switch 8450*b* is turned on, it takes a long time until the potential of the node Ma is lowered to the potential VX"b. In addition, the potential VX" of the node Mb is kept at the potential of the node Mb after the precharge in the period 4 and is set at the high power supply potential VDD (or a potential close thereto) to be a high level potential. In short, the potential VX" can be a signal potential corresponding to the signal corresponding to the data X.

In addition, for example, in the case where the data X is a signal corresponding to "0" and corresponds to a low level signal potential, the potential VX' of the node M1 is set at a low level potential and the transistor 102*a* is turned off. Further, at this time, the potential VX'b of the node M2 is also a low level potential and the transistor 102*b* is turned on. Thus, the potential VX"b of the node Ma is kept at the potential of the node M1 after the precharge in the period 4, and is set at the high power supply potential VDD (or a potential close thereto) to be a high level potential. That is, the potential VX"b can be a signal potential corresponding to an inverted signal of the signal corresponding to the data X. Further, the potential VX" of the node Mb is set at the potential V1, i.e., the low power supply potential VSS (or a potential close thereto) to be a low level potential. In short, the potential VX" can be a signal potential corresponding to the signal corresponding to the data X. Note that actually, after the switch 9450*b* is turned on, it takes a long time until the potential of the node Mb is lowered to the potential VX".

The precharge is performed in the period 4, so that a time until the potential of the node Ma is set at a predetermined potential (the potential VX"b) corresponding to the stored data and a time until the potential of the node Mb is set at a predetermined potential (the potential VX") corresponding to the stored data can be shortened in the period 5. In this manner, the data stored in the memory element 100 can be read out speedily.

Further, in the period 5, the potential of the node Ma is input to the input terminal IN1 of the sense amplifier 1451, the potential of the node Mb is input to the input terminal IN2 of the sense amplifier 1451, and the sense amplifier 1451 compares the potential VX"b of the node Ma with the potential VX" of the node Mb and outputs an inverted signal of a signal corresponding to the potential VX"b of the node Ma. Thus, in the period 5, the terminal OUT has a signal potential VX of the signal corresponding to the data X, so that the input data can be read out from the memory element 100. Note that actually, after the potential of the node Ma is input to the input terminal IN1 of the sense amplifier 1451 and the potential of the node Mb is input to the input terminal IN2 of the sense amplifier 1451, it takes a long time until the potential of the output terminal OUT of the sense amplifier 1451 is set at the signal potential VX.

This is the driving method of the memory element 100 having the structure of FIG. 11.

In the memory element 100 illustrated in each of FIG. 8 and FIG. 11, the signal potential VX' is input to and held in the gate of the transistor 102*a* of the circuit 1000*a*, and the signal potential VX' is input to and held in the gate of the transistor 102*b* of the circuit 1000*b*. Then, one piece of data is read out from the memory element 100 using both of the state of the transistor 102*a* which is determined by the signal potential VX' and the state of the transistor 102*b* determined by the signal potential VX'. Therefore, even if one of the potentials of the gates of the transistor 102*a* and the transistor 102*b* is not the predetermined signal potential, when the other of the potentials of the gates of the transistor 102*a* and the transistor 102*b* becomes the predetermined signal potential, it is possible to write, hold, and read out the predetermined data. Thus, writing errors or reading errors of data can be reduced. In addition, a period needed for data writing to the memory element 100 can be set short, so that the memory element whose writing speed is high can be provided.

This embodiment can be implemented combining with another embodiment as appropriate.

(Embodiment 3)

(Structure 3 of Memory Element)

Figure 13:
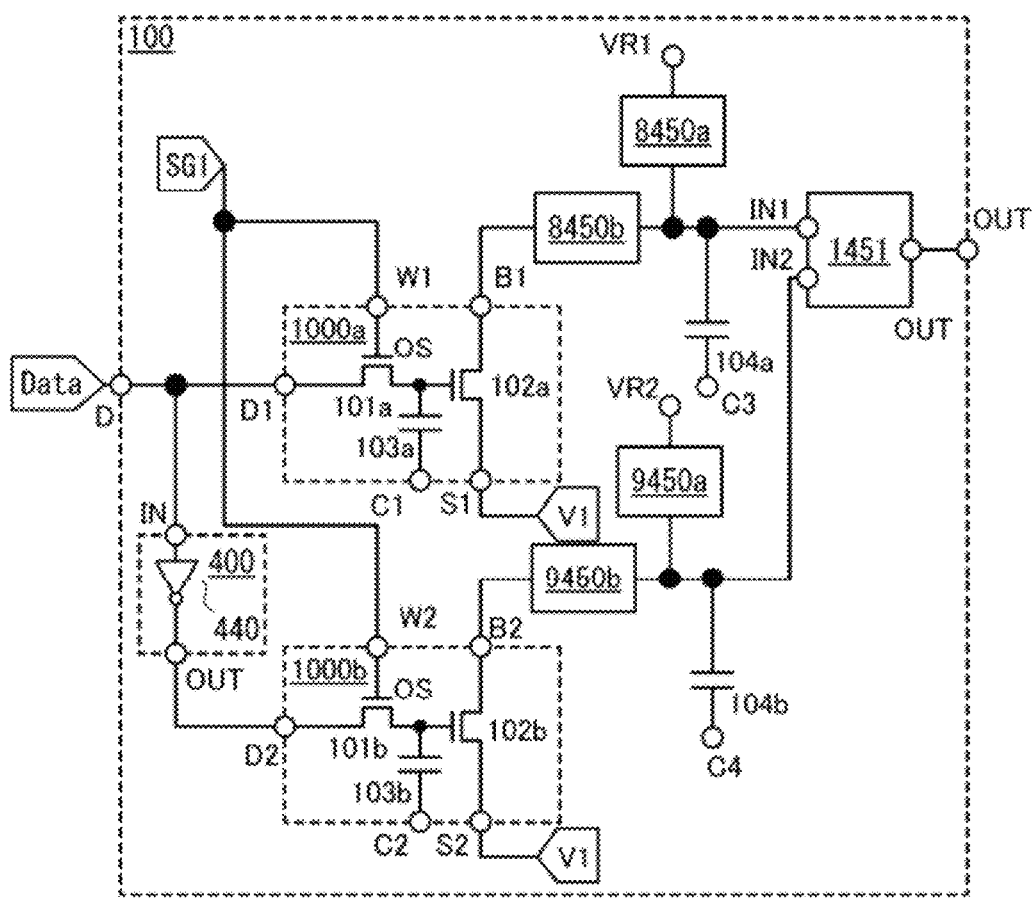
FIG. 13 illustrates the structure of a memory element.

FIG. 13 illustrates a memory element that is another embodiment of the present invention. In FIG. 13, a memory element 100 includes a circuit 1000*a*, a circuit 1000*b*, an inverter circuit 400, a sense amplifier 1451, a switch 8450*a*, a switch 8450*b*, a capacitor 104*a*, a switch 9450*a*, and a capacitor 104*b*. Data is input to a terminal D, and the memory element 100 holds a signal corresponding to the data and outputs the signal corresponding to the data from a terminal OUT. The circuit 1000*a* includes a transistor 101*a*, a transistor 102*a*, and a capacitor 103*a*. The circuit 1000*b* includes a transistor 101*b*, a transistor 102*b*, and a capacitor 103*b*. Note that one or all of the capacitor 103*a*, the capacitor 103*b*, the capacitor 104*a*, and the capacitor 104*b* can be omitted by positively using a parasitic capacitance or the like.

In the circuit 1000*a*, a gate of the transistor 101*a* is electrically connected to a terminal W1, one of a source and a drain of the transistor 101*a* is electrically connected to a terminal D1, and the other of the source and the drain of the transistor 101*a* is electrically connected to a gate of the transistor 102*a*. One of a source and a drain of the transistor 102*a* is electrically connected to a terminal B1, and the other of the source and the drain of the transistor 102*a* is electrically connected to a terminal S1. One electrode of a pair of electrodes of the capacitor 103*a* is electrically connected to the gate of the transistor 102*a*, and the other electrode of the pair of electrodes of the capacitor 103*a* is electrically connected to a terminal C1. In the circuit 1000*b*, a gate of the transistor 101*b* is electrically connected to a terminal W2, one of a source and a drain of the transistor 101*b* is electrically connected to a terminal D2, and the other of the source and the drain of the transistor 101*b* is electrically connected to a gate of the transistor 102*b*. One of a source and a drain of the transistor 102*b* is electrically connected to a terminal B2, and the other of the source and the drain of the transistor 102*b* is electrically connected to a terminal S2. One electrode of a pair of electrodes of the capacitor 103*b* is electrically connected to the gate of the transistor 102*b*, and the other electrode of the pair of electrodes of the capacitor 103*b* is electrically connected to a terminal C2.

Transistors with extremely low off-state current are used as the transistor 101*a* and the transistor 101*b*. As the transistor with extremely small off-state current, a transistor whose channel is formed in a layer or in a substrate including a semiconductor having a wider bandgap than silicon can be used. As the semiconductor having a wider bandgap than silicon, compound semiconductors such as an oxide semiconductor and a nitride semiconductor can be given. For example, a transistor including an oxide semiconductor in which a channel is formed can be used for the transistor 101*a* and the transistor 101*b*. In FIG. 13, "OS" is written beside each of the transistor 101*a* and the transistor 101*b* in order to indicate the transistor 101*a* and the transistor 101*b* each including an oxide semiconductor layer in which a channel is formed.

In the memory element 100 illustrated in FIG. 13, a signal which is input to the terminal D2 of the circuit 1000*b* is an inverted signal of a signal which is input to the terminal D1 of the circuit 1000*a*, which is obtained by inversion by the inverter circuit 400. As the inverter circuit 400, for example, an inverter 440 can be used. In addition, the polarity of the transistor 102*a* included in the circuit 1000*a* is the same as the polarity of the transistor 102*b* included in the circuit 1000*b*. Although FIG. 13 illustrates an example in which the transistor 102*a* and the transistor 102*b* are n-channel transistors, this embodiment is not limited thereto. The transistor 102*a* and the transistor 102*b* may be p-channel transistors. A potential which is applied to the terminal S1 and a potential which is applied to the terminal S2 are the same potential, i.e., a potential V1.

The terminal B1 is electrically connected to an input terminal IN1 of the sense amplifier 1451 via the switch 8450*b*. In other words, the switch 8450*b* selectively and electrically connects the input terminal IN1 of the sense amplifier 1451 and the terminal B1. The terminal B2 is electrically connected to an input terminal IN2 of the sense amplifier 1451 via the switch 9450*b*. In other words, the switch 9450*b* selectively and electrically connects the input terminal IN2 of the sense amplifier 1451 and the terminal B2. One electrode of a pair of electrodes of the capacitor 104*a* is electrically connected to the input terminal IN1 of the sense amplifier 1451, and the other electrode of the pair of electrodes of the capacitor 104*a* is electrically connected to a terminal C3. One electrode of a pair of electrodes of the capacitor 104*b* is electrically connected to the input terminal IN2 of the sense amplifier 1451, and the other electrode of the pair of electrodes of the capacitor 104*b* is electrically connected to a terminal C4. In addition, a terminal VR1 is electrically connected to the input terminal IN1 of the sense amplifier 1451 via the switch 8450*a*. That is, the switch 8450*a* selectively and electrically connects the input terminal IN1 of the sense amplifier 1451 and the terminal VR1. In addition, a terminal VR2 is electrically connected to the input terminal IN2 of the sense amplifier 1451 via the switch 9450*a*. That is, the switch 9450*a* selectively and electrically connects the input terminal IN2 of the sense amplifier 1451 and the terminal VR2. Here, the switch 8450*a*, the switch 8450*b*, and the terminal VR1 can be collectively referred to as a first precharge circuit, and the switch 9450*a*, the switch 9450*b*, and the terminal VR2 can be collectively referred to as a second precharge circuit. A precharge potential can be applied to the terminal VR1 and the terminal VR2 (or a wiring electrically connected to the terminal VR1 and a wiring electrically connected to the terminal VR2). The precharge potential can be a high power supply potential, a low power supply potential, or an intermediate potential between the high power supply potential and the low power supply potential. Different precharge potentials may be applied to the terminal VR1 and the terminal VR2. Then, the sense amplifier 1451 compares the potential input to the input terminal IN1 with the potential input to the input terminal IN2 and outputs a result of the comparison from an output terminal OUT.

Here, the same potential may be input to the terminals C1, C2, C3, and C4 or different potentials may be input thereto. For example, the potential V1 may be input to the terminals C1, C2, C3, and C4.

As the sense amplifier 1451, for example, a latch circuit or an operational amplifier can be used. The structure of the sense amplifier 1451 can be similar to any of the structures described in Embodiment 2 using FIGS. 9A to 9C.

The switches 8450*a* and 8450*b* and the switches 9450*a* and 9450*b* can be formed using transistors or the like. The switches 8450*a* and 8450*b* and the switches 9450*a* and 9450*b* can have structures similar to any of the structures described in Embodiment 2 using FIGS. 10A and 10B.

(Variations of Memory Element)

In (Structure 3 of Memory Element) described above, the memory element may further include a diode, a resistor, an inverter, a buffer, and a switch. As the switch, an analog switch, a transistor, or the like can be used, for example. For example, a switch which selects whether or not the potential of the output terminal OUT of the sense amplifier 1451 is output from the memory element 100 may be included. Note that the sense amplifier 1451 which also functions as the switch may be used. That is, the sense amplifier 1451 may output, from the output terminal OUT, a signal which is amplified in synchronization with the control signal such as a clock signal.

Here, the driving method of (Structure 3 of Memory Element) is not described in detail but can be similar to the driving method described in Embodiment 2. For example, the timing of switching of each of the transistor 101*a* and the transistor 101*b* by a control signal SG1, the timing of switching of each of the switch 8450*a*, the switch 8450*b*, the switch 9450*a*, and the switch 9450*b*, the potentials applied to the terminal VR1 and the terminal VR2, and the like can be similar to those in the driving method described in Embodiment 2.

This embodiment can be implemented combining with another embodiment as appropriate.

(Embodiment 4)

(Structure 4 of Memory Element)

Figure 14:
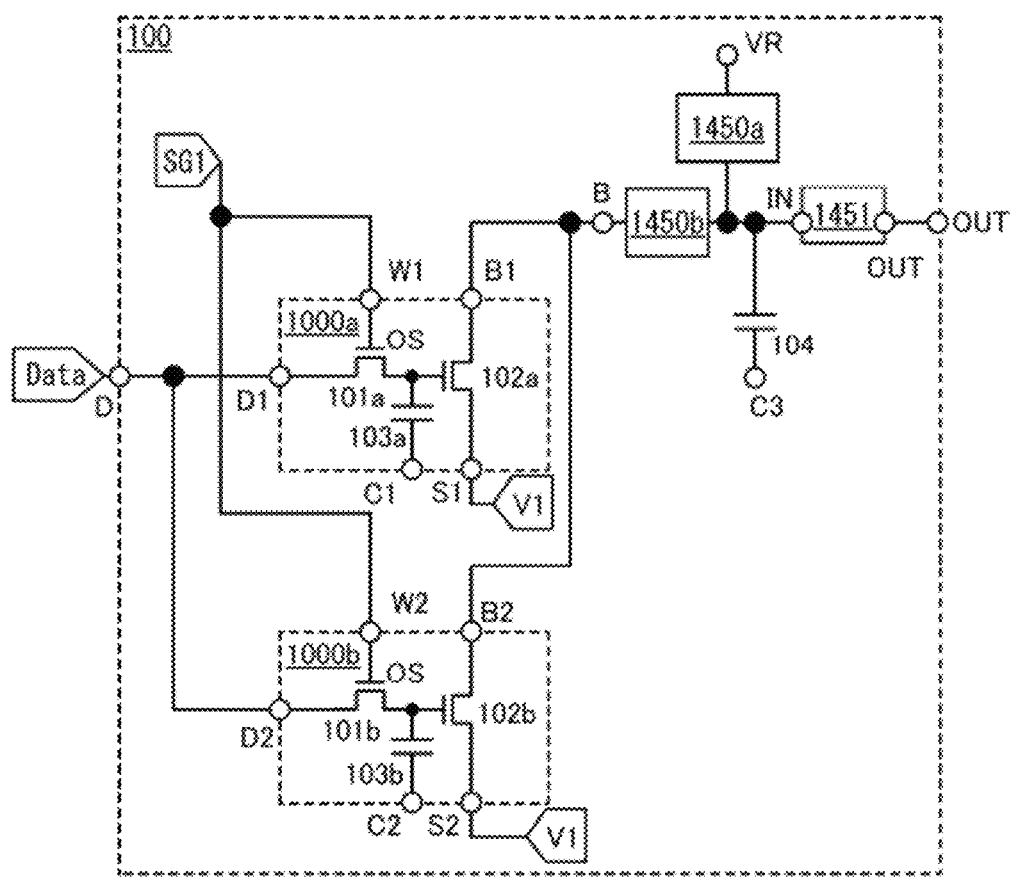
FIG. 14 illustrates the structure of a memory element.

FIG. 14 illustrates a memory element that is another embodiment of the present invention. In FIG. 14, a memory element 100 includes a circuit 1000*a*, a circuit 1000*b*, a sense amplifier 1451, a switch 1450*a*, a switch 1450*b*, and a capacitor 104. Data is input to a terminal D, and the memory element 100 holds a signal corresponding to the data and outputs the signal corresponding to the data from a terminal OUT. The circuit 1000*a* includes a transistor 101*a*, a transistor 102*a*, and a capacitor 103*a*. The circuit 1000*b* includes a transistor 101*b*, a transistor 102*b*, and a capacitor 103*b*. Note that one or all of the capacitor 103*a*, the capacitor 103*b*, and the capacitor 104 can be omitted by positively using a parasitic capacitance or the like.

In the circuit 1000*a*, a gate of the transistor 101*a* is electrically connected to a terminal W1, one of a source and a drain of the transistor 101*a* is electrically connected to a terminal D1, and the other of the source and the drain of the transistor 101*a* is electrically connected to a gate of the transistor 102*a*. One of a source and a drain of the transistor 102*a* is electrically connected to a terminal B1, and the other of the source and the drain of the transistor 102*a* is electrically connected to a terminal S1. One electrode of a pair of electrodes of the capacitor 103*a* is electrically connected to the gate of the transistor 102*a*, and the other electrode of the pair of electrodes of the capacitor 103*a* is electrically connected to a terminal C1. In the circuit 1000*b*, a gate of the transistor 101*b* is electrically connected to a terminal W2, one of a source and a drain of the transistor 101*b* is electrically connected to a terminal D2, and the other of the source and the drain of the transistor 101*b* is electrically connected to a gate of the transistor 102*b*. One of a source and a drain of the transistor 102b is electrically connected to a terminal B2, and the other of the source and the drain of the transistor 102b is electrically connected to a terminal S2. One electrode of a pair of electrodes of the capacitor 103b is electrically connected to the gate of the transistor 102b, and the other electrode of the pair of electrodes of the capacitor 103b is electrically connected to a terminal C2.

Transistors with extremely low off-state current are used as the transistor 101a and the transistor 101b. As the transistor with extremely small off-state current, a transistor whose channel is formed in a layer or in a substrate including a semiconductor having a wider bandgap than silicon can be used. As the semiconductor having a wider bandgap than silicon, compound semiconductors such as an oxide semiconductor and a nitride semiconductor can be given. For example, a transistor including an oxide semiconductor in which a channel is formed can be used for the transistor 101a and the transistor 101b. In FIG. 14, "OS" is written beside each of the transistor 101a and the transistor 101b in order to indicate the transistor 101a and the transistor 101b each including an oxide semiconductor layer in which a channel is formed In the memory element 100 illustrated in FIG. 14, a signal which is input to the terminal D1 of the circuit 1000a is the same signal as a signal which is input to the terminal D2 of the circuit 1000b. In addition, the polarity of the transistor 102a included in the circuit 1000a is the same as the polarity of the transistor 102b included in the circuit 1000b. Although FIG. 14 illustrates an example in which the transistor 102a and the transistor 102b are n-channel transistors, this embodiment is not limited thereto. The transistor 102a and the transistor 102b may be p-channel transistors. A potential which is applied to the terminal S1 and a potential which is applied to the terminal S2 are the same potential, i.e., a potential V1.

The terminal B1 and the terminal B2 are electrically connected to each other to be electrically connected to an input terminal IN of the sense amplifier 1451 via the switch 1450b. In other words, the switch 1450b selectively and electrically connects the input terminal IN of the sense amplifier 1451 and the terminals B1 and B2. Here, it can be considered that the terminal B1 and the terminal B2 are electrically connected to a terminal B and the switch 1450b selectively and electrically connects the input terminal IN of the sense amplifier 1451 and the terminal B. One electrode of a pair of electrodes of the capacitor 104 is electrically connected to the input terminal IN of the sense amplifier 1451, and the other electrode of the pair of electrodes of the capacitor 104 is electrically connected to a terminal C3. In addition, a terminal VR is electrically connected to the input terminal IN of the sense amplifier 1451 via the switch 1450a. That is, the switch 1450a selectively and electrically connects the input terminal IN of the sense amplifier 1451 and the terminal VR. Here, the switch 1450a, the switch 1450b, and the terminal VR can be collectively referred to as a precharge circuit. A precharge potential can be applied to the terminal VR (or a wiring electrically connected to the terminal VR). The precharge potential can be a high power supply potential, a low power supply potential, or an intermediate potential between the high power supply potential and the low power supply potential. Then, the sense amplifier 1451 amplifies and outputs the potential which is input to the input terminal IN, from an output terminal OUT.

Here, the same potential may be input to the terminals C1, C2, and C3 or different potentials may be input thereto. For example, the potential V1 may be input to the terminals C1, C2, and C3.

As the sense amplifier 1451, for example, an inverter, a clocked inverter, a buffer, a latch circuit, an operational amplifier, or the like can be used. The structure of the sense amplifier 1451 can be similar to any of the structures described in Embodiment 1 using FIGS. 2A to 2D.

The switch 1450a and the switch 1450b can be formed using transistors or the like. The structures of the switch 1450a and the switch 1450b can be similar to the structures described in Embodiment 1 using FIGS. 3A to 3D.

(Variations of Memory Element)

In (Structure 4 of Memory Element) described above, the memory element may further include a diode, a resistor, an inverter, a buffer, and a switch. As the switch, an analog switch, a transistor, or the like can be used, for example. For example, a switch which selects whether or not the potential of the output terminal OUT of the sense amplifier 1451 is output from the memory element 100 may be included. Note that the sense amplifier 1451 which also functions as the switch may be used. That is, the sense amplifier 1451 may output, from the output terminal OUT, a signal which is amplified in synchronization with the control signal such as a clock signal. As such a sense amplifier 1451, a clocked inverter can be used, for example.

Here, the driving method of (Structure 4 of Memory Element) is not described in detail but can be similar to the driving method described in Embodiment 1. For example, the timing of switching of each of the transistor 101a and the transistor 101b by a control signal SG1, the timing of switching of each of the switch 1450a and the switch 1450b, the potential applied to the terminal VR, and the like can be similar to those in the driving method described in Embodiment 1.

This embodiment can be implemented combining with another embodiment as appropriate.

(Embodiment 5)

(Structure 5 of Memory Element)

Figure 15:
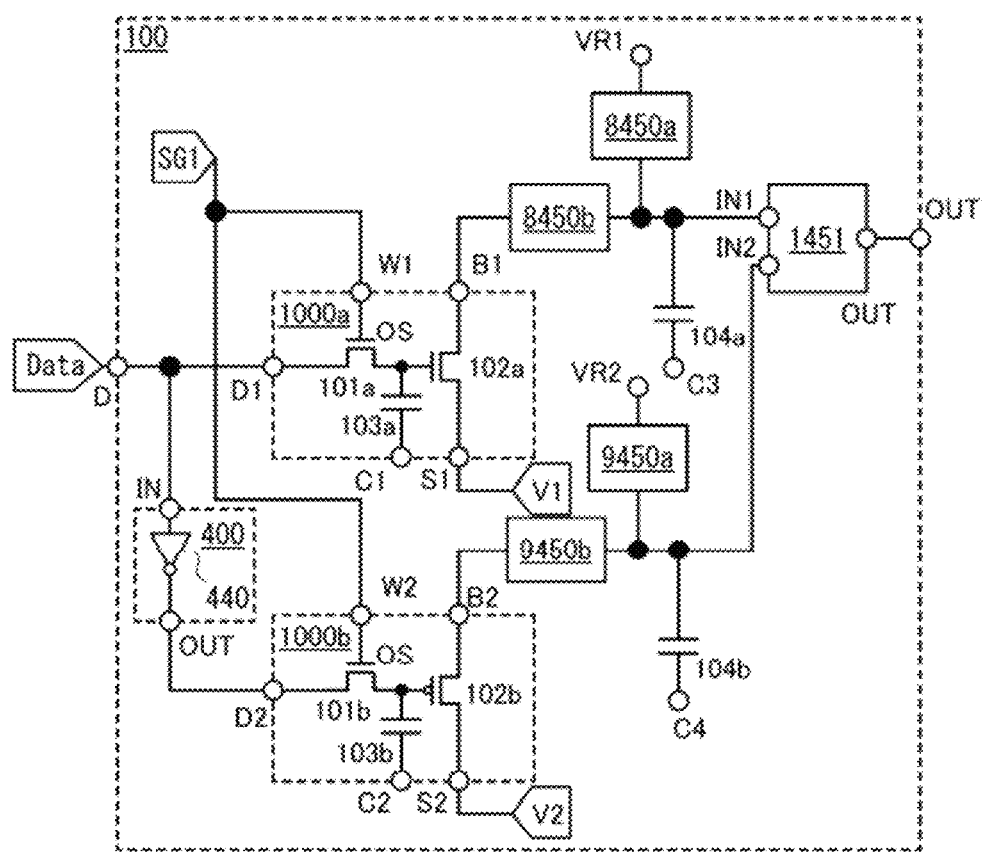
FIG. 15 illustrates the structure of a memory element.

FIG. 15 illustrates a memory element that is another embodiment of the present invention. In FIG. 15, a memory element 100 includes a circuit 1000a, a circuit 1000b, an inverter circuit 400, a sense amplifier 1451, a switch 8450a, a switch 8450b, a capacitor 104a, a switch 9450a, a switch 9450b, and a capacitor 104b. Data is input to a terminal D, and the memory element 100 holds a signal corresponding to the data and outputs the signal corresponding to the data from a terminal OUT. The circuit 1000a includes a transistor 101a, a transistor 102a, and a capacitor 103a. The circuit 1000b includes a transistor 101b, a transistor 102b, and a capacitor 103b. Note that one or all of the capacitor 103a, the capacitor 103b, the capacitor 104a, and the capacitor 104b can be omitted by positively using a parasitic capacitance or the like.

In the circuit 1000a, a gate of the transistor 101a is electrically connected to a terminal W1, one of a source and a drain of the transistor 101a is electrically connected to a terminal D1, and the other of the source and the drain of the transistor 101a is electrically connected to a gate of the transistor 102a. One of a source and a drain of the transistor 102a is electrically connected to a terminal B1, and the other of the source and the drain of the transistor 102a is electrically connected to a terminal S1. One electrode of a pair of electrodes of the capacitor 103a is electrically connected to the gate of the transistor 102a, and the other electrode of the pair of electrodes of the capacitor 103a is electrically connected to a terminal C1. In the circuit 1000b, a gate of the transistor 101b is electrically connected to a terminal W2, one of a source and a drain of the transistor 101b is electrically connected to a terminal D2, and the other of the source and the drain of the transistor 101b is electrically connected to a gate of the transistor 102b. One of a source and a drain of the transistor 102b is electrically connected to a terminal B2, and the other of the source and the drain of the transistor 102b is electrically connected to a terminal S2. One electrode of a pair of electrodes of the capacitor 103b is electrically connected to the gate of the transistor 102b, and the other electrode of the pair of electrodes of the capacitor 103b is electrically connected to a terminal C2.

Transistors with extremely low off-state current are used as the transistor 101a and the transistor 101b. As the transistor with extremely small off-state current, a transistor whose channel is formed in a layer or in a substrate including a semiconductor having a wider bandgap than silicon can be used. As the semiconductor having a wider bandgap than silicon, compound semiconductors such as an oxide semiconductor and a nitride semiconductor can be given. For example, a transistor including an oxide semiconductor in which a channel is formed can be used for the transistor 101a and the transistor 101b. In FIG. 15, "OS" is written beside each of the transistor 101a and the transistor 101b in order to indicate the transistor 101a and the transistor 101b each including an oxide semiconductor layer in which a channel is formed.

In the memory element 100 illustrated in FIG. 15, a signal which is input to the terminal D2 of the circuit 1000b is an inverted signal of a signal which is input to the terminal D1 of the circuit 1000a, which is obtained by inversion by the inverter circuit 400. As the inverter circuit 400, an inverter 440 can be used, for example. In addition, the polarity of the transistor 102a included in the circuit 1000a and the polarity of the transistor 102b included in the circuit 1000b are different from each other. Although FIG. 15 illustrates the example in which the transistor 102a is an n-channel transistor and the transistor 102b is a p-channel transistor, this embodiment is not limited thereto. The transistor 102a may be a p-channel transistor and the transistor 102b may be an n-channel transistor. A potential which is applied to the terminal S1 and a potential which is applied to the terminal S2 are different potentials, i.e., a potential V1 and a potential V2, respectively.

The terminal B1 is electrically connected to an input terminal IN1 of the sense amplifier 1451 via the switch 8450b. In other words, the switch 8450b selectively and electrically connects the input terminal IN1 of the sense amplifier 1451 and the terminal B1. The terminal B2 is electrically connected to an input terminal IN2 of the sense amplifier 1451 via the switch 9450b. In other words, the switch 9450b selectively and electrically connects the input terminal IN2 of the sense amplifier 1451 and the terminal B2. One electrode of a pair of electrodes of the capacitor 104a is electrically connected to the input terminal IN1 of the sense amplifier 1451, and the other electrode of the pair of electrodes of the capacitor 104a is electrically connected to a terminal C3. One electrode of a pair of electrodes of the capacitor 104b is electrically connected to the input terminal IN2 of the sense amplifier 1451, and the other electrode of the pair of electrodes of the capacitor 104b is electrically connected to a terminal C4. In addition, a terminal VR1 is electrically connected to the input terminal IN1 of the sense amplifier 1451 via the switch 8450a. That is, the switch 8450a selectively and electrically connects the input terminal IN1 of the sense amplifier 1451 and the terminal VR1. In addition, a terminal VR2 is electrically connected to the input terminal IN2 of the sense amplifier 1451 via the switch 9450a. That is, the switch 9450a selectively and electrically connects the input terminal IN2 of the sense amplifier 1451 and the terminal VR2. Here, the switch 8450a, the switch 8450b, and the terminal VR1 can be collectively referred to as a first precharge circuit, and the switch 9450a, the switch 9450b, and the terminal VR2 can be collectively referred to as a second precharge circuit. A precharge potential can be applied to the terminal VR1 and the terminal VR2 (or a wiring electrically connected to the terminal VR1 and a wiring electrically connected to the terminal VR2). The precharge potential can be a high power supply potential, a low power supply potential, or an intermediate potential between the high power supply potential and the low power supply potential. Different precharge potentials may be applied to the terminal VR1 and the terminal VR2. Then, the sense amplifier 1451 compares the potential input to the input terminal IN1 with the potential input to the input terminal IN2 and outputs a result of the comparison from an output terminal OUT.

Here, the same potential may be input to the terminals C1, C2, C3, and C4 or different potentials may be input thereto. For example, the potential V1 may be input to the terminals C1, C2, C3, and C4.

As the sense amplifier 1451, for example, a latch circuit, an operational amplifier, or the like can be used. The structure of the sense amplifier 1451 can be similar to any of the structures described in Embodiment 2 using FIGS. 9A to 9C.

The switches 8450a and 8450b and the switches 9450a and 9450b can be formed using transistors or the like. The switches 8450a and 8450b and the switches 9450a and 9450b can have structures similar to any of the structures described in Embodiment 2 using FIGS. 10A and 10B.

(Variations of Memory Element)

In (Structure 5 of Memory Element) described above, the memory element may further include a diode, a resistor, an inverter, a buffer, and a switch. As the switch, an analog switch, a transistor, or the like can be used, for example. For example, a switch which selects whether or not the potential of the output terminal OUT of the sense amplifier 1451 is output from the memory element 100 may be included. Note that the sense amplifier 1451 which also functions as the switch may be used. That is, the sense amplifier 1451 may output, from the output terminal OUT, a signal which is amplified in synchronization with the control signal such as a clock signal.

Here, the driving method of (Structure 5 of Memory Element) is not described in detail but can be similar to the driving method described in Embodiment 2. For example, the timing of switching of each of the transistor 101a and the transistor 101b by a control signal SG1, the timing of switching of each of the switch 8450a, the switch 8450b, the switch 9450a, and the switch 9450b, the potentials applied to the terminal VR1 and the terminal VR2, the potentials V1 and V2, and the like can be similar to those in the driving method described in Embodiment 2. For example, in (Structure 5 of Memory Element), the potential applied to the terminal VR1 can be the potential V2 and the potential applied to the terminal VR2 can be the potential V1, This embodiment can be implemented combining with another embodiment as appropriate.

(Embodiment 6)

(Structure 6 of Memory Element)

Figure 16:
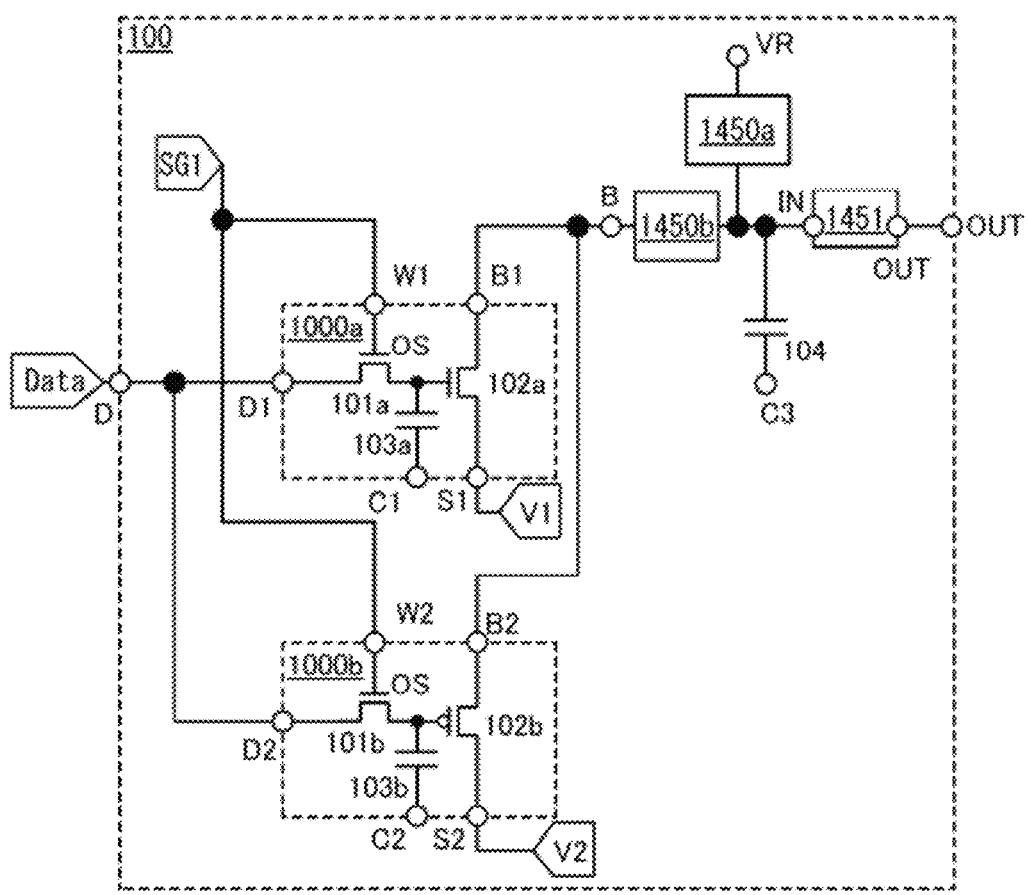
FIG. 16 illustrates the structure of a memory element.

FIG. 16 illustrates a memory element that is another embodiment of the present invention. In FIG. 16, a memory element 100 includes a circuit 1000a, a circuit 1000b, a sense amplifier 1451, a switch 1450a, a switch 1450b, and a capacitor 104. Data is input to a terminal D, and the memory element 100 holds a signal corresponding to the data and outputs the signal corresponding to the data from a terminal OUT. The circuit 1000a includes a transistor 101a, a transistor 102a, and a capacitor 103a. The circuit 1000b includes a transistor 101b, a transistor 102b, and a capacitor 103b. Note that one or all of the capacitor 103a, the capacitor 103b, and the capacitor 104 can be omitted by positively using a parasitic capacitance or the like.

In the circuit 1000a, a gate of the transistor 101a is electrically connected to a terminal W1, one of a source and a drain of the transistor 101a is electrically connected to a terminal D1, and the other of the source and the drain of the transistor 101a is electrically connected to a gate of the transistor 102a. One of a source and a drain of the transistor 102a is electrically connected to a terminal B1, and the other of the source and the drain of the transistor 102a is electrically connected to a terminal S1. One electrode of a pair of electrodes of the capacitor 103a is electrically connected to the gate of the transistor 102a, and the other electrode of the pair of electrodes of the capacitor 103a is electrically connected to a terminal C1. In the circuit 1000b, a gate of the transistor 101b is electrically connected to a terminal W2, one of a source and a drain of the transistor 101b is electrically connected to a terminal D2, and the other of the source and the drain of the transistor 101b is electrically connected to a gate of the transistor 102b. One of a source and a drain of the transistor 102b is electrically connected to a terminal B2, and the other of the source and the drain of the transistor 102b is electrically connected to a terminal S2. One electrode of a pair of electrodes of the capacitor 103b is electrically connected to the gate of the transistor 102b, and the other electrode of the pair of electrodes of the capacitor 103b is electrically connected to a terminal C2.

Transistors with extremely low off-state current are used as the transistor 101a and the transistor 101b. As the transistor with extremely small off-state current, a transistor whose channel is formed in a layer or in a substrate including a semiconductor having a wider bandgap than silicon can be used. As the semiconductor having a wider bandgap than silicon, compound semiconductors such as an oxide semiconductor and a nitride semiconductor can be given. For example, a transistor including an oxide semiconductor in which a channel is formed can be used for the transistor 101a and the transistor 101b. In FIG. 16, "OS" is written beside each of the transistor 101a and the transistor 101b in order to indicate the transistor 101a and the transistor 101b each including an oxide semiconductor layer in which a channel is formed.

In the memory element 100 illustrated in FIG. 16, a signal which is input to the terminal D1 of the circuit 1000a is the same signal as a signal which is input to the terminal D2 of the circuit 1000b. In addition, the polarity of the transistor 102a included in the circuit 1000a and the polarity of the transistor 102b included in the circuit 1000b are different from each other. Although FIG. 16 illustrates an example in which the transistor 102a is an n-channel transistor and the transistor 102b is a p-channel transistor, this embodiment is not limited thereto. The transistor 102a may be a p-channel transistor and the transistor 102b may be an n-channel transistor. A potential which is applied to the terminal S1 and a potential which is applied to the terminal S2 are different potentials, i.e., a potential V1 and a potential V2, respectively.

The terminal B1 and the terminal B2 are electrically connected to each other to be electrically connected to an input terminal IN of the sense amplifier 1451 via the switch 1450b. In other words, the switch 1450b selectively and electrically connects the input terminal IN of the sense amplifier 1451 and the terminals B1 and B2. Here, it can be considered that the terminal B1 and the terminal B2 are electrically connected to a terminal B and the switch 1450b selectively and electrically connects the input terminal IN of the sense amplifier 1451 and the terminal B. One electrode of a pair of electrodes of the capacitor 104 is electrically connected to the input terminal IN of the sense amplifier 1451, and the other electrode of the pair of electrodes of the capacitor 104 is electrically connected to a terminal C3. In addition, a terminal VR is electrically connected to the input terminal IN of the sense amplifier 1451 via the switch 1450a. That is, the switch 1450a selectively and electrically connects the input terminal IN of the sense amplifier 1451 and the terminal VR. Here, the switch 1450a, the switch 1450b, and the terminal VR can be collectively referred to as a precharge circuit. A precharge potential can be applied to the terminal VR (or a wiring electrically connected to the terminal VR). The precharge potential can be a high power supply potential, a low power supply potential, or an intermediate potential between the high power supply potential and the low power supply potential. Then, the sense amplifier 1451 amplifies and outputs the potential which is input to the input terminal IN, from an output terminal OUT.

Here, the same potential may be input to the terminals C1, C2, and C3 or different potentials may be input thereto. For example, the potential V1 may be input to the terminals C1, C2, and C3.

As the sense amplifier 1451, for example, an inverter, a clocked inverter, a buffer, a latch circuit, an operational amplifier, or the like can be used. The structure of the sense amplifier 1451 can be similar to any of the structures described in Embodiment 1 using FIGS. 2A to 2D.

The switch 1450a and the switch 1450b can be formed using transistors or the like. The structures of the switch 1450a and the switch 1450b can be similar to any of the structures described in Embodiment 1 using FIGS. 3A to 3D.

(Variations of Memory Element)

In (Structure 6 of Memory Element) described above, the memory element may further include a diode, a resistor, an inverter, a buffer, and a switch. As the switch, an analog switch, a transistor, or the like can be used, for example. For example, a switch which selects whether or not the potential of the output terminal OUT of the sense amplifier 1451 is output from the memory element 100 may be included. Note that the sense amplifier 1451 which also functions as the switch may be used. That is, the sense amplifier 1451 may output, from the output terminal OUT, a signal which is amplified in synchronization with the control signal such as a clock signal. As such a sense amplifier 1451, a clocked inverter can be used, for example.

Here, the driving method of (Structure 6 of Memory Element) is not described in detail but can be similar to the driving method described in Embodiment 1. For example, the timing of switching of each of the transistor 101a and the transistor 101b by a control signal SG1, the timing of switching of each of the switch 1450a and the switch 1450b, the potential applied to the terminal VR, and the like can be similar to those in the driving method described in Embodiment 1.

This embodiment can be implemented combining with another embodiment as appropriate.

(Embodiment 7)

(Structure 7 of Memory Element)

Figure 17:
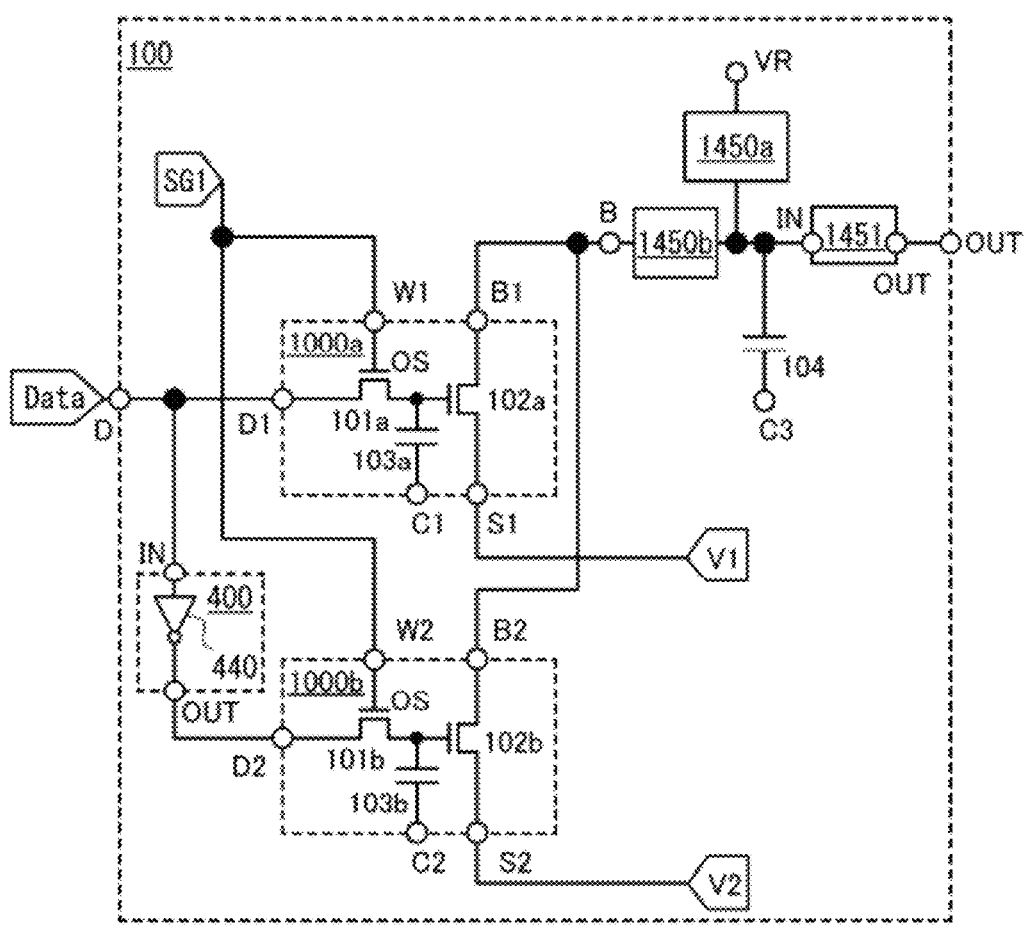
FIG. 17 illustrates the structure of a memory element.

FIG. 17 illustrates a memory element that is another embodiment of the present invention. In FIG. 17, a memory element 100 includes a circuit 1000a, a circuit 1000b, an inverter circuit 400, a sense amplifier 1451, a switch 1450a, a switch 1450b, and a capacitor 104. Data is input to a terminal D, and the memory element 100 holds a signal corresponding to the data and outputs the signal corresponding to the data from a terminal OUT. The circuit 1000a includes a transistor 101a, a transistor 102a, and a capacitor 103a. The circuit 1000b includes a transistor 101b, a transistor 102b, and a capacitor 103b. Note that one or all of the capacitor 103a, the capacitor 103b, and the capacitor 104 can be omitted by positively using a parasitic capacitance or the like.

In the circuit 1000a, a gate of the transistor 101a is electrically connected to a terminal W1, one of a source and a drain of the transistor 101a is electrically connected to a terminal D1, and the other of the source and the drain of the transistor 101a is electrically connected to a gate of the transistor 102a. One of a source and a drain of the transistor 102a is electrically connected to a terminal B1, and the other of the source and the drain of the transistor 102a is electrically connected to a terminal S1. One electrode of a pair of electrodes of the capacitor 103a is electrically connected to the gate of the transistor 102a, and the other electrode of the pair of electrodes of the capacitor 103a is electrically connected to a terminal C1. In the circuit 1000b, a gate of the transistor 101b is electrically connected to a terminal W2, one of a source and a drain of the transistor 101b is electrically connected to a terminal D2, and the other of the source and the drain of the transistor 101b is electrically connected to a gate of the transistor 102b. One of a source and a drain of the transistor 102b is electrically connected to a terminal B2, and the other of the source and the drain of the transistor 102b is electrically connected to a terminal S2. One electrode of a pair of electrodes of the capacitor 103b is electrically connected to the gate of the transistor 102b, and the other electrode of the pair of electrodes of the capacitor 103b is electrically connected to a terminal C2.

Transistors with extremely low off-state current are used as the transistor 101a and the transistor 101b. As the transistor with extremely small off-state current, a transistor whose channel is formed in a layer or in a substrate including a semiconductor having a wider bandgap than silicon can be used. As the semiconductor having a wider bandgap than silicon, compound semiconductors such as an oxide semiconductor and a nitride semiconductor can be given. For example, a transistor including an oxide semiconductor in which a channel is formed can be used for the transistor 101a and the transistor 101b. In FIG. 17, "OS" is written beside each of the transistor 101a and the transistor 101b in order to indicate the transistor 101a and the transistor 101b each including an oxide semiconductor layer in which a channel is formed.

In the memory element 100 illustrated in FIG. 17, a signal which is input to the terminal D2 of the circuit 1000b is an inverted signal of a signal which is input to the terminal D1 of the circuit 1000a, which is obtained by inversion by the inverter circuit 400. As the inverter circuit 400, for example, an inverter 440 can be used. In addition, the polarity of the transistor 102a included in the circuit 1000a is the same as the polarity of the transistor 102b included in the circuit 1000b. Although FIG. 17 illustrates an example in which the transistor 102a and the transistor 102b are n-channel transistors, this embodiment is not limited thereto. The transistor 102a and the transistor 102b may be p-channel transistors. A potential which is applied to the terminal S1 and a potential which is applied to the terminal S2 are different potentials, i.e., a potential V1 and a potential V2, respectively.

The terminal B1 and the terminal B2 are electrically connected to each other to be electrically connected to an input terminal IN of the sense amplifier 1451 via the switch 1450b. In other words, the switch 1450b selectively and electrically connects the input terminal IN of the sense amplifier 1451 and the terminals B1 and B2. Here, it can be considered that the terminal B1 and the terminal B2 are electrically connected to a terminal B and the switch 1450b selectively and electrically connects the input terminal IN of the sense amplifier 1451 and the terminal B. One electrode of a pair of electrodes of the capacitor 104 is electrically connected to the input terminal IN of the sense amplifier 1451, and the other electrode of the pair of electrodes of the capacitor 104 is electrically connected to a terminal C3. In addition, a terminal VR is electrically connected to the input terminal IN of the sense amplifier 1451 via the switch 1450a. That is, the switch 1450a selectively and electrically connects the input terminal IN of the sense amplifier 1451 and the terminal VR. Here, the switch 1450a, the switch 1450b, and the terminal VR can be collectively referred to as a precharge circuit. A precharge potential can be applied to the terminal VR (or a wiring electrically connected to the terminal VR). The precharge potential can be a high power supply potential, a low power supply potential, or an intermediate potential between the high power supply potential and the low power supply potential. Then, the sense amplifier 1451 amplifies and outputs the potential which is input to the input terminal IN, from an output terminal OUT.

Here, the same potential may be input to the terminals C1, C2, and C3 or different potentials may be input thereto. For example, the potential V1 may be input to the terminals C1, C2, and C3.

As the sense amplifier 1451, for example, an inverter, a clocked inverter, a buffer, a latch circuit, an operational amplifier, or the like can be used. The structure of the sense amplifier 1451 can be similar to any of the structures described in Embodiment 1 using FIGS. 2A to 2D.

The switch 1450a and the switch 1450b can be formed using transistors or the like. The structures of the switch 1450a and the switch 1450b can be similar to the structures described in Embodiment 1 using FIGS. 3A to 3D.

(Variations of Memory Element)

In (Structure 7 of Memory Element) described above, the memory element may further include a diode, a resistor, an inverter, a buffer, and a switch. As the switch, an analog switch, a transistor, or the like can be used, for example. For example, a switch which selects whether or not the potential of the output terminal OUT of the sense amplifier 1451 is output from the memory element 100 may be included. Note that the sense amplifier 1451 which also functions as the switch may be used. That is, the sense amplifier 1451 may output, from the output terminal OUT, a signal which is amplified in synchronization with the control signal such as a clock signal. As such a sense amplifier 1451, a clocked inverter can be used, for example.

Here, the driving method of (Structure 7 of Memory Element) is not described in detail but can be similar to the driving method described in Embodiment 1. For example, the timing of switching of each of the transistor 101a and the transistor 101b by a control signal SG1, the timing of switching of each of the switch 1450a and the switch 1450b, the potential applied to the terminal VR, and the like can be similar to those in the driving method described in Embodiment 1.

This embodiment can be implemented combining with another embodiment as appropriate.

(Embodiment 8)
(Structure 8 of Memory Element)

Figure 18:
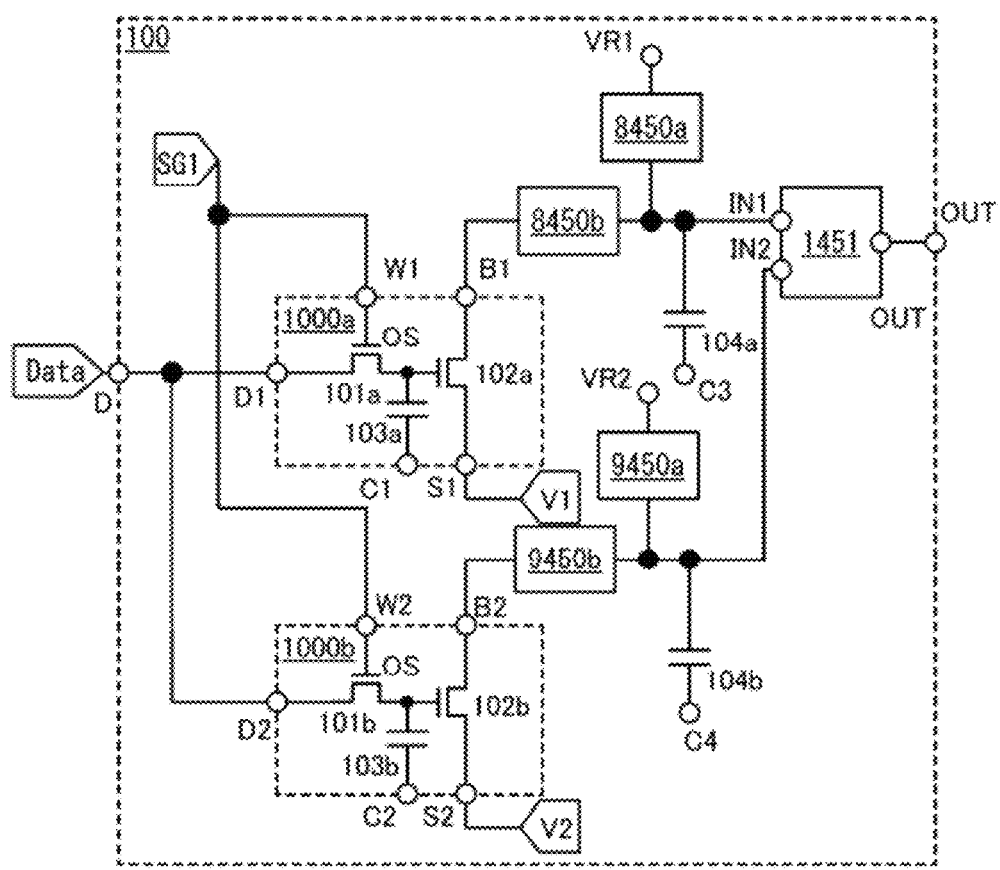
FIG. 18 illustrates the structure of a memory element.

FIG. 18 illustrates a memory element that is another embodiment of the present invention. In FIG. 18, a memory element 100 includes a circuit 1000a, a circuit 1000b a sense amplifier 1451, a switch 8450a, a switch 8450b, a capacitor 104a, a switch 9450a, a switch 9450b, and a capacitor 104b. Data is input to a terminal D, and the memory element 100 holds a signal corresponding to the data and outputs the signal corresponding to the data from a terminal OUT. The circuit 1000a includes a transistor 101a, a transistor 102a, and a capacitor 103a. The circuit 1000b includes a transistor 101b, a transistor 102b, and a capacitor 103b. Note that one or all of the capacitor 103a, the capacitor 103b, the capacitor 104a, and the capacitor 104b can be omitted by positively using a parasitic capacitance or the like.

In the circuit 1000a, a gate of the transistor 101a is electrically connected to a terminal 1l, one of a source and a drain of the transistor 101a is electrically connected to a terminal D1, and the other of the source and the drain of the transistor 101a is electrically connected to a gate of the transistor 102a. One of a source and a drain of the transistor 102a is electrically connected to a terminal B1, and the other of the source and the drain of the transistor 102a is electrically connected to a terminal S1. One electrode of a pair of electrodes of the capacitor 103a is electrically connected to the gate of the transistor 102a, and the other electrode of the pair of electrodes of the capacitor 103a is electrically connected to a terminal C1. In the circuit 1000b, a gate of the transistor 101b is electrically connected to a terminal W2, one of a source and a drain of the transistor 101b is electrically connected to a terminal D2, and the other of the source and the drain of the transistor 101b is electrically connected to a gate of the transistor 102b. One of a source and a drain of the transistor 102b is electrically connected to a terminal B2, and the other of the source and the drain of the transistor 102b is electrically connected to a terminal S2. One electrode of a pair of electrodes of the capacitor 103b is electrically connected to the gate of the transistor 102b, and the other electrode of the pair of electrodes of the capacitor 103b is electrically connected to a terminal C2.

Transistors with extremely low off-state current are used as the transistor 101a and the transistor 101b. As the transistor with extremely small off-state current, a transistor whose channel is formed in a layer or in a substrate including a semiconductor having a wider bandgap than silicon can be used. As the semiconductor having a wider bandgap than silicon, compound semiconductors such as an oxide semiconductor and a nitride semiconductor can be given. For example, a transistor including an oxide semiconductor in which a channel is formed can be used for the transistor 101a and the transistor 101b. In FIG. 18, "OS" is written beside each of the transistor 101a and the transistor 101b in order to indicate the transistor 101a and the transistor 101b each including an oxide semiconductor layer in which a channel is formed.

In the memory element 100 illustrated in FIG. 18, a signal which is input to the terminal D1 of the circuit 1000a is the same signal as a signal which is input to the terminal D2 of the circuit 1000b. In addition, the polarity of the transistor 102a included in the circuit 1000a is the same as the polarity of the transistor 102b included in the circuit 1000b. Although FIG. 18 illustrates an example in which the transistor 102a and the transistor 102b are n-channel transistors, this embodiment is not limited thereto. The transistor 102a and the transistor 102b may be p-channel transistors. A potential which is applied to the terminal S1 and a potential which is applied to the terminal S2 are different potentials, i.e., a potential V1 and a potential V2, respectively.

The terminal B1 is electrically connected to an input terminal IN1 of the sense amplifier 1451 via the switch 8450b. In other words, the switch 8450b selectively and electrically connects the input terminal IN1 of the sense amplifier 1451 and the terminal B1. The terminal B2 is electrically connected to an input terminal IN2 of the sense amplifier 1451 via the switch 9450b. In other words, the switch 9450b selectively and electrically connects the input terminal IN2 of the sense amplifier 1451 and the terminal B2. One electrode of a pair of electrodes of the capacitor 104a is electrically connected to the input terminal IN1 of the sense amplifier 1451, and the other electrode of the pair of electrodes of the capacitor 104a is electrically connected to a terminal C3. One electrode of a pair of electrodes of the capacitor 104b is electrically connected to the input terminal IN2 of the sense amplifier 1451, and the other electrode of the pair of electrodes of the capacitor 104b is electrically connected to a terminal C4. In addition, a terminal VR1 is electrically connected to the input terminal IN1 of the sense amplifier 1451 via the switch 8450a. That is, the switch 8450a selectively and electrically connects the input terminal IN1 of the sense amplifier 1451 and the terminal VR1. In addition, a terminal VR2 is electrically connected to the input terminal IN2 of the sense amplifier 1451 via the switch 9450a. That is, the switch 9450a selectively and electrically connects the input terminal IN2 of the sense amplifier 1451 and the terminal VR2. Here, the switch 8450a, the switch 8450b, and the terminal VR1 can be collectively referred to as a first precharge circuit, and the switch 9450a, the switch 9450b, and the terminal VR2 can be collectively referred to as a second precharge circuit. A precharge potential can be applied to the terminal VR1 and the terminal VR2 (or a wiring electrically connected to the terminal VR1 and a wiring electrically connected to the terminal VR2). The precharge potential can be a high power supply potential, a low power supply potential, or an intermediate potential between the high power supply potential and the low power supply potential. Different precharge potentials may be applied to the terminal VR1 and the terminal VR2. Then, the sense amplifier 1451 compares the potential input to the input terminal IN1 with the potential input to the input terminal IN2 and outputs a result of the comparison from an output terminal OUT.

Here, the same potential may be input to the terminals C1, C2, C3, and C4 or different potentials may be input thereto. For example, the potential V1 may be input to the terminals C1, C2, C3, and C4.

As the sense amplifier 1451, for example, a latch circuit, an operational amplifier, or the like can be used. The structure of the sense amplifier 1451 can be similar to any of the structures described in Embodiment 2 using FIGS. 9A to 9C The switches 8450a and 8450b and the switches 9450a and 9450b can be formed using transistors or the like. The switches 8450a and 8450b and the switches 9450a and 9450b can have structures similar to any of the structures described in Embodiment 2 using FIGS. 10A and 10B.

(Variations of Memory Element)

In (Structure 8 of Memory Element) described above, the memory element may further include a diode, a resistor, an inverter, a buffer, and a switch. As the switch, an analog switch, a transistor, or the like can be used, for example. For example, a switch which selects whether or not the potential of the output terminal OUT of the sense amplifier 1451 is output from the memory element 100 may be included. Note that the sense amplifier 1451 which also functions as the switch may be used. That is, the sense amplifier 1451 may output, from the output terminal OUT, a signal which is amplified in synchronization with the control signal such as a clock signal.

Here, the driving method of (Structure 8 of Memory Element) is not described in detail but can be similar to the driving method described in Embodiment 2. For example, the timing of switching of each of the transistor 101*a* and the transistor 101*b* by a control signal SG1, the timing of switching of each of the switch 8450*a*, the switch 8450*b*, the switch 9450*a*, and the switch 9450*b*, the potentials applied to the terminal VR1 and the terminal VR2, the potentials V1 and V2, and the like can be similar to those in the driving method described in Embodiment 2. For example, in (Structure 8 of Memory Element), the potential applied to the terminal VR1 can be the potential V2 and the potential applied to the terminal VR2 can be the potential V1, This embodiment can be implemented combining with another embodiment as appropriate.

(Embodiment 9)

Figure 6A:
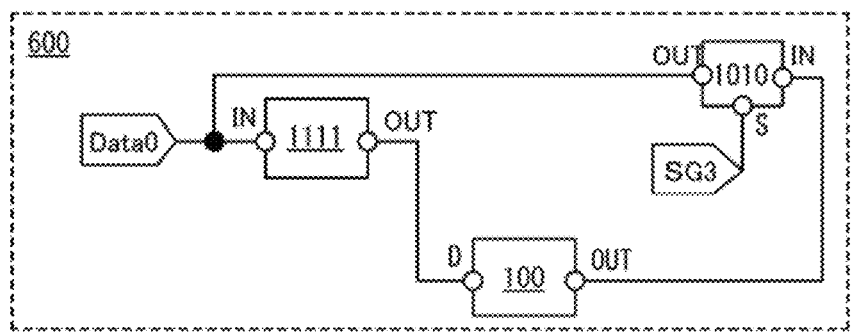
FIGS. 6A and 6B each illustrate the structure of a memory element.

FIG. 6A illustrates a memory element that is another embodiment of the present invention. In FIG. 6A, a memory element 600 further includes a volatile memory circuit 1111 in addition to the memory element 100 described in the above embodiment. As the volatile memory circuit 1111, a flip-flop circuit or the like can be used, for example.

In the memory element 600 illustrated in FIG. 6A, data (Data 0) is input to the volatile memory circuit 1111 and the volatile memory circuit 1111 holds the data. In addition, a signal corresponding to the data held in the volatile memory circuit 1111 is input to a terminal D of the memory element 100. Note that an inverted signal of the signal corresponding to the data held in the volatile memory circuit 1111 may be input to the terminal D of the memory element 100. Then, a signal output from an output terminal OUT of the memory element 100 is input to the volatile memory circuit 1111 via a switch 1010. Note that an inverted signal of the signal output from the output terminal OUT of the memory element 100 may be input to the volatile memory circuit 1111 via the switch 1010. This embodiment is not limited to the structure in which the signal (or the inverted signal thereof) output from the output terminal OUT of the memory element 100 is input to an input terminal IN of the volatile memory circuit 1111. Alternatively, a structure in which the signal (or the inverted signal thereof) output from the output terminal OUT of the memory element 100 may be input to a node provided inside the volatile memory circuit 1111 may be employed.

The switch 1010 selectively outputs the signal (or a signal corresponding thereto) input to an input terminal IN from an output terminal OUT by a control signal SG3. As the switch 1010, a transistor, an analog switch, an inverter, an NAND circuit, or the like can be used.

This structure makes it possible to hold the data held in the volatile memory circuit 1111, in the memory element 100 before supply of a power supply voltage to the memory element 600 is stopped. After that, when the supply of the power supply voltage is stopped, the data held in the volatile memory circuit 1111 is lost but the data held in the memory element 100 is not lost. Thus, data can be held during a period in which the supply of the power supply voltage is stopped. Then, after the supply of the power supply voltage restarts, the data held in the memory element 100 is returned to the volatile memory circuit 1111. In this manner, it is possible to back up the data held in the volatile memory circuit 1111 in the memory element 100.

Figure 6B:
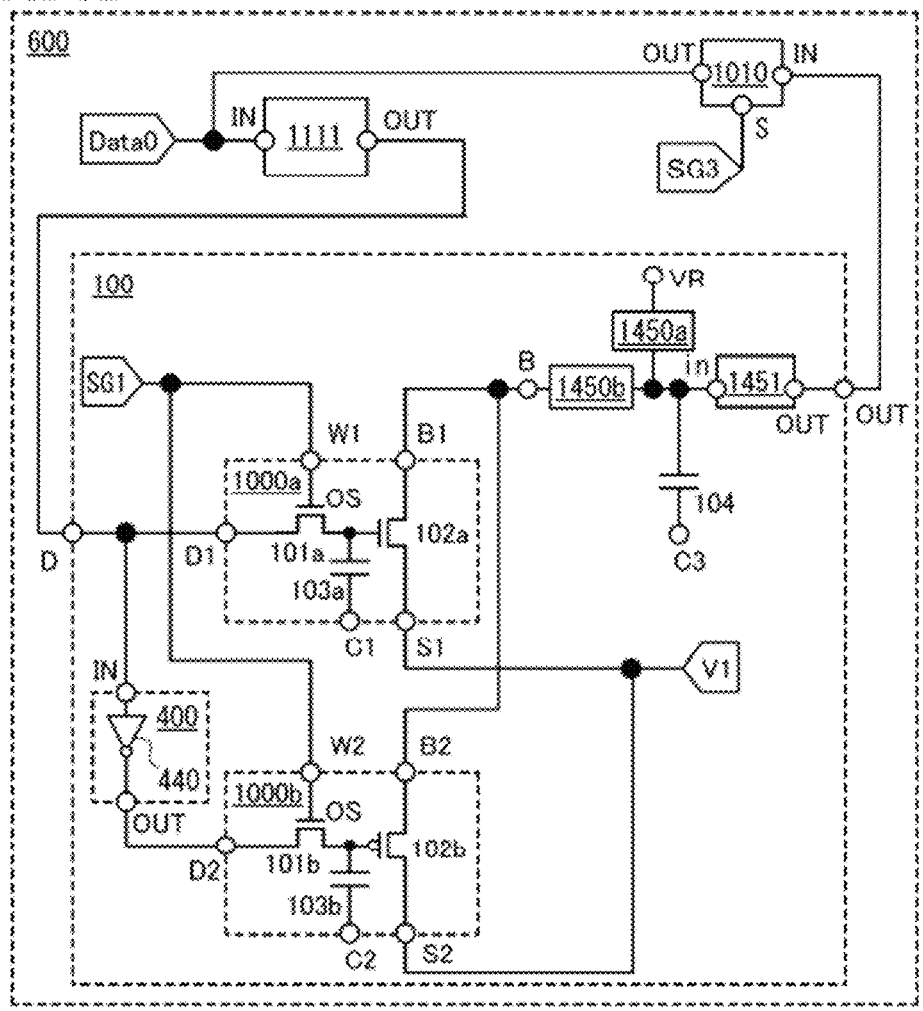

FIG. 6B illustrates an example of the structure of FIG. 6A in which the memory element 100 having the structure of FIG. 1 described in Embodiment 1 is used as the memory element 100. A driving method in the case of the structure illustrated in FIG. 6B is described in which potentials applied to a switch 1450*a*, a switch 1450*b*, a sense amplifier 1451, and a terminal VR are the same as those described with reference to FIG. 4, and the switch 1010 outputs, from the output terminal OUT, a signal which is input to the input terminal IN when the control signal SG3 is at a high level. A timing chart of FIG. 7 is used for the description.

Figure 7:
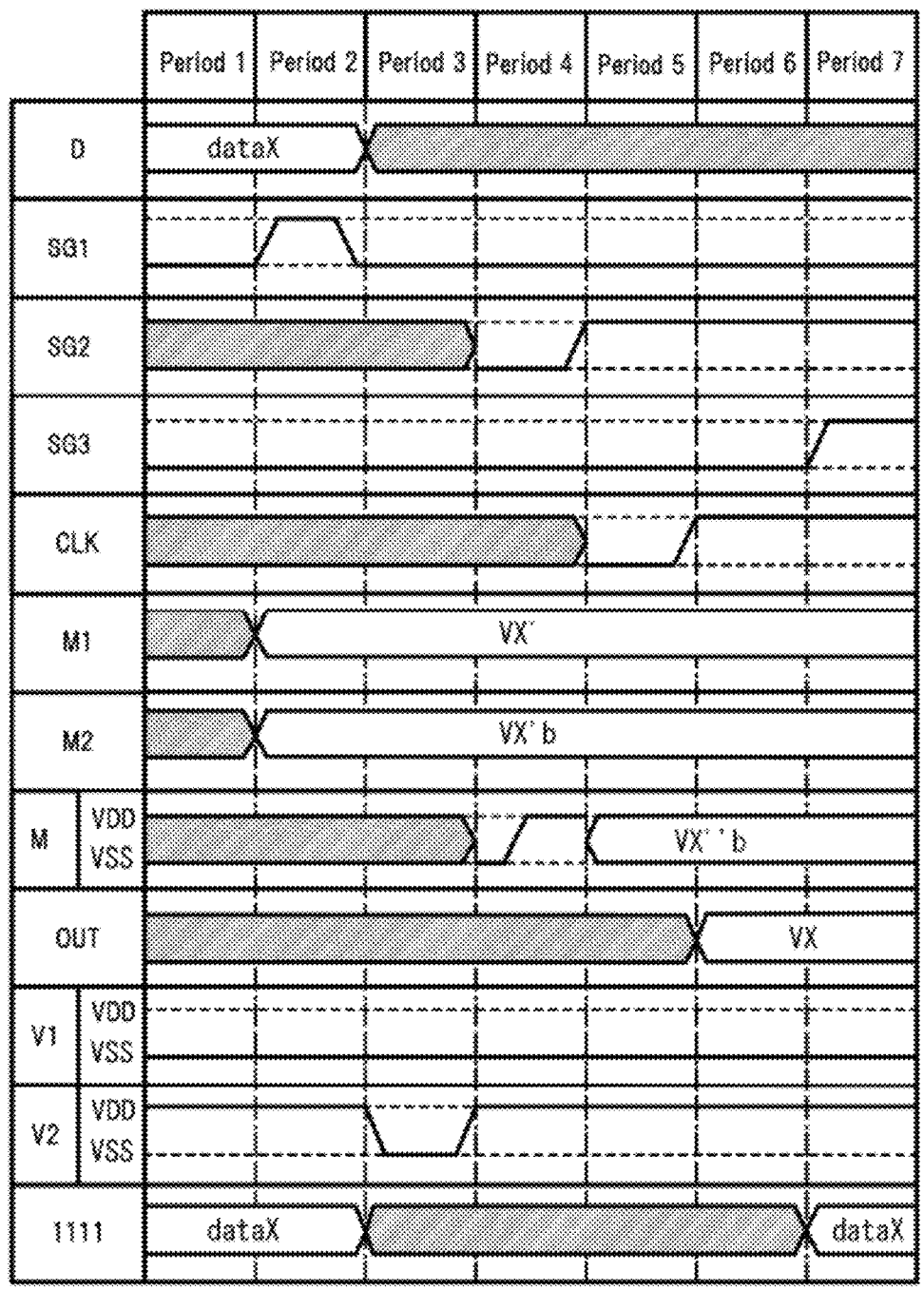
FIG. 7 is a timing chart showing a driving method of a memory element.

In FIG. 7, description of portions that are similar to those in FIG. 4 is omitted. In FIG. 7, "D" denotes data input to the terminal D of the memory element 100. In periods 1 to 6, the control signal SG3 is at a low level, and thus the switch 1010 is in an off state. The volatile memory circuit 1111 holds the input data (data X) until supply of the power supply voltage is stopped in a period 3. When the supply of the power supply voltage is stopped, the data held in the volatile memory circuit 1111 is lost. However, the memory element 100 holds a signal corresponding to the data. Therefore, in a period 7 after a signal potential VX is output from the output terminal OUT of the memory element 100, the control signal SG3 is set at a high level, so that the switch 1010 is turned on and the signal potential VX output from the output terminal OUT of the memory element 100 can be input to the volatile memory circuit 1111 via the switch 1010. In this manner, in the period 7, the volatile memory circuit 1111 can hold the original data (the data X) again.

Although in FIG. 6B, (Structure 1 of Memory Element) described in Embodiment 1 is applied to the memory element 100 having the structure of FIG. 6A, this embodiment is not limited thereto. Alternatively, as the memory element 100 having the structure of FIG. 6A, any of (Structure 2 of Memory Element) to (Structure 8 of Memory Element) described in Embodiment 2 to Embodiment 8 can be applied. A driving method in this case can be similar to that in the case of the timing chart of FIG. 7.

In addition, the structures illustrated in FIGS. 6A and 6B each illustrate an example including the switch 1010, but this embodiment is not limited thereto. For example, in the case where the sense amplifier 1451 selectively outputs a signal in accordance with the control signal, the switch 1010 may be omitted. Further, FIGS. 6A and 6B each illustrate the structure in which the output of the volatile memory circuit 1111 is input to the memory element 100, but this embodiment is not limited thereto. The data (Data 0) input to the volatile memory circuit 1111 may also be input to the terminal D of the memory element 100.

This embodiment can be implemented combining with another embodiment as appropriate.

(Embodiment 10)

A method for manufacturing a memory element 100 will be described. The case where a transistor whose channel is formed in silicon is used for the transistor 102*a* and the transistor 102*b* is described as an example. Hereinafter, a transistor 102*a* or a transistor 102*b* is referred to as a transistor 102. In addition, a transistor 101*a* or a transistor 101*b* is referred to as a transistor 101. A capacitor 103*a* or a capacitor 103*b* is referred to as a capacitor 103. This embodiment describes a method for manufacturing the memory circuit 100 using, for example, the transistor 102, the transistor 101 whose channel is formed in an oxide semiconductor layer, and the capacitor 103.

Note that another transistor and another capacitor can be manufactured in the same manner.

Figure 19A:
FIGS. 19A to 19D illustrate manufacturing steps of a memory element.

First, as illustrated in FIG. 19A, an insulating film 701 and a semiconductor film 702 that has been separated from a single crystal semiconductor substrate are formed over a substrate 700.

Although there is no particular limitation on a material which can be used as the substrate 700, the material needs to have at least heat resistance high enough to withstand the subsequent heat treatment. For example, a glass substrate formed by a fusion process or a float process, a quartz substrate, a semiconductor substrate, a ceramic substrate, or the like can be used as the substrate 700. In the case where the temperature for the subsequent heat treatment is high, a glass substrate whose strain point is higher than or equal to 730° C. is preferably used as the glass substrate.

In this embodiment, a method for forming the transistor 102 in which the semiconductor film 702 is formed using single crystal silicon is described below. Note that a specific example of a method for forming the single crystal semiconductor film 702 is briefly described. First, an ion beam including ions which are accelerated by an electric field enters a bond substrate which is the single crystal semiconductor substrate and an embrittlement layer which is made fragile by local disorder of the crystal structure is formed in a region at a certain depth from a surface of the bond substrate. The depth at which the embrittlement layer is formed can be adjusted by the acceleration energy of the ion beam and the angle at which the ion beam enters. Then, the bond substrate and the substrate 700 which is provided with the insulating film 701 are attached to each other so that the insulating film 701 is provided therebetween. After the bond substrate and the substrate 700 overlap with each other, a pressure of approximately 1 N/cm² to 500 N/cm², preferably 11 N/cm² to 20 N/cm² is applied to part of the bond substrate and part of the substrate 700. When the pressure is applied, bonding between the bond substrate and the insulating film 701 starts from the parts, which results in bonding of the entire surface where the bond substrate and the insulating film 701 are in close contact with each other. Subsequently, heat treatment is performed, so that microvoids that exist in the embrittlement layer are combined and the microvoids increase in volume. Consequently, a single crystal semiconductor film which is part of the bond substrate is separated from the bond substrate along the embrittlement layer. The heat treatment is performed at a temperature not exceeding the strain point of the substrate 700. Then, the single crystal semiconductor film is processed into a desired shape by etching or the like to form the semiconductor film 702.

In order to control a threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not etched into a predetermined shape or may be added to the semiconductor film 702 which has been etched into a predetermined shape. Alternatively, the impurity element for controlling the threshold voltage may be added to the bond substrate. Alternatively, the impurity element may be added to the bond substrate in order to roughly control the threshold voltage, and then the impurity element may be added to the semiconductor film which is not etched into a predetermined shape or the semiconductor film 702 which has been etched into a predetermined shape in order to finely control the threshold voltage.

Although this embodiment describes the case where a single crystal semiconductor film is used, the present invention is not limited thereto. For example, a polycrystalline, microcrystalline, or amorphous semiconductor film which is formed over the insulating film 701 by a vapor deposition method may be used. Alternatively, the semiconductor film may be crystallized by a known technique. Examples of known crystallization technique include laser crystallization using a laser beam, and crystallization with a catalytic element. Alternatively, crystallization with a catalytic element and laser crystallization may be combined. When a heat-resistant substrate such as a quartz substrate is used, crystallization combined with thermal crystallization with an electrically heated oven, lamp heating crystallization with infrared light, crystallization with a catalytic element, or high-temperature heating at approximately 950° C., may be used.

Figure 19B:
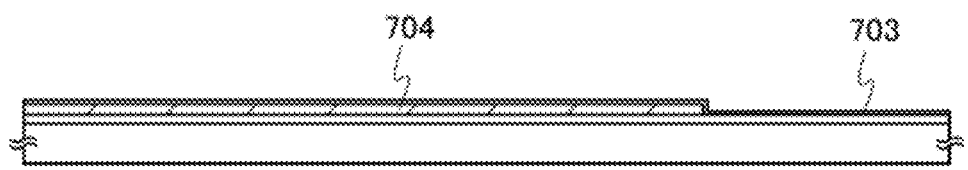

Next, as illustrated in FIG. 19B, the semiconductor film 702 is processed into a predetermined shaped, so that a semiconductor layer 704 is formed. Then, a gate insulating film 703 is formed over the semiconductor layer 704.

The gate insulating film 703 can be a single layer or a stack of layers containing silicon oxide, silicon nitride oxide, silicon oxynitride, silicon nitride, hafnium oxide, aluminum oxide, tantalum oxide, yttrium oxide, hafnium silicate (HfSi$_x$O$_y$, (x>0, y>0)), hafnium silicate (HfSi$_x$O$_y$N$_z$(x>0, y>0, z>0)) to which nitrogen is added, hafnium aluminate (HfAl$_x$O$_y$N$_z$, (x>0, y>0, z>0)) to which nitrogen is added, or the like by, for example, a plasma CVD method or a sputtering method.

Note that, in this specification, an oxynitride refers to a material containing a larger amount of oxygen than that of nitrogen, and a nitride oxide compound refers to a material containing a larger amount of nitrogen than that of oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is used as the gate insulating film 703 by plasma CVD.

Figure 19C:

Then, a gate electrode 707 is formed as illustrated in FIG. 19C.

To form the gate electrode 707, a conductive film is formed and then is processed into a predetermined shape. The conductive film can be formed by a CVD method, a sputtering method, a vapor deposition method, a spin coating method, or the like. The conductive film is formed using tantalum (Ta), tungsten (W), titanium (Ti), molybdenum (Mo), aluminum (Al), copper (Cu), chromium (Cr), niobium (Nb), or the like. Alternatively, the conductive film may be formed using an alloy mainly containing any of these metals, or a compound containing any of these metals. Alternatively, the conductive film may be formed using a semiconductor such as polycrystalline silicon doped with an impurity element such as phosphorus which imparts conductivity to the semiconductor film.

Although the gate electrode 707 is formed using a single-layer conductive film in this embodiment, this embodiment is not limited to this structure. The gate electrode 707 may be a stack of a plurality of conductive films.

An example of the combination of two conductive films is a stack of a tantalum nitride or tantalum layer overlaid by a tungsten layer. Other examples of the combination include the combination of tungsten nitride and tungsten, the combination of molybdenum nitride and molybdenum, the combination of aluminum and tantalum, and the combination of aluminum and titanium. Since tungsten and tantalum nitride have high heat resistance, heat treatment aimed at thermal activation can be performed in the subsequent steps after forming the two conductive films. Other examples of the combination of the two conductive films include the combination of nickel silicide and silicon doped with an impurity element imparting n-type conductivity, and the combination of tungsten silicide and silicon doped with an impurity element imparting n-type conductivity.

In the case where a stack of three conductive films is used, the stack is preferably formed with a molybdenum film, an aluminum film, and a molybdenum film.

The gate electrode 707 can be a light-transmitting oxide conductive film of indium oxide, indium oxide-tin oxide, indium oxide-zinc oxide, zinc oxide, zinc aluminum oxide, zinc aluminum oxynitride, zinc gallium oxide, or the like.

Alternatively, the gate electrode 707 may be selectively formed by a droplet discharge method without a mask. A droplet discharge method refers to a method for forming a predetermined pattern by discharge or ejection of a droplet containing a predetermined composition from an orifice, and includes an inkjet method in its category.

In addition, the gate electrode 707 may be formed through the following process: a conductive film is formed and then is etched by an inductively coupled plasma (ICP) etching method under appropriately controlled conditions (e.g., the amount of electric power applied to a coiled electrode layer, the amount of electric power applied to an electrode layer on the substrate side, and the electrode temperature on the substrate side) to be tapered in a desired shape. The taper angle and the like can be adjusted also by the shape of a mask. Note that the etching gas can be, as appropriate, a chlorine-based gas such as chlorine, boron chloride, silicon chloride, or carbon tetrachloride; a fluorine-based gas such as carbon tetrafluoride, sulfur fluoride, or nitrogen fluoride; or oxygen.

Figure 19D:
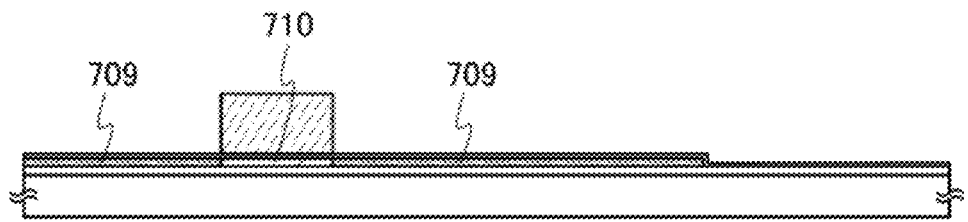

Next, as illustrated in FIG. 19D, by adding an impurity element imparting one conductivity type to the semiconductor layer 704 with the gate electrode 707 used as a mask, a channel formation region 710 overlapping with the gate electrode 707, and a pair of impurity regions 709 between which the channel formation region 710 is provided are formed in the semiconductor layer 704.

This embodiment takes the case where an impurity element imparting p-type conductivity (e.g., boron) is added to the semiconductor layer 704, as an example.

Figure 20A:
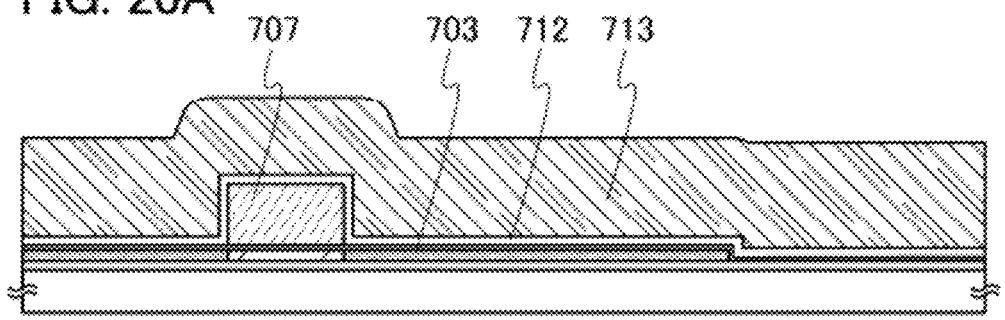
FIGS. 20A to 20C illustrate manufacturing steps of a memory element.

Next, as illustrated in FIG. 20A, insulating films 712 and 713 are formed so as to cover the gate insulating film 703 and the gate electrode 707. Specifically, an inorganic insulating film of silicon oxide, silicon nitride, silicon nitride oxide, silicon oxynitride, aluminum nitride, aluminum nitride oxide, or the like can be used as the insulating films 712 and 713. The insulating films 712 and 713 are preferably formed using a low dielectric constant (low-k) material to sufficiently reduce capacitance due to overlapping electrodes or wires. Note that a porous insulating film containing such a material may be used as the insulating films 712 and 713. Because the porous insulating film has lower dielectric constant than a dense insulating layer, parasitic capacitance due to electrodes or wires can be further reduced.

This embodiment describes the case where silicon oxynitride is used for the insulating film 712 and silicon nitride oxide is used for the insulating film 713, as an example. Although this embodiment describes the case where the insulating films 712 and 713 are formed over the gate electrode 707 as an example, in one embodiment of the present invention, either a single insulating film or a stack of three or more insulating films may be formed over the gate electrode 707.

Figure 20B:
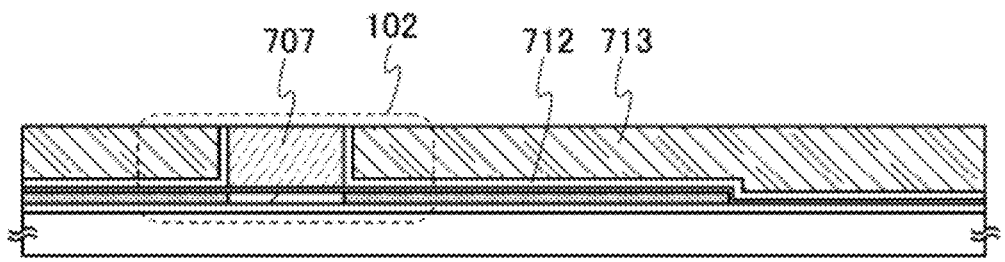

Next, as illustrated in FIG. 20B, the insulating films 712 and 713 are subjected to CMP (chemical mechanical polishing) treatment or etching, so that a surface of the gate electrode 707 is exposed. Note that in order to improve the characteristics of the transistor 101 which is formed later, surfaces of the insulating films 712 and 713 are preferably flattened as much as possible.

The transistor 102 can be formed by the above process.

Figure 20C:
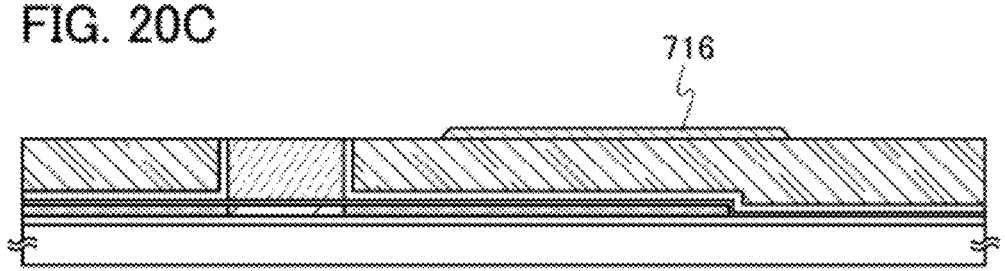

Next, a method for manufacturing the transistor 101 is described. First, as illustrated in FIG. 20C, an oxide semiconductor layer 716 is formed over the insulating film 712 or the insulating film 713.

The oxide semiconductor layer 716 can be formed by processing an oxide semiconductor film formed over the insulating film 712 the insulating film 713 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is deposited by a sputtering method using an oxide semiconductor as a target. The oxide semiconductor film can be formed by a sputtering method in a rare gas (e.g., argon) atmosphere, an oxygen atmosphere, or a mixed atmosphere of a rare gas (e.g., argon) and oxygen.

Note that before the oxide semiconductor film is deposited by a sputtering method, dust attached to the surfaces of the insulating films 712 and 713 is preferably removed by reverse sputtering in which an argon gas is introduced and plasma is generated. The reverse sputtering refers to a method in which a voltage is applied to a substrate by using an RF power source in an argon atmosphere to generate plasma in the vicinity of the substrate to modify a surface without application of voltage to a target. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

The oxide semiconductor layer preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. In addition, any of the above oxide semiconductors may contain an element other than In, Ga, Sn, and Zn, for example, $SiO_2$.

Note that here, for example, an In—Ga—Zn-based oxide means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. For example, M can be Ga, Ga and Al, Ga and Mn, Ga and Co, or the like. Alternatively, as the oxide semiconductor, a material expressed by a chemical formula, $In_3SnO_5(ZnO)_n$ (n>0, n is an integer) may be used.

For example, an In—Ga—Zn-based oxide with an atomic ratio of In:Ga: Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

The oxide semiconductor may be either single crystal or non-single-crystal.

In the case where the oxide semiconductor is non-single-crystal, the oxide semiconductor may be either amorphous or polycrystalline. Further, the oxide semiconductor may have either an amorphous structure including a portion having crystallinity or a non-amorphous structure.

In the case where an In—Zn—O-based material is used as the oxide semiconductor, a target used has a composition ratio of In:Zn=50:1 to 1:2 in an atomic ratio ($In_2O_3$: ZnO=25:1 to 1:4 in a molar ratio), preferably In:Zn=20:1 to 1:1 in an atomic ratio ($In_2O_3$:ZnO=1:2 to 10:1 in a molar ratio), more preferably In:Zn=1.5:1 to 15:1 in an atomic ratio ($In_2O_3$:ZnO=3:4 to 15:2 in a molar ratio). For example, in a target used for formation of an In—Zn—O-based oxide semiconductor which has an atomic ratio of In:Zn:O=X: Y:Z, the relation of Z>1.5X+Y is satisfied.

In this embodiment, as the oxide semiconductor film, an In—Ga—Zn—O-based oxide semiconductor thin film with a thickness of 30 nm, which is obtained by a sputtering method using a target containing indium (In), gallium (Ga), and zinc (Zn), is used. The target has a composition ratio, for example, of In:Ga:Zn=1:1:0.5, In:Ga:Zn=1:1:1, or In:Ga: Zn=1:1:2. The filling rate of the target containing In, Ga, and Zn is higher than or equal to 90% and lower than or equal to 100%, preferably higher than or equal to 95% and lower than 100%. The target with high filling rate enables the deposited oxide semiconductor film to be dense.

In this embodiment, the oxide semiconductor film is formed in such a manner that the substrate is held in a treatment chamber kept at reduced pressure, a sputtering gas from which hydrogen and moisture are removed is introduced into the treatment chamber while remaining moisture therein is removed, and the above target is used. The substrate temperature may be higher than or equal to 100° C. and lower than or equal to 600° C., preferably higher than or equal to 200° C. and lower than or equal to 400° C. for the deposition. By depositing the oxide semiconductor film while heating the substrate, the concentration of impurities contained in the deposited oxide semiconductor film can be reduced. In addition, damage by sputtering can be reduced. In order to remove residual moisture in the treatment chamber, an entrapment vacuum pump is preferably used. A cryopump, an ion pump, or a titanium sublimation pump, for example, is preferably used. The evacuation unit may be a turbo pump provided with a cold trap. In the treatment chamber which is evacuated with the cryopump, for example, a hydrogen atom, a compound containing a hydrogen atom, such as water ($H_2O$), (preferably, also a compound containing a carbon atom), and the like are removed, so that the concentration of impurities contained in the oxide semiconductor film deposited in the treatment chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power supply is preferable because dust generated in deposition can be reduced and the film thickness can be made uniform.

Moreover, when the leakage rate of the treatment chamber of the sputtering apparatus is set to lower than or equal to $1\times10^{-10}$ Pa·m³/second, the entry of impurities such as an alkali metal or hydride into the oxide semiconductor film that is being formed by a sputtering method can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

Note that in order that hydrogen, a hydroxyl group, and moisture be contained in the oxide semiconductor film as little as possible, it is preferable that an impurity such as hydrogen or moisture that is adsorbed on the substrate 700 be eliminated and exhausted by preheating of the substrate 700 over which the insulating films 712 and 713 are formed in a preheating chamber of a sputtering apparatus, as pretreatment for deposition. The temperature for the preheating is higher than or equal to 100° C. and lower than or equal to 400° C., preferably higher than or equal to 150° C. and lower than or equal to 300° C. As an evacuation means, a cryopump is preferably provided in the preheating chamber. Note that this preheating treatment can be omitted. This preheating may be similarly performed on the substrate 700 over which conductive films 719 and 720 are formed before the deposition of a gate insulating film 721.

Note that etching for forming the oxide semiconductor layer 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor layer 716 may be formed by an inkjet method. Formation of the resist mask by an inkjet method needs no photomask; thus, manufacturing cost can be reduced.

Note that it is preferable that reverse sputtering is performed before the formation of a conductive film in a subsequent step so that a resist residue and the like that attach onto surfaces of the oxide semiconductor layer 716 and the insulating films 712 and 713 are removed.

Note that the oxide semiconductor film deposited by sputtering or the like contains a large amount of moisture or hydrogen (including a hydroxyl group) as an impurity in some cases. Moisture or hydrogen easily forms donor levels and thus serves as an impurity in the oxide semiconductor. In one embodiment of the present invention, in order to reduce impurities such as moisture or hydrogen in the oxide semiconductor film (dehydration or dehydrogenation), the oxide semiconductor layer 716 is preferably subjected to heat treatment in a reduced pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

By subjection the island-shaped oxide semiconductor layer 716 to heat treatment, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes. When RTA is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like are not contained in nitrogen or a rare gas such as helium, neon, or argon. Alternatively, the purity of nitrogen or a rare gas such as helium, neon, or argon which is introduced into the heat treatment apparatus is preferably greater than or equal to 6N (99.9999%), more preferably greater than or equal to 7N (99.99999%) (i.e., the impurity concentration is less than or equal to 1 ppm, preferably less than or equal to 0.1 ppm).

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI (SOLID STATE PHYSICS)*, 2009, Vol. 44, pp. 621-633). But such consideration is not appropriate. Alkali metal is not an element included in an oxide semiconductor, and therefore, is an impurity. Also, alkaline earth metal is impurity in the case where alkaline earth metal is not included in an oxide semiconductor. Alkali metal, in particular, Na becomes $Na^+$ when an insulating film in contact with the oxide semiconductor layer is an oxide and Na diffuses into the insulating layer. In addition, in the oxide semiconductor layer, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor layer is very low. Therefore, when the hydrogen concentration in the oxide semiconductor layer is less than or equal to $1 \times 10^{18}/cm^3$, preferably less than or equal to $1 \times 10^{17}/cm^3$, the concentration of the above impurity is preferably reduced. Specifically, a measurement value of a Na concentration by secondary ion mass spectrometry is preferably less than or equal to $5 \times 10^{16}/cm^3$, more preferably less than or equal to $1 \times 10^{16}/cm^3$, still more preferably less than or equal to $1 \times 10^{15}/cm^3$. In a similar manner, a measurement value of a Li concentration is preferably less than or equal to $5\times10^{15}/cm^3$, more preferably less than or equal to $1\times10^{15}/cm^3$. In a similar manner, a measurement value of a K concentration is preferably less than or equal to $5\times10^{15}/cm^3$, more preferably less than or equal to $1\times10^{15}/cm^3$.

Through the above steps, the concentration of hydrogen in the oxide semiconductor layer 716 can be reduced and the oxide semiconductor layer can be highly purified. Thus, the oxide semiconductor layer can be stabilized. In addition, the heat treatment at a temperature of lower than or equal to the glass transition temperature makes it possible to form an oxide semiconductor layer with a wide bandgap and a very low carrier density due to hydrogen. Therefore, the transistor can be manufactured using a large-sized substrate, so that the productivity can be increased. In addition, with the purified oxide semiconductor layer in which the hydrogen concentration is reduced, a transistor with high withstand voltage and a very low off-state current can be manufactured. The above heat treatment can be performed at any time after the oxide semiconductor layer is formed.

Note that the oxide semiconductor layer may be either amorphous or crystalline. The crystalline oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal direction (vector) of the surface where the CAAC-OS film is formed or a normal direction (vector) of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

An example of a crystal structure of the CAAC-OS film will be described in detail with reference to FIGS. 26A to 26E, FIGS. 27A to 27C, and FIGS. 28A to 28C. In FIGS. 26A to 26E, FIGS. 27A to 27C, and FIGS. 28A to 28C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 26A:
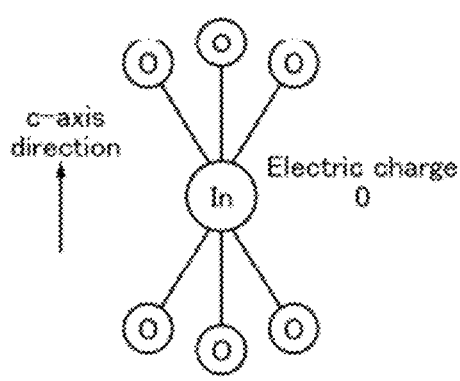
FIGS. 26A to 26E each illustrate the crystal structure of an oxide material.

FIG. 26A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 26A is actually an octahedral structure, but is illustrated as a planar structure for simplicity. Note that three tetracoordinate O atoms exist in each of an upper half and a lower half in FIG. 26A. In the small group illustrated in FIG. 26A, electric charge is 0.

Figure 26D:
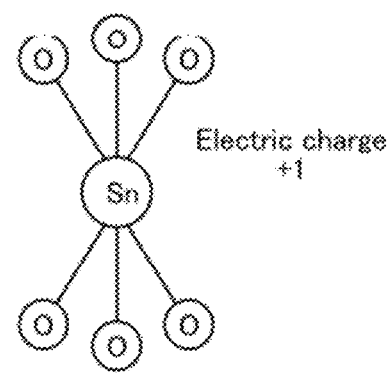
Figure 26B:
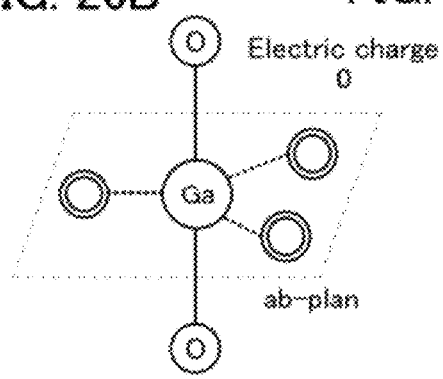

FIG. 26B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 26B. An In atom can also have the structure illustrated in FIG. 26B because an In atom can have five ligands. In the small group illustrated in FIG. 26B, electric charge is 0.

Figure 26E:
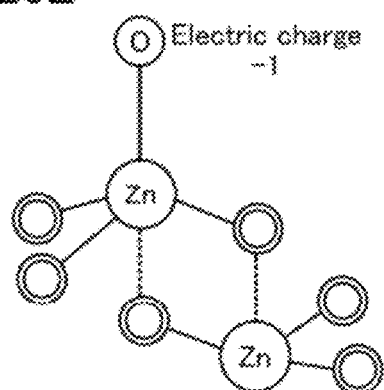
Figure 26C:
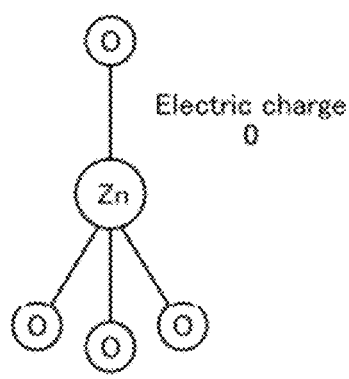

FIG. 26C illustrates a structure including one tetracoordinate Zn atom and four tetracoordinate O atoms proximate to the Zn atom. In FIG. 26C, one tetracoordinate O atom exists in an upper half and three tetracoordinate O atoms exist in a lower half. In the small group illustrated in FIG. 26C, electric charge is 0.

FIG. 26D illustrates a structure including one hexacoordinate Sn atom and six tetracoordinate O atoms proximate to the Sn atom. In FIG. 26D, three tetracoordinate O atoms exist in each of an upper half and a lower half. In the small group illustrated in FIG. 26D, electric charge is +1.

FIG. 26E illustrates a small group including two Zn atoms. In FIG. 26E, one tetracoordinate O atom exists in each of an upper half and a lower half. In the small group illustrated in FIG. 26E, electric charge is −1.

Here, a plurality of small groups form a medium group, and a plurality of medium groups form a large group (also referred to as a unit cell).

Now, a rule of bonding between the small groups is described. The three O atoms in the upper half with respect to the hexacoordinate In atom each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason is described below. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 27A illustrates a model of a medium group included in a layered structure of an In—Sn—Zn—O-based material. FIG. 27B illustrates a large group including three medium groups. Note that FIG. 27C illustrates an atomic arrangement in the case where the layered structure in FIG. 27B is observed from the c-axis direction.

In FIG. 27A, for simplicity, a tricoordinate O atom is omitted and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 27A, one tetracoordinate O atom existing in each of an upper half and a lower half with respect to an In atom is denoted by circled 1. In a similar manner, FIG. 27A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 27A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 26E can be given. For example, with one small group including two Zn atoms, electric charge of one small group including a Sn atom can be cancelled, so that the total electric charge of the layered structure can be 0.

When the large group illustrated in FIG. 27B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number). As larger m is, the crystallinity of the In—Sn—Zn—O-based crystal is improved, which is preferable.

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 28A:
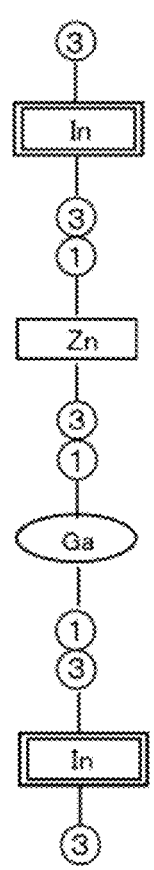
FIGS. 28A to 28C illustrate the crystal structure of an oxide material.

For example, FIG. 28A illustrates a model of a medium group included in a layered structure of an In—Ga—Zn—O-based material.

In the medium group included in the layered structure of the In—Ga—Zn—O-based material in FIG. 28A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 28B:
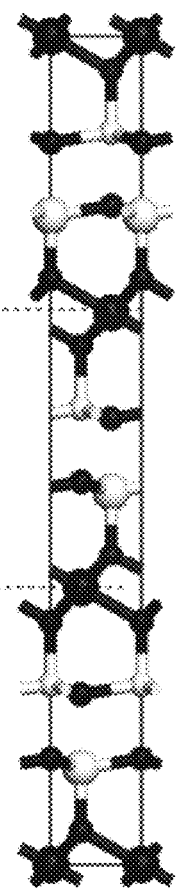
Figure 28C:
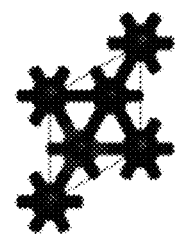

FIG. 28B illustrates a large group including three medium groups. Note that FIG. 28C illustrates an atomic arrangement in the case where the layered structure in FIG. 28B is observed from the c-axis direction.

Here, since electric charge of a (hexacoordinate or pentacoordinate) In atom, electric charge of a (tetracoordinate)

Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 28A but also a medium group in which the arrangement of the In atom, the Ga atom, and the Zn atom is different from that in FIG. 28A.

In the CAAC-OS film, metal atoms and oxygen atoms are bonded in an orderly manner in comparison with an amorphous oxide semiconductor. That is to say, the number of oxygen atoms coordinating to each metal atom may vary when the oxide semiconductor film is amorphous, but in a CAAC-OS film, there are few variations in the number of oxygen atoms coordinating to each metal. Therefore, microscopic defects of oxygen can be reduced and instability and moving of charge that are due to attachment and detachment of hydrogen atoms (including hydrogen ions) or alkali metal atoms can be reduced.

For this reason, a transistor is formed using a CAAC-OS film, so that the amount of shift of the threshold voltage of the transistor, which occurs after light irradiation and a bias-temperature (BT) stress test are performed on the transistor, can be reduced. Consequently, a transistor having stable electric characteristics can be formed.

Figure 21A:
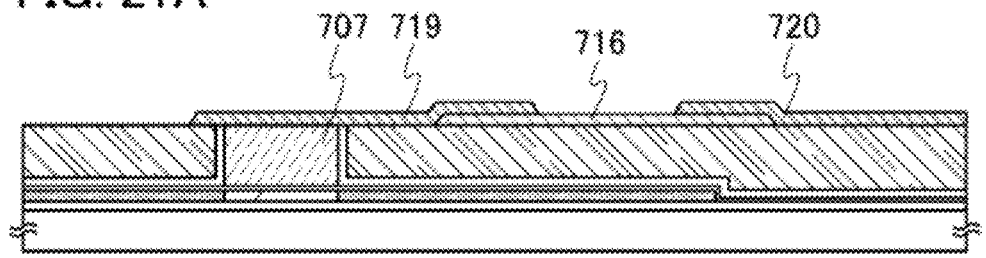
FIGS. 21A to 21C illustrate manufacturing steps of a memory element.

Then, as illustrated in FIG. 21A, the conductive film 719 which is in contact with the gate electrode 707 and the oxide semiconductor layer 716, and the conductive film 720 which is in contact with the oxide semiconductor layer 716 are formed. The conductive films 719 and 720 function as a source and drain electrodes.

Specifically, the conductive films 719 and 720 can be formed in such a manner that a conductive film is formed so as to cover the gate electrode 707 by a sputtering method or a vacuum vapor deposition method and then is processed into a predetermined shape.

As the conductive film which serves as the conductive films 719 and 720, any of the following materials can be used: an element selected from aluminum, chromium, copper, tantalum, titanium, molybdenum, or tungsten; an alloy including any of these elements; an alloy film containing the above elements in combination; and the like. Alternatively, a structure may be employed in which a film of a refractory metal such as chromium, tantalum, titanium, molybdenum, or tungsten is stacked over or below a metal film of aluminum or copper. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive films 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesiveness with an oxide film. Therefore, for the conductive films 719 and 720, a layered structure is employed in which a conductive film containing a Cu—Mg—Al alloy, a Mo—Ti alloy, Ti, or Mo is used for the lower layer and a conductive film containing Cu is used for the upper layer; thus, the adhesiveness between an insulating film which is an oxide film and the conductive films 719 and 720 can be increased.

For the conductive film which serves as the conductive films 719 and 720, a conductive metal oxide may be used. As the conductive metal oxide, indium oxide, tin oxide, zinc oxide, indium oxide-tin oxide, indium oxide-zinc oxide, or the conductive metal oxide material containing silicon or silicon oxide can be used.

In the case where heat treatment is performed after formation of the conductive film, the conductive film preferably has heat resistance enough to withstand the heat treatment.

Note that each material and etching conditions are adjusted as appropriate so that the oxide semiconductor layer 716 is not removed as much as possible at the time of etching the conductive film. Depending on the etching conditions, an exposed portion of the oxide semiconductor layer 716 is partly etched, so that a groove (a depression portion) is formed in some cases.

In this embodiment, a titanium film is used for the conductive film. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed of a multi-tone mask which is a light-exposure mask through which light is transmitted so as to have a plurality of intensities. A resist mask formed of a multi-tone mask has a plurality of thicknesses and can be changed in shape by etching; thus, the resist mask can be used in a plurality of etching processes for processing films into different patterns. Therefore, a resist mask corresponding to at least two kinds or more of different patterns can be formed by one multi-tone mask. Thus, the number of light-exposure masks can be reduced and the number of corresponding photolithography steps can be also reduced, so that simplification of a process can be realized.

Further, an oxide conductive film functioning as a source region and a drain region may be provided between the oxide semiconductor layer 716 and the conductive films 719 and 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, etching for forming the oxide conductive film and etching for forming the conductive films 719 and 720 may be performed concurrently.

With provision of the oxide conductive film functioning as a source region and a drain region, resistance between the oxide semiconductor layer 716 and the conductive films 719 and 720 can be lowered, so that the transistor can operate at high speed. In addition, with provision of the oxide conductive film functioning as a source region and a drain region, the withstand voltage of the transistor can be increased.

Next, plasma treatment may be performed using a gas such as $N_2O$, $N_2$, or Ar. By this plasma treatment, water or the like adhering to an exposed surface of the oxide semiconductor layer is removed. Plasma treatment may be performed using a mixture gas of oxygen and argon as well.

Figure 21B:
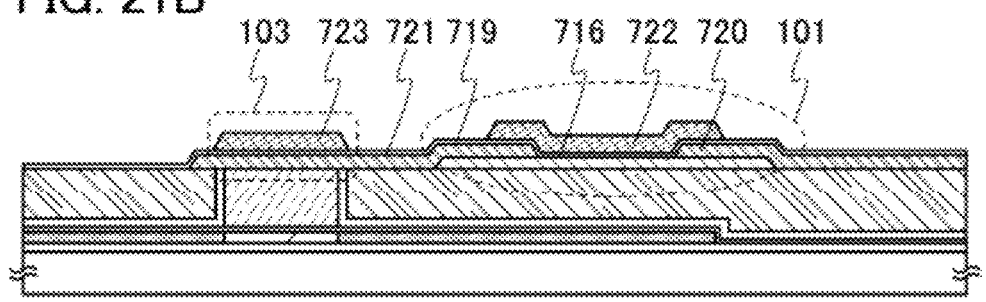

After the plasma treatment, as illustrated in FIG. 21B, the gate insulating film 721 is formed so as to cover the conductive films 719 and 720 and the oxide semiconductor layer 716. Then, a gate electrode 722 is formed over the gate insulating film 721 so as to overlap with the oxide semiconductor layer 716, and a conductive film 723 is formed over the conductive film 716 so as to overlap with the conductive film 719.

The gate insulating film 721 can be formed using a material and a layered structure which are similar to those of the gate insulating film 703. Note that the gate insulating film 721 preferably includes impurities such as moisture or hydrogen as little as possible, and the gate insulating film 721 may be formed with a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, so that the oxide semiconductor layer 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen such as a silicon oxide film or a silicon oxynitride film is formed on a side which is closer to the oxide semiconductor layer 716 than the insulating film having a high barrier property. Then, the insulating film having a high barrier property is formed so as to overlap with the conductive films 719 and 720 and the oxide semiconductor layer 716 with the insulating film having low proportion of nitrogen sandwiched therebetween. When the insulating film having a high barrier property is used, impurities such as moisture or hydrogen can be prevented from entering the oxide semiconductor layer 716, the gate insulating film 721, or the interface between the oxide semiconductor layer 716 and another insulating film and the vicinity thereof. In addition, the insulating film having low proportion of nitrogen, such as a silicon oxide film or a silicon oxynitride film, is formed so as to be in contact with the oxide semiconductor layer 716, so that the insulating film having a high barrier property can be prevented from being in direct contact with the oxide semiconductor layer 716.

In this embodiment, the gate insulating film 721 with a structure in which a silicon nitride film with a thickness of 100 nm formed by a sputtering method is stacked over a silicon oxide film with a thickness of 200 nm formed by a sputtering method is formed. The substrate temperature at deposition may be higher than or equal to room temperature and lower than or equal to 300° C. and in this embodiment, is 100° C.

After the gate insulating film 721 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the water content in the gas is 20 ppm or less, preferably 1 ppm or less, further preferably 10 ppb or less. In this embodiment, for example, heat treatment is performed at 250° C. in a nitrogen atmosphere for one hour. Alternatively, RTA treatment for a short time at a high temperature may be performed before the formation of the conductive films 719 and 720 in a manner similar to that of the heat treatment performed on the oxide semiconductor film for reduction of moisture or hydrogen. Even when oxygen defects are generated in the oxide semiconductor layer 716 by the heat treatment performed on the oxide semiconductor layer 716 by performing heat treatment after provision of the gate insulating film 721 containing oxygen, oxygen is supplied to the oxide semiconductor layer 716 from the gate insulating film 721. By the supply of oxygen to the oxide semiconductor layer 716, oxygen defects that serve as donors can be reduced in the oxide semiconductor layer 716 and the stoichiometric composition can be satisfied. The oxide semiconductor layer 716 preferably contains oxygen whose composition exceeds the stoichiometric composition. As a result, the oxide semiconductor layer 716 can be substantially intrinsic and variation in electrical characteristics of the transistor due to oxygen defects can be reduced; thus, electrical characteristics can be improved. The timing of this heat treatment is not particularly limited as long as it is after the formation of the gate insulating film 721. When this heat treatment serves as heat treatment in another step (e.g., heat treatment at the time of formation of a resin film or heat treatment for lowering the resistance of a transparent conductive film), the oxide semiconductor layer 716 can be made to be substantially intrinsic without the increase in the number of steps.

Alternatively, the oxygen defects that serve as donors in the oxide semiconductor layer 716 may be reduced by subjecting the oxide semiconductor layer 716 to heat treatment in an oxygen atmosphere so that oxygen is added to the oxide semiconductor. The heat treatment is performed, for example, at a temperature higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor layer 716 by an ion implantation method, an ion doping method, or the like so that oxygen defects that serve as donors are reduced. For example, oxygen made to be plasma with a microwave of 2.45 GHz may be added to the oxide semiconductor layer 716.

The gate electrode 722 and the conductive film 723 can be formed in such a manner that a conductive film is formed over the gate insulating film 721 and then is etched. The gate electrode 722 and the conductive film 723 can be formed using the same material as that of the gate electrode 707 and the conductive films 719 and 720.

The thickness of each of the gate electrode 722 and the conductive film 723 is 10 nm to 400 nm, preferably 100 nm to 200 nm. In this embodiment, after a conductive film with a thickness of 150 nm for the gate electrode is formed by a sputtering method using a tungsten target, the conductive film is processed into a desired shape by etching, so that the gate electrode 722 and the conductive film 723 are formed. Note that a resist mask may be formed by an inkjet method.

Formation of the resist mask by an inkjet method needs no photomask; thus, manufacturing cost can be reduced.

Through the above steps, the transistor 101 is formed.

Note that as the transistor 101, without limitation to a transistor including an oxide semiconductor layer in which a channel is formed, a transistor including, in a channel formation region, a semiconductor material whose bandgap is wider than silicon and whose intrinsic carrier density is lower than silicon can also be used. As such a semiconductor material, besides an oxide semiconductor, silicon carbide, gallium nitride, and the like can be given. With a channel formation region including such a semiconductor material, a transistor with an extremely low off-state current can be achieved.

Note that a portion where the conductive film 719 and the conductive film 723 overlap with each other with the gate insulating film 721 provided therebetween corresponds to the capacitor 103.

Although the transistor 101 is described as a single-gate transistor, a multi-gate transistor including a plurality of channel formation regions can be formed when a plurality of gate electrodes which are electrically connected are included when needed.

Note that an insulating film which is in contact with the oxide semiconductor layer 716 (in this embodiment, corresponding to the gate insulating film 721) may be formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing a Group 13 element for the insulating film in contact with the oxide semiconductor layer, an interface with the oxide semiconductor layer can keep a favorable state.

An insulating material containing a Group 13 element refers to an insulating material containing one or more elements that belong to Group 13. As the insulating material containing a Group 13 element, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor layer containing gallium, a material including gallium oxide may be used as an insulating film, so that favorable characteristics can be kept at the interface between the oxide semiconductor layer and the insulating film. When the oxide semiconductor layer and the insulating film containing gallium oxide are provided in contact with each other, pileup of hydrogen at the interface between the oxide semiconductor layer and the insulating film can be reduced, for example. Note that a similar effect can be obtained in the case where an element in the same group as a constituent element of the oxide semiconductor is used in an insulating film. For example, it is effective to form an insulating film with the use of a material including aluminum oxide. Note that aluminum oxide has a property of not easily transmitting water. Thus, it is preferable to use a material including aluminum oxide in terms of preventing entry of water to the oxide semiconductor layer.

The insulating film which is in contact with the oxide semiconductor layer 716 preferably contains oxygen in a proportion higher than that in the stoichiometric composition, by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by an ion implantation method or an ion doping method.

For example, in the case where the insulating film which is in contact with the oxide semiconductor layer 716 is formed using gallium oxide, the composition of gallium oxide can be set to be $Ga_2O_X$ ($X=3+\alpha$, $0<\alpha<1$) by heat treatment in an oxygen atmosphere or oxygen doping.

In the case where the insulating film which is in contact with the oxide semiconductor layer 716 is formed using aluminum oxide, the composition of aluminum oxide can be set to be $Al_2O_X$ ($X=3+\alpha$, $0<\alpha<1$) by heat treatment in an oxygen atmosphere or oxygen doping.

In the case where the insulating film which is in contact with the oxide semiconductor layer 716 is formed using gallium aluminum oxide (aluminum gallium oxide), the composition of gallium aluminum oxide (aluminum gallium oxide) can be set to be $Ga_XAl_{2-X}O_{3+a}$ ($0<X<2$, $0<a<1$) by heat treatment in an oxygen atmosphere or oxygen doping.

By oxygen doping, an insulating film which includes a region where the proportion of oxygen is higher than that in the stoichiometric composition can be formed. When the insulating film including such a region is in contact with the oxide semiconductor layer, oxygen that exists excessively in the insulating film is supplied to the oxide semiconductor layer, and oxygen deficiency in the oxide semiconductor layer or at the interface between the oxide semiconductor layer and the insulating film is reduced. Thus, the oxide semiconductor layer can be formed to an intrinsic or substantially intrinsic oxide semiconductor.

The insulating film including a region where the proportion of oxygen is higher than that in the stoichiometric composition may be applied to either the insulating film placed on an upper side of the oxide semiconductor layer or the insulating film placed on a lower side of the oxide semiconductor layer of the insulating films which are in contact with the oxide semiconductor layer 716; however, it is preferable to apply such an insulating film to both the insulating films which are in contact with the oxide semiconductor layer 716. The above effect can be enhanced with a structure where the oxide semiconductor layer 716 is provided between the insulating films each including a region where the proportion of oxygen is higher than that in the stoichiometric composition, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent element or different constituent elements. For example, the insulating films on the upper side and the lower side may be both formed using gallium oxide whose composition is $Ga_2O_X$ ($X=3+\alpha$, $0<\alpha<1$). Alternatively, one of the insulating films on the upper side and the lower side may be formed using $Ga_2O_X$ ($X=3+\alpha$, $0<\alpha<1$) and the other may be formed using aluminum oxide whose composition is $Al_2O_X$ ($X=3+\alpha$, $0<\alpha<1$).

The insulating film which is in contact with the oxide semiconductor layer 716 may be formed with a stack of insulating films each including a region where the proportion of oxygen is higher than that in the stoichiometric composition. For example, the insulating film on the upper side of the oxide semiconductor layer 716 may be formed as follows: gallium oxide whose composition is $Ga_2O_X$ ($X=3+\alpha$, $0<\alpha<1$) is formed and gallium aluminum oxide (aluminum gallium oxide) whose composition is $Ga_XAl_{2-X}O_{3+\alpha}$ ($0<X<2$, $0<\alpha<1$) may be formed thereover. Note that the insulating film on the lower side of the oxide semiconductor layer 716 may be formed with a stack of insulating films each including a region where the proportion of oxygen is higher than that in the stoichiometric composition. Alternatively, both the insulating films on the upper side and the lower side of the oxide semiconductor layer 716 may be formed with a stack of insulating films each including a region where the proportion of oxygen is higher than that in the stoichiometric composition.

Figure 21C:
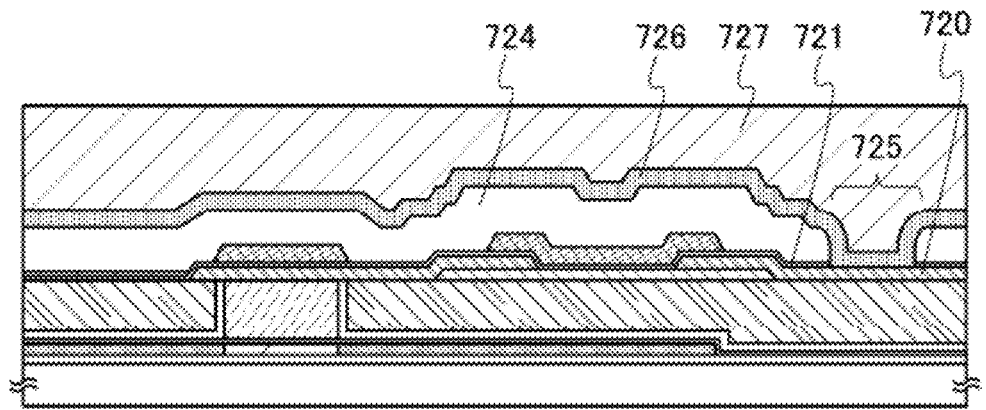

Next, as illustrated in FIG. 21C, an insulating film 724 is formed so as to cover the gate insulating film 721, the conductive film 723, and the gate electrode 722. The insulating film 724 can be formed by a PVD method, a CVD method, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

A conductive film is formed by a PVD method or a CVD method and then is etched, so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film (with a thickness of approximately 5 nm) is formed in a region including the opening of the insulating film 724 by a PVD method and then, an aluminum film is formed so as to be embedded in the opening 725. Here, the titanium film formed by a PVD method has a function of reducing an oxide film (e.g., a native oxide film) formed on a surface over which the titanium film is formed, to decrease the contact resistance with the lower electrode or the like (here, the conductive film 720). In addition, hillock of aluminum film can be prevented. A copper film may be formed by a plating method after the formation of the barrier film of titanium, titanium nitride, or the like.

Next, an insulating film 727 is formed so as to cover the wiring 726. Through the series of steps, the memory element 100 can be manufactured.

Note that in the manufacturing method, the conductive films 719 and 720 functioning as source and drain electrodes are formed after the formation of the oxide semiconductor layer 716. Thus, as illustrated in FIG. 21B, in the transistor 101 obtained by the manufacturing method, the conductive films 719 and 720 are formed over the oxide semiconductor layer 716. However, in the transistor 101, the conductive films functioning as source and drain electrodes may be formed below the oxide semiconductor layer 716, that is, between the oxide semiconductor layer 716 and the insulating films 712 and 713.

Figure 22:
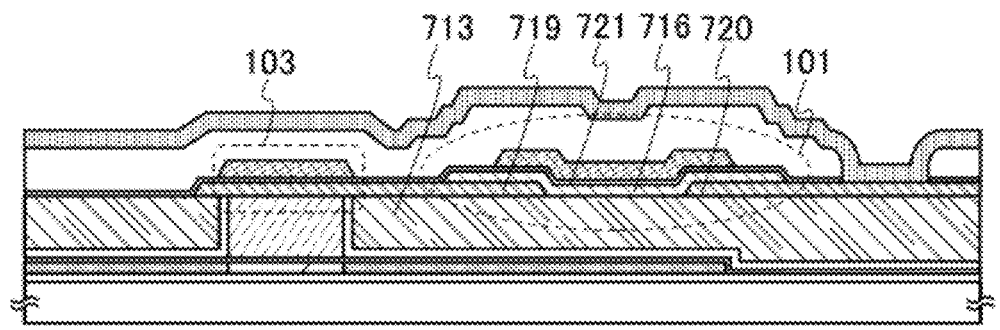
FIG. 22 is a cross-sectional view illustrating the structure of a memory element.

FIG. 22 illustrates a cross-sectional view of the transistor 101 at the time when the conductive films 719 and 720 functioning as source and drain electrodes are provided between the oxide semiconductor layer 716 and the insulating films 712 and 713. The transistor 101 illustrated in FIG. 22 can be obtained in such a manner that the conductive films 719 and 720 are formed after the formation of the insulating film 713, and then, the oxide semiconductor layer 716 is formed.

This embodiment can be implemented combining with another embodiment as appropriate.

(Embodiment 11)

This embodiment describes a transistor that includes an oxide semiconductor layer and has a different structure from the transistor according to Embodiment 10.

Figure 23A:
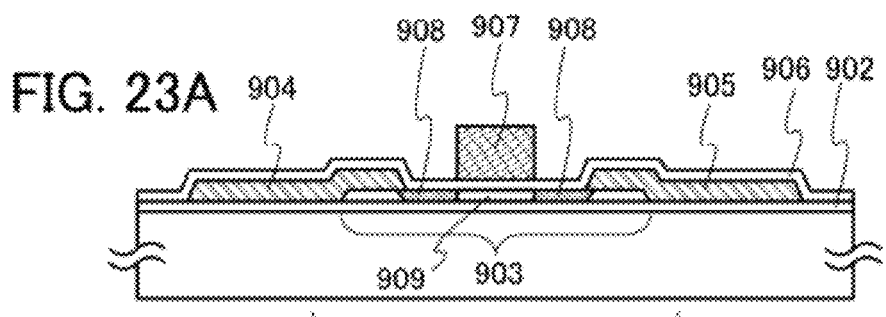
FIGS. 23A to 23D each illustrate the structure of a transistor including an oxide semiconductor layer in which a channel is formed.

A transistor 901 shown in FIG. 23A includes an oxide semiconductor layer 903 that serves as an active layer and is formed over an insulating film 902; a source electrode 904 and a drain electrode 905 formed over the oxide semiconductor layer 903; a gate insulating film 906 over the oxide semiconductor layer 903, the source electrode 904, and the drain electrode 905; and a gate electrode 907 that is over the gate insulating film 906 and overlaps with the oxide semiconductor layer 903.

The transistor 901 shown in FIG. 23A has a top-gate structure where the gate electrode 907 is formed over the oxide semiconductor layer 903 and has a top-contact structure where the source electrode 904 and the drain electrode 905 are formed over the oxide semiconductor layer 903. In the transistor 901, the source electrode 904 and the drain electrode 905 do not overlap with the gate electrode 907. In other words, there is a space, which is larger than the thickness of the gate insulating film 906, between the source electrode 904 and the gate electrode 907 and between the drain electrode 905 and the gate electrode 907. Thus, the transistor 901 has low parasitic capacitance between the source electrode 904 and the gate electrode 907 and between the drain electrode 905 and the gate electrode 907, thereby achieving high-speed operation.

The oxide semiconductor layer 903 includes a pair of heavily-doped regions 908 obtained by adding a dopant imparting n-type conductivity to the oxide semiconductor layer 903 after the gate electrode 907 is formed. A region of the oxide semiconductor layer 903 which overlaps with the gate electrode 907 with the gate insulating film 906 interposed therebetween is a channel formation region 909. In the oxide semiconductor layer 903, the channel formation region 909 is formed between the pair of heavily-doped regions 908. The dopant is added to the heavily-doped regions 908 by ion implantation. The dopant is, for example, a rare gas such as helium, argon, or xenon, or a group 15 element such as nitrogen, phosphorus, arsenic, or antimony.

For example, in the case where nitrogen is used as the dopant, the concentration of nitrogen atoms in the high-concentration regions 908 is preferably higher than or equal to $5\times10^{19}/cm^3$ and lower than or equal to $1\times10^{22}/cm^3$.

The high-concentration regions 908 to which the dopant imparting n-type conductivity is added have higher conductivity than the other regions in the oxide semiconductor layer 903. Therefore, by providing the high-concentration regions 908 in the oxide semiconductor layer 903, the resistance between the source electrode 904 and the drain electrode 905 can be decreased.

In the case where an In—Ga—Zn—O-based oxide semiconductor is used for the oxide semiconductor layer 903, heat treatment is performed at a temperature higher than or equal to 300° C. and lower than or equal to 600° C. for one hour after nitrogen is added. Consequently, the oxide semiconductor in the high-concentration regions 908 has a wurtzite crystal structure. Since the oxide semiconductor in the high-concentration regions 908 has a wurtzite crystal structure, the conductivity of the high-concentration regions 908 can be further increased and the resistance between the source electrode 904 and the drain electrode 905 can be decreased. Note that in order to effectively decrease the resistance between the source electrode 904 and the drain electrode 905 by forming an oxide semiconductor having a wurtzite crystal structure, in the case of using nitrogen as the dopant, the concentration of nitrogen atoms in the high-concentration regions 908 is preferably higher than or equal to $1\times10^{20}$/cm$^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 903 may be formed using a CAAC-OS film. The oxide semiconductor layer 903 formed using a CAAC-OS film has a higher conductivity than that of an amorphous oxide semiconductor layer; thus, the resistance between the source electrode 904 and the drain electrode 905 can be decreased.

By decreasing the resistance between the source electrode 904 and the drain electrode 905, high on-state current and high-speed operation can be ensured even when the transistor 901 is miniaturized. With the miniaturization of the transistor 901, the area occupied by the memory element including the transistor can be reduced and the storage capacity per unit area can be increased.

Figure 23B:
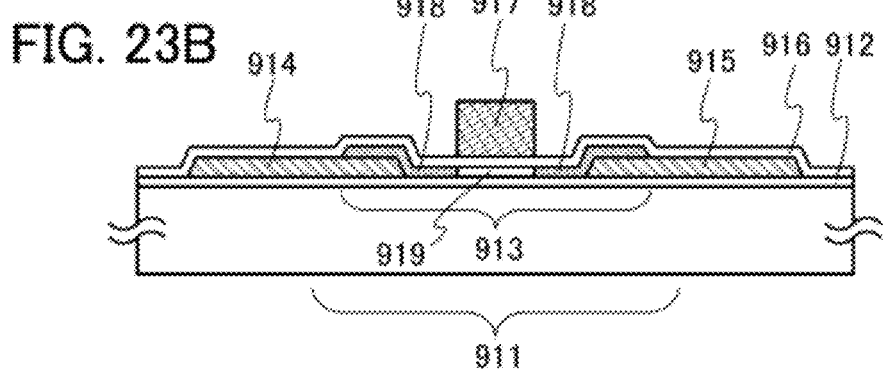

A transistor 911 illustrated in FIG. 23B includes a source electrode 914 and a drain electrode 915 formed over an insulating film 912; an oxide semiconductor layer 913 which is formed over the source electrode 914 and the drain electrode 915 and functions as an active layer; a gate insulating film 916 over the oxide semiconductor layer 913, and the source electrode 914 and the drain electrode 915; and a gate electrode 917 which is provided over the gate insulating film 916 so as to overlap with the oxide semiconductor layer 913.

The transistor 911 illustrated in FIG. 23B is of a top-gate type where the gate electrode 917 is formed over the oxide semiconductor layer 913, and is also of a bottom-contact type where the source electrode 914 and the drain electrode 915 are formed below the oxide semiconductor layer 913. In the transistor 911, the source electrode 914 and the drain electrode 915 do not overlap with the gate electrode 917 as in the transistor 901; thus, the parasitic capacitance generated between the gate electrode 917 and each of the source electrode 914 and the drain electrode 915 can be small, so that high speed operation can be achieved.

The oxide semiconductor layer 913 includes a pair of high-concentration regions 918 which are obtained by addition of dopant imparting n-type conductivity to the oxide semiconductor layer 913 after formation of the gate electrode 917. Further, the oxide semiconductor layer 913 includes a channel formation region 919 which overlaps with the gate electrode 917 with the gate insulating film 916 provided therebetween. In the oxide semiconductor layer 913, the channel formation region 919 is provided between the pair of high-concentration regions 918.

Like the above-described high-concentration regions 908 included in the transistor 901, the high-concentration regions 918 can be formed by an ion implantation method. Examples of the kinds of a dopant used to form the high-concentration regions 908 are the same as those of the kinds of a dopant used to form the high-concentration regions 918.

For example, in the case where nitrogen is used as the dopant, the concentration of nitrogen atoms in the high-concentration regions 918 is preferably higher than or equal to $5\times10^{19}$/cm$^3$ and lower than or equal to $1\times10^{22}$/cm$^3$.

The high-concentration regions 918 to which the dopant imparting n-type conductivity is added have higher conductivity than the other regions in the oxide semiconductor layer 913. Therefore, by providing the high-concentration regions 918 in the oxide semiconductor layer 913, the resistance between the source electrode 914 and the drain electrode 915 can be decreased.

In the case where an In—Ga—Zn—O-based oxide semiconductor is used for the oxide semiconductor layer 913, heat treatment is performed at a temperature higher than or equal to 300° C. and lower than or equal to 600° C. after nitrogen is added. Consequently, the oxide semiconductor in the high-concentration regions 918 has a wurtzite crystal structure. Since the oxide semiconductor in the high-concentration regions 918 has a wurtzite crystal structure, the conductivity of the high-concentration regions 918 can be further increased and the resistance between the source electrode 914 and the drain electrode 915 can be decreased. Note that in order to effectively decrease the resistance between the source electrode 914 and the drain electrode 915 by forming an oxide semiconductor having a wurtzite crystal structure, in the case of using nitrogen as the dopant, the concentration of nitrogen atoms in the high-concentration regions 918 is preferably higher than or equal to $1\times10^{20}$/cm$^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 913 may be formed using a CAAC-OS film. The oxide semiconductor layer 913 formed using a CAAC-OS film has a higher conductivity than that of an amorphous oxide semiconductor layer; thus, the resistance between the source electrode 914 and the drain electrode 915 can be decreased.

By decreasing the resistance between the source electrode 914 and the drain electrode 915, high on-state current and high-speed operation can be ensured even when the transistor 911 is miniaturized. With the miniaturization of the transistor 911, the area occupied by the memory element including the transistor can be reduced and the storage capacity per unit area can be increased.

Figure 23C:
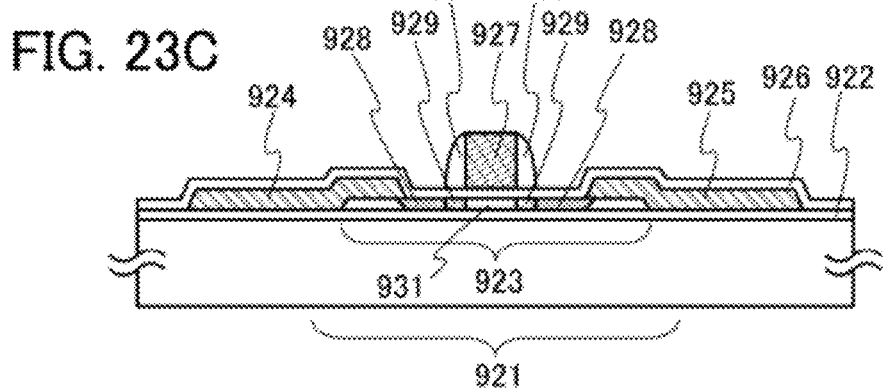

A transistor 921 illustrated in FIG. 23C includes an oxide semiconductor layer 923 which is formed over an insulating film 922 and functions as an active layer; a source electrode 924 and a drain electrode 925 formed over the oxide semiconductor layer 923; a gate insulating film 926 over the oxide semiconductor layer 923, and the source electrode 924 and the drain electrode 925; and a gate electrode 927 which is provided over the gate insulating film 926 so as to overlap with the oxide semiconductor layer 923. In addition, the transistor 921 includes a sidewall 930 which is formed using an insulating film and is provided on a side surface of the gate electrode 927.

The transistor 921 illustrated in FIG. 23C is of a top-gate type where the gate electrode 927 is formed over the oxide semiconductor layer 923, and is also of a top-contact type where the source electrode 924 and the drain electrode 925 are formed over the oxide semiconductor layer 923. In the transistor 921, the source electrode 924 and the drain electrode 925 do not overlap with the gate electrode 927 as in the transistor 901; thus, the parasitic capacitance generated between the gate electrode 927 and each of the source electrode 924 and the drain electrode 925 can be small, so that high speed operation can be achieved.

The oxide semiconductor layer 923 includes a pair of high-concentration regions 928 and a pair of low-concentration regions 929 which are obtained by addition of dopant imparting n-type conductivity to the oxide semiconductor layer 923 after formation of the gate electrode 927. Further, the oxide semiconductor layer 923 includes a channel formation region 931 which overlaps with the gate electrode 927 with the gate insulating film 926 provided therebetween. In the oxide semiconductor layer 923, the channel formation region 931 is provided between the pair of low-concentration regions 929 which are provided between the pair of high-concentration regions 928. The pair of low-concentration regions 929 is provided in a region which is in the oxide semiconductor layer 923 and overlaps with the sidewall 930 with the gate insulating film 926 provided therebetween.

Like the above-described high-concentration regions 908 included in the transistor 901, the high-concentration regions 928 and the low-concentration regions 929 can be formed by an ion implantation method. Examples of the kinds of a dopant used to form the high-concentration regions 908 are the same as those of the kinds of a dopant used to form the high-concentration regions 928.

For example, in the case where nitrogen is used as the dopant, the concentration of nitrogen atoms in the high-concentration regions 928 is preferably higher than or equal to $5\times10^{19}/cm^3$ and lower than or equal to $1\times10^{22}/cm^3$. Further, for example, in the case where nitrogen is used as the dopant, the concentration of nitrogen atoms in the low-concentration regions 929 is preferably higher than or equal to $5\times10^{18}/cm^3$ and lower than $5\times10^{19}/cm^3$.

The high-concentration regions 928 to which the dopant imparting n-type conductivity is added have higher conductivity than the other regions in the oxide semiconductor layer 923. Therefore, by providing the high-concentration regions 928 in the oxide semiconductor layer 923, the resistance between the source electrode 924 and the drain electrode 925 can be decreased. The low-concentration regions 929 are provided between the channel formation region 931 and the high-concentration regions 928, so that a negative shift of the threshold voltage due to a short-channel effect can be reduced.

In the case where an In—Ga—Zn—O-based oxide semiconductor is used for the oxide semiconductor layer 923, heat treatment is performed at a temperature higher than or equal to 300° C. and lower than or equal to 600° C. after nitrogen is added. Consequently, the oxide semiconductor in the high-concentration regions 928 has a wurtzite crystal structure. Further, depending on the nitrogen concentration, the low-concentration regions 929 also have a wurtzite crystal structure due to the heat treatment. Since the oxide semiconductor in the high-concentration regions 928 has a wurtzite crystal structure, the conductivity of the high-concentration regions 928 can be further increased and the resistance between the source electrode 924 and the drain electrode 925 can be decreased. Note that in order to effectively decrease the resistance between the source electrode 924 and the drain electrode 925 by forming an oxide semiconductor having a wurtzite crystal structure, in the case of using nitrogen as the dopant, the concentration of nitrogen atoms in the high-concentration regions 928 is preferably higher than or equal to $1\times10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 923 may be formed using a CAAC-OS film. The oxide semiconductor layer 923 formed using a CAAC-OS has a higher conductivity than that of an amorphous oxide semiconductor layer; thus, the resistance between the source electrode 924 and the drain electrode 925 can be decreased.

By decreasing the resistance between the source electrode 924 and the drain electrode 925, high on-state current and high-speed operation can be ensured even when the transistor 921 is miniaturized. With the miniaturization of the transistor 921, the area occupied by a memory cell including the transistor can be reduced and the storage capacity per unit area of a cell array can be increased.

Figure 23D:
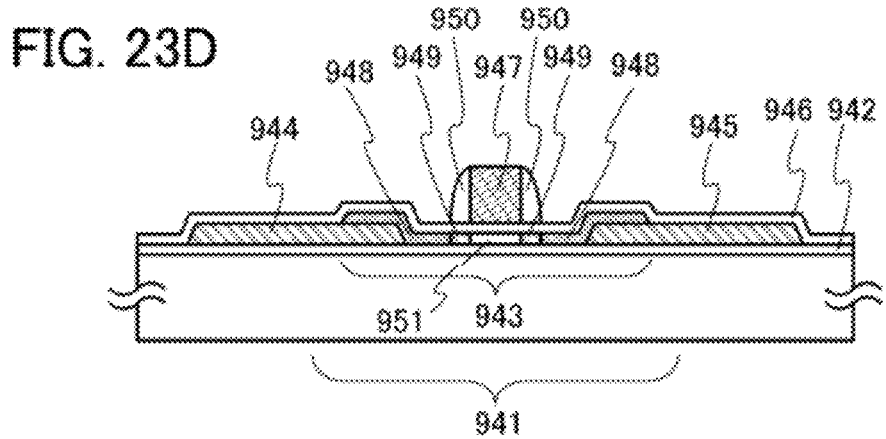

A transistor 941 illustrated in FIG. 23D includes a source electrode 944 and a drain electrode 945 formed over an insulating film 942; an oxide semiconductor layer 943 which is formed over the source electrode 944 and the drain electrode 945 and functions as an active layer; a gate insulating film 946 over the oxide semiconductor layer 943, and the source electrode 944 and the drain electrode 945; and a gate electrode 947 which is provided over the gate insulating film 946 so as to overlap with the oxide semiconductor layer 943. In addition, the transistor 941 includes a sidewall 950 which is formed using an insulating film and is provided on a side surface of the gate electrode 947.

The transistor 941 illustrated in FIG. 23D is of a top-gate type where the gate electrode 947 is formed over the oxide semiconductor layer 943, and is also of a bottom-contact type where the source electrode 944 and the drain electrode 945 are formed below the oxide semiconductor layer 943. In the transistor 941, the source electrode 944 and the drain electrode 945 do not overlap with the gate electrode 947 as in the transistor 901. Therefore, the parasitic capacitance generated between the gate electrode 947 and each of the source electrode 944 and the drain electrode 945 can be small, so that high speed operation can be achieved.

The oxide semiconductor layer 943 includes a pair of high-concentration regions 948 and a pair of low-concentration regions 949 which are obtained by addition of dopant imparting n-type conductivity to the oxide semiconductor layer 943 after formation of the gate electrode 947. Further, the oxide semiconductor layer 943 includes a channel formation region 951 which overlaps with the gate electrode 947 with the gate insulating film 946 provided therebetween. In the oxide semiconductor layer 943, the channel formation region 951 is provided between the pair of low-concentration regions 949 which are provided between the pair of high-concentration regions 948. The pair of low-concentration regions 949 is provided in a region which is in the oxide semiconductor layer 943 and overlaps with the sidewall 950 with the gate insulating film 946 provided therebetween.

Like the above-described high-concentration regions 908 included in the transistor 901, the high-concentration regions 948 and the low-concentration regions 949 can be formed by an ion implantation method. Examples of the kinds of a dopant used to form the high-concentration regions 908 are the same as those of the kinds of a dopant used to form the high-concentration regions 948.

For example, in the case where nitrogen is used as the dopant, the concentration of nitrogen atoms in the high-concentration regions 948 is preferably higher than or equal to $5\times10^{19}$/cm$^3$ and lower than or equal to $1\times10^{22}$/cm$^3$. Further, for example, in the case where nitrogen is used as the dopant, the concentration of nitrogen atoms in the low-concentration regions 949 is preferably higher than or equal to $5\times10^{18}$/cm$^3$ and lower than $5\times10^{19}$/cm$^3$.

The high-concentration regions 948 to which the dopant imparting n-type conductivity is added have higher conductivity than the other regions in the oxide semiconductor layer 943. Therefore, by providing the high-concentration regions 948 in the oxide semiconductor layer 943, the resistance between the source electrode 944 and the drain electrode 945 can be decreased. The low-concentration regions 949 are provided between the channel formation region 951 and the high-concentration regions 948, so that a negative shift of the threshold voltage due to a short-channel effect can be reduced.

In the case where an In—Ga—Zn—O-based oxide semiconductor is used for the oxide semiconductor layer 943, heat treatment is performed at a temperature higher than or equal to 300° C. and lower than or equal to 600° C. after nitrogen is added. Consequently, the oxide semiconductor in the high-concentration regions 948 has a wurtzite crystal structure. Further, depending on the nitrogen concentration, the low-concentration regions 949 also have a wurtzite crystal structure due to the heat treatment. Since the oxide semiconductor in the high-concentration regions 948 has a wurtzite crystal structure, the conductivity of the high-concentration regions 948 can be further increased and the resistance between the source electrode 944 and the drain electrode 945 can be decreased. Note that in order to effectively decrease the resistance between the source electrode 944 and the drain electrode 945 by forming an oxide semiconductor having a wurtzite crystal structure, in the case of using nitrogen as the dopant, the concentration of nitrogen atoms in the high-concentration regions 948 is preferably higher than or equal to $1\times10^{20}$/cm$^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 943 may be formed using a CAAC-OS film. The oxide semiconductor layer 943 formed using a CAAC-OS has a higher conductivity than that of an amorphous oxide semiconductor layer; thus, the resistance between the source electrode 944 and the drain electrode 945 can be decreased.

By decreasing the resistance between the source electrode 944 and the drain electrode 945, high on-state current and high-speed operation can be ensured even when the transistor 941 is miniaturized. With the miniaturization of the transistor 941, the area occupied by the memory element including the transistor can be reduced and the storage capacity per unit area can be increased.

Note that as a method for forming high-concentration regions functioning as a source region and a drain region in a self-aligning process in a transistor including an oxide semiconductor, disclosed is a method in which a surface of an oxide semiconductor layer is exposed and argon plasma treatment is performed so that the resistivity of a region which is exposed to plasma in the oxide semiconductor layer is decreased (S. Jeon et al., "180 nm Gate Length Amorphous InGaZnO Thin Film Transistor for High Density Image Sensor Applications", *IEDM Tech. Dig.*, p. 504-507, 2010).

However, in the above manufacturing method, after a gate insulating film is formed, the gate insulating film needs to be partially removed so that a portion which is to be the source region and the drain region is exposed. Therefore, at the time of removing the gate insulating film, the oxide semiconductor layer which is below the gate insulating film is partially over-etched; thus, the thickness of the portion which is to be the source region and the drain region becomes small. As a result, the resistance of the source region and the drain region is increased, and defects of transistor characteristics due to overetching easily occur.

In order to promote miniaturization of a transistor, a dry etching method with which high processing accuracy can be provided needs to be employed. However, the overetching easily occurs remarkably in the case where a dry etching method with which the selectivity of a gate insulating film to an oxide semiconductor layer is not sufficiently obtained is employed.

For example, the overetching does not become a problem as long as the oxide semiconductor layer has an enough thickness; however, when the channel length is 200 nm or less, the thickness of the oxide semiconductor layer in a region which is to be a channel formation region needs to be 20 nm or less, preferably 10 nm or less so that a short-channel effect can be prevented. When such a thin oxide semiconductor layer is used, the overetching of the oxide semiconductor layer is not preferable because the resistance of the source region and the drain region is increased and defects of transistor characteristics occur as described above.

However, as in one embodiment of the present invention, addition of dopant to an oxide semiconductor layer is performed in the state where a gate insulating film is left so as not to expose the oxide semiconductor; thus, the overetching of the oxide semiconductor layer can be prevented and excessive damage to the oxide semiconductor layer can be reduced. In addition, the interface between the oxide semiconductor layer and the gate insulating film is kept clean. Therefore, the characteristics and reliability of the transistor can be improved.

This embodiment can be implemented combining with another embodiment as appropriate.

(Embodiment 12)

The actually measured field-effect mobility of an insulated gate transistor can be lower than its original mobility because of a variety of reasons; this phenomenon occurs not only in the case of using an oxide semiconductor.

One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured mobility of a semiconductor are $\mu_0$ and $\mu$, respectively, and a potential barrier (such as a grain boundary) exists in the semiconductor, the mobility $\mu$ can be expressed as Formula A of FIG. 29A.

E represents the height of the potential barrier, k represents the Boltzmann constant, and T represents the absolute temperature.

When the potential barrier is assumed to be attributed to a defect, Formula B of FIG. 29B can be obtained according to the Levinson model.

e represents the elementary charge, N represents the average defect density per unit area in a channel, $\epsilon$ represents the permittivity of the semiconductor, n represents the number of carriers per unit area in the channel, $C_{ox}$ represents the capacitance per unit area, $V_g$ represents the gate voltage, and t represents the thickness of the channel.

In the case where the thickness of the semiconductor layer is less than or equal to 30 nm, the thickness of the channel may be regarded as being the same as the thickness of the semiconductor layer.

The drain current $I_d$ in a linear region can be expressed as Formula C of FIG. 29C.

L represents the channel length and W represents the channel width, and L and W are each 10 μm in this case.

In addition, $V_d$ represents the drain voltage.

When dividing both sides of Formula C by $V_g$ and then taking logarithms of both sides, the Formula D of FIG. 29D can be obtained.

The right side of Formula C is a function of $V_g$.

The formula D shows that the defect density N can be obtained from the slope of a line with $\ln(I_d/V_g)$ as the ordinate and $1/V_g$ as the abscissa.

That is, the defect density can be evaluated from the $I_d$-$V_g$ characteristics of the transistor.

The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 cm$^2$/Vs.

The measured mobility of an In—Sn—Zn oxide including a defect is approximately 35 cm$^2$/Vs.

However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed by Formula E of FIG. 29E.

D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches).

When D is increased (i.e., when the gate voltage is increased), the second term of Formula E is increased and accordingly the mobility $\mu_1$ is decreased.

Figure 30:
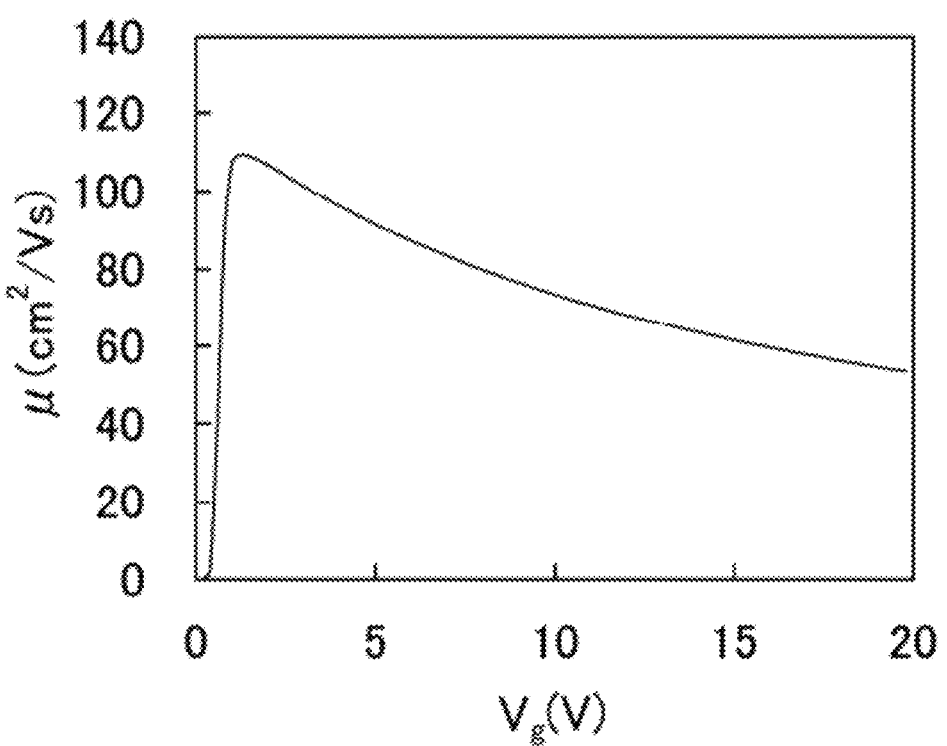
FIG. 30 is a graph showing the gate voltage dependence of mobility obtained by calculation.

Calculation results E of the mobility μ of a transistor whose channel includes an ideal oxide semiconductor without a defect inside the semiconductor are shown in FIG. 30.

For the calculation, device simulation software Sentaurus Device manufactured by Synopsys, Inc. was used.

For the calculation, the band gap, the electron affinity, the dielectric constant, and the thickness of the oxide semiconductor were assumed to be 2.8 eV, 4.7 eV, 15, and 15 nm, respectively.

These values were obtained by measurement of a thin film that was formed by a sputtering method.

Further, the work functions of a gate, a source, and a drain were assumed to be 5.5 eV, 4.6 eV, and 4.6 eV, respectively.

The thickness of a gate insulating film was assumed to be 100 nm, and the dielectric constant thereof was assumed to be 4.1. The channel length and the channel width were each assumed to be 10 μm, and the drain voltage $V_d$ was assumed to be 0.1 V.

As shown in the calculation results E, the mobility has a peak of greater than or equal to 100 cm$^2$/Vs at a gate voltage that is a little over 1 V and is decreased as the gate voltage becomes higher because the influence of interface scattering is increased.

Note that in order to reduce interface scattering, it is preferable that a surface of the semiconductor layer be flat at the atomic level (atomic layer flatness).

Characteristics of minute transistors which are manufactured using an oxide semiconductor having such mobility are calculated.

The transistor used for calculation includes a channel formation region provided between a pair of n-type semiconductor regions in the oxide semiconductor layer.

The calculation was performed under the condition that the resistivity of the pair of n-type semiconductor regions is $2 \times 10^{-3}$ Ωcm.

The calculation was performed under the condition that a channel length was 33 nm and a channel width was 40 nm.

Further, a sidewall is provided on the side wall of the gate electrode.

The calculation was performed under the condition that part of the semiconductor region which overlaps with the sidewall is an offset region.

For the calculation, Sentaurus Device which is software manufactured by Synopsys, Inc. was used.

Figure 31A:
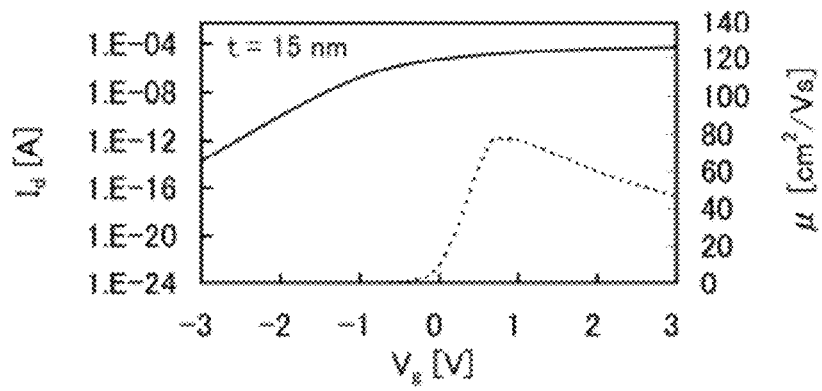
FIGS. 31A to 31C are graphs each showing the gate voltage dependence of a drain current and mobility obtained by calculation.
Figure 31B:
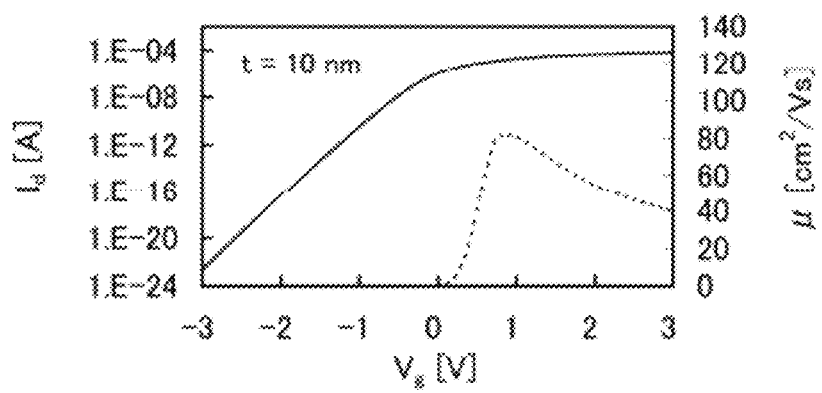
Figure 31C:
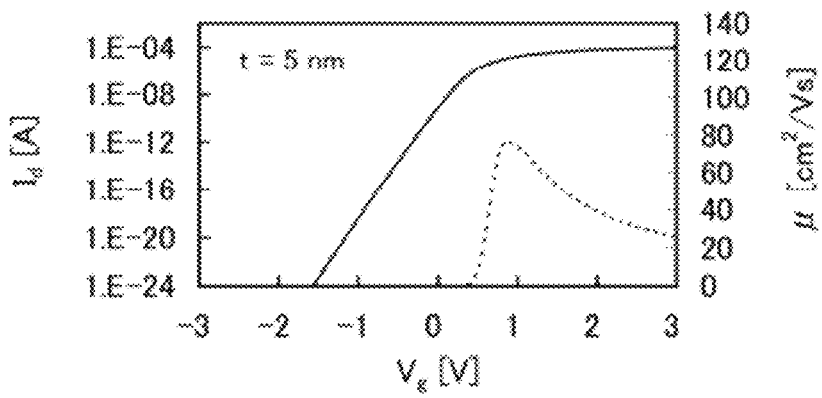

FIGS. 31A to 31C are calculation results of the gate voltage ($V_g$: a potential difference between the gate and the source) dependence of the drain current ($I_d$, solid line) and the mobility (m, dotted line) of the transistor.

The drain current $I_d$ is obtained by calculation under the condition that the drain voltage (a potential difference between the drain and the source) is +1 V and the mobility μ is obtained by calculation under the condition that the drain voltage is +0.1 V.

FIG. 31A shows the calculation result under the condition that the thickness of the gate insulating film is 15 nm.

FIG. 31B shows the calculation result under the condition that the thickness of the gate insulating film is 10 nm.

FIG. 31C shows the calculation result under the condition that the thickness of the gate insulating film is 5 nm.

As the gate insulating film is thinner, the drain current $I_d$ (off-state current) particularly in an off state is significantly decreased.

In contrast, there is no noticeable change in the peak value of the mobility μ and the drain current $I_d$ (on-state current) in an on state.

Figure 32A:
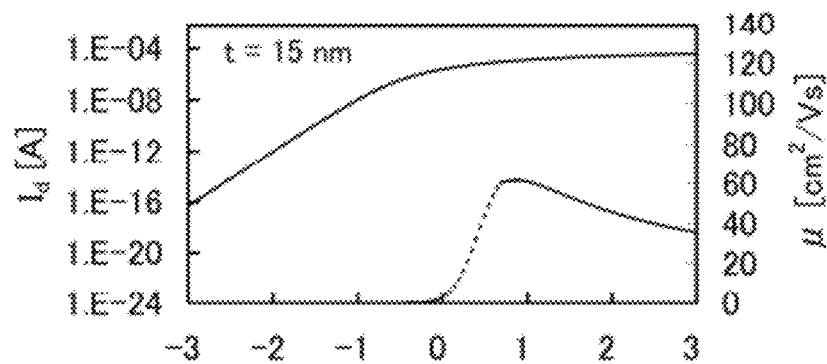
FIGS. 32A to 32C are graphs each showing the gate voltage dependence of a drain current and mobility obtained by calculation.
Figure 32B:
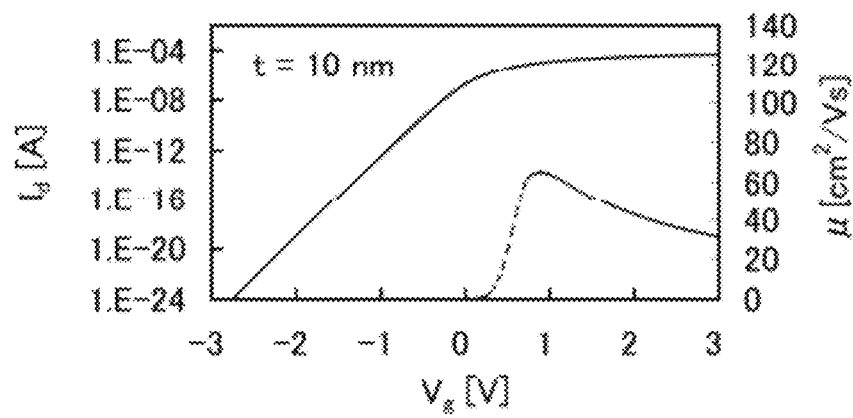
Figure 32C:
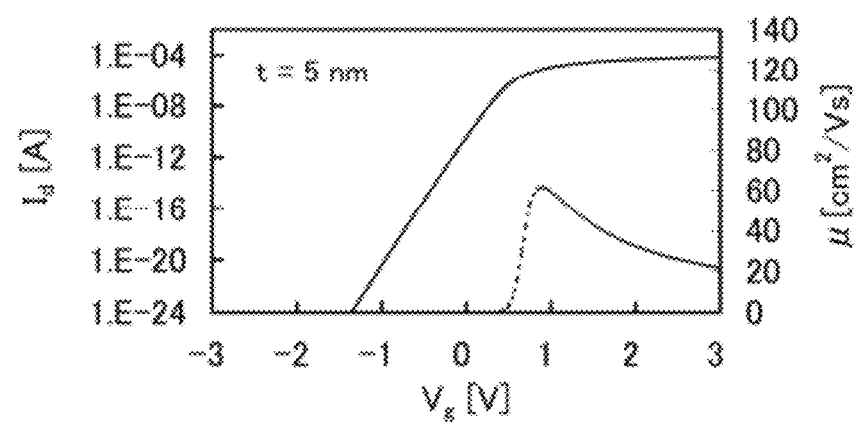

FIGS. 32A to 32C show the gate voltage $V_g$ dependence of the drain current $I_d$ (solid line) and the mobility μ (dotted line) under the condition that the offset length (sidewall length) $L_{off}$ is 5 nm.

The drain current $I_d$ is obtained by calculation under the condition that the drain voltage is +1 V and the mobility μ is obtained by calculation under the condition that the drain voltage is +0.1 V.

FIG. 32A shows the calculation result under the condition that the thickness of the gate insulating film is 15 nm.

FIG. 32B shows the calculation result under the condition that the thickness of the gate insulating film is 10 nm.

FIG. 32C shows the calculation result under the condition that the thickness of the gate insulating film is 5 nm.

Figure 33A:
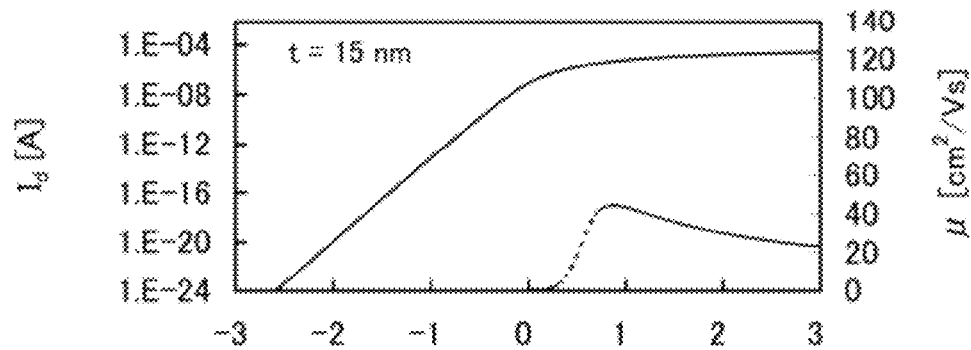
FIGS. 33A to 33C are graphs each showing the gate voltage dependence of a drain current and mobility obtained by calculation.
Figure 33B:
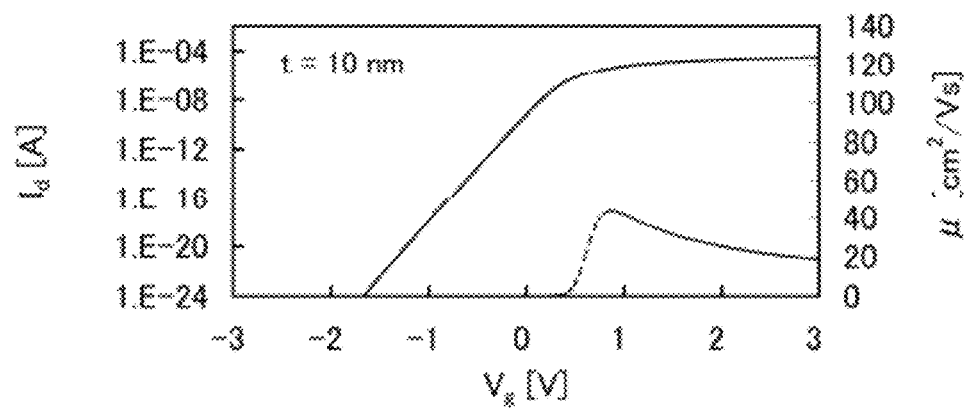
Figure 33C:
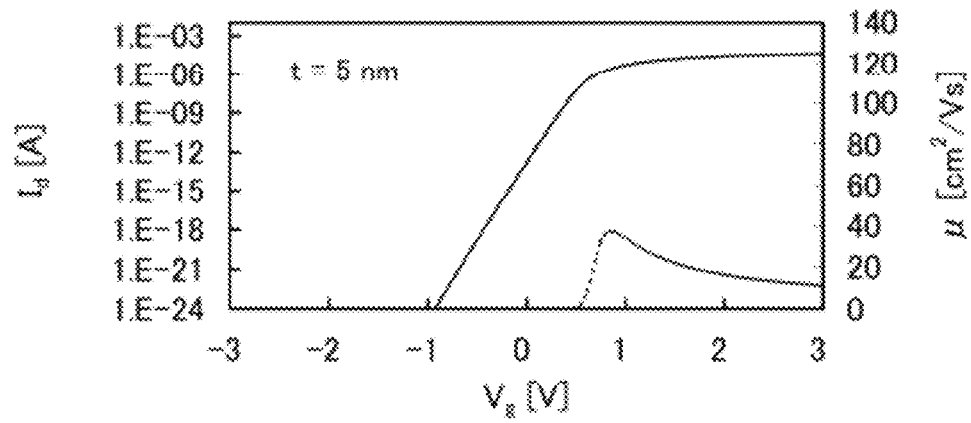

FIGS. 33A to 33C show the gate voltage dependence of the drain current $I_d$ (solid line) and the mobility μ (dotted line) under the condition that the offset length (sidewall length) $L_{off}$ is 15 nm.

The drain current $I_d$ is obtained by calculation under the condition that the drain voltage is +1 V and the mobility μ is obtained by calculation under the condition that the drain voltage is +0.1 V.

FIG. 33A shows the calculation result under the condition that the thickness of the gate insulating film is 15 nm.

FIG. 33B shows the calculation result under the condition that the thickness of the gate insulating film is 10 nm.

FIG. 33C shows the calculation result under the condition that the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm$^2$/Vs in FIGS. 31A to 31C, approximately 60 cm$^2$/Vs in FIGS. 32A to 32C, and approximately 40 cm$^2$/Vs in FIGS. 33A to 33C; thus, the peak of the mobility μ is decreased as the offset length $L_{off}$ is increased.

Further, the same applies to the off-state current.

The on-state current is also decreased as the offset length $L_{off}$ is increased; however, the decrease in the on-state current is much more gradual than the decrease in the off-state current.

Further, the graphs show that in either of the structures, the drain current exceeds 10 μA, which is required in a memory element and the like, at a gate voltage of around 1 V.

The contents of this example or part thereof can be implemented in combination with any of the other embodiments and examples.

[Example 1]

A transistor including an oxide semiconductor containing In, Sn, and Zn can have favorable characteristics by deposition of the oxide semiconductor while heating a substrate or by heat treatment after deposition of an oxide semiconductor film.

Note that each of In, Sn, and Zn is preferably included in a composition at 5 atomic % or more.

By intentionally heating the substrate after the deposition of the oxide semiconductor film containing In, Sn, and Zn, the field-effect mobility of the transistor can be improved.

Further, the threshold voltage of an n-channel transistor can be shifted in the positive direction.

The threshold voltage of the n-channel transistor is shifted in the positive direction, so that the absolute value of a voltage for maintaining the off state of the n-channel transistor can be reduced; thus, low power consumption can be achieved.

In addition, when the threshold voltage of the n-channel transistor is shifted in the positive direction to 0 V or more, a normally-off transistor can be obtained.

The characteristics of a transistor including an oxide semiconductor containing In, Sn, and Zn are described below.

(Common Conditions of Sample A to Sample C)

An oxide semiconductor layer was formed over a substrate to have a thickness of 15 nm under the following conditions: a target having a composition ratio of In:Sn:Zn=1:1:1 is used; the gas flow rate is Ar/O$_2$=6/9 sccm; the deposition pressure is 0.4 Pa; and the deposition power is 100 W.

Next, the oxide semiconductor layer was etched in an island shape.

Then, a tungsten layer was deposited over the oxide semiconductor layer to have a thickness of 50 nm. The tungsten layer was etched, so that a source electrode and a drain electrode were formed.

After that, a silicon oxynitride (SiON) film was formed as a gate insulating layer to have a thickness of 100 nm by plasma CVD using a silane (SiH$_4$) gas and dinitrogen monoxide (N$_2$O) gas.

Then, a gate electrode was formed in the following manner: a tantalum nitride layer was formed to have a thickness of 15 nm; a tungsten layer was formed to have a thickness of 135 nm; and these were etched.

After that, a silicon oxynitride (SiON) film formed by plasma CVD with a thickness of 300 nm and a polyimide film with a thickness of 1.5 μm were formed as an interlayer insulating film.

Next, a pad for measurement was formed in the following manner: a contact hole was formed in the interlayer insulating film; a first titanium film was formed to have a thickness of 50 nm; an aluminum film was formed to have a thickness of 100 nm; a second titanium film was formed to have a thickness of 50 nm; and these films were etched.

In this manner, a semiconductor device including a transistor was formed.

(Sample A)

In Sample A, heating was not intentionally performed to the substrate during the deposition of the oxide semiconductor layer.

Further in Sample A, heat treatment was not performed in a period after the oxide semiconductor layer was deposited before the oxide semiconductor layer was etched.

(Sample B)

In Sample B, the oxide semiconductor layer was deposited while the substrate was heated at 200° C.

Further in Sample B, heat treatment was not performed in a period after the oxide semiconductor layer was deposited before the oxide semiconductor layer was etched.

The oxide semiconductor layer was deposited while the substrate was heated in order to remove hydrogen serving as a donor in the oxide semiconductor layer.

(Sample C)

In Sample C, the oxide semiconductor layer was deposited while the substrate was heated at 200° C.

Further in Sample C, heat treatment in a nitrogen atmosphere was performed at 650° C. for one hour and then heat treatment in an oxygen atmosphere was performed at 650° C. for one hour after the oxide semiconductor layer was deposited before the oxide semiconductor layer was etched.

The heart treatment was performed in a nitrogen atmosphere at 650° C. for one hour in order to remove hydrogen serving as a donor in the oxide semiconductor layer.

With the heat treatment for removing hydrogen serving as a donor in the oxide semiconductor layer, oxygen is also removed to form oxygen vacancy serving as a carrier in the oxide semiconductor layer.

Thus, the heat treatment in an oxygen atmosphere at 650° C. for one hour was performed for reduction in oxygen vacancy.

(Characteristics of Transistors in Sample S to Sample C)

Figure 34A:
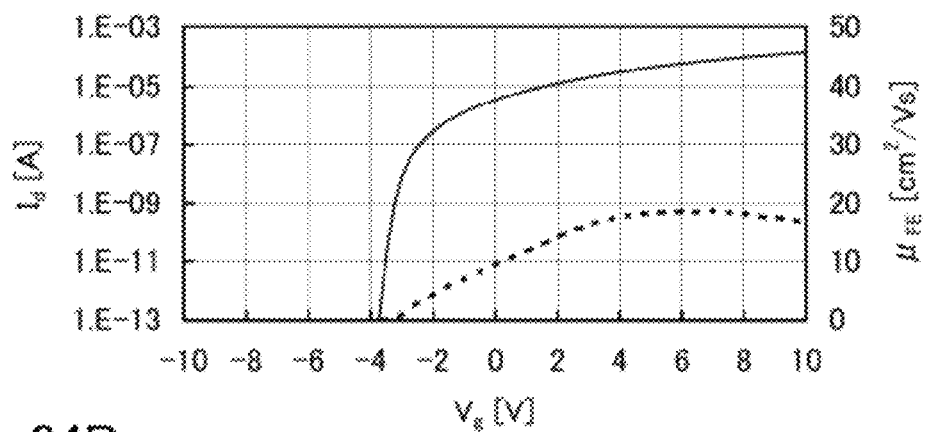
FIGS. 34A to 34C are graphs each showing the characteristics of a transistor.

FIG. 34A shows initial characteristics of a transistor in Sample A.

Figure 34B:
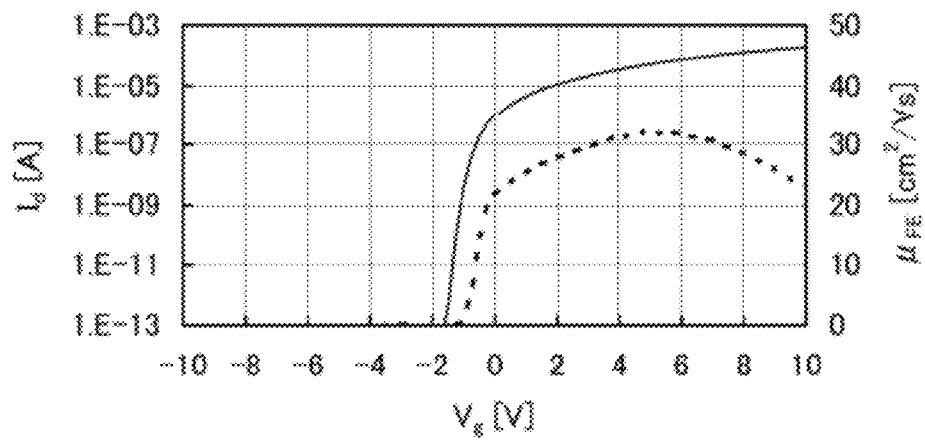

FIG. 34B shows initial characteristics of a transistor in Sample B.

Figure 34C:
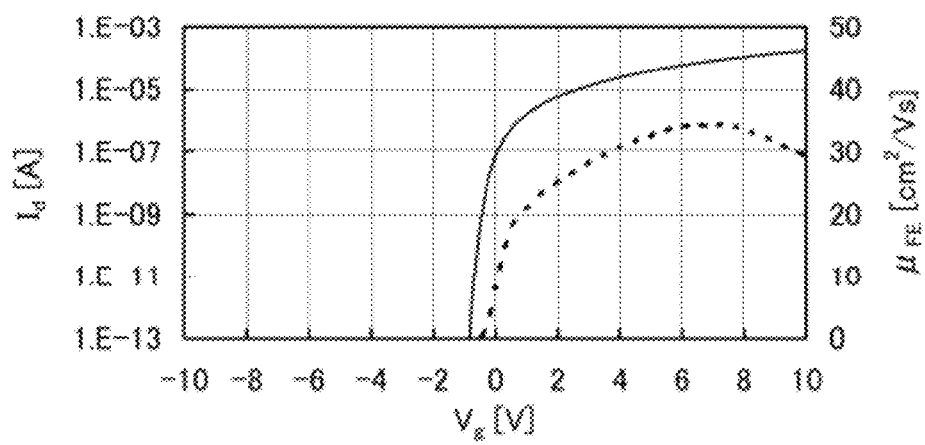

FIG. 34C shows initial characteristics of a transistor in Sample C.

The field-effect mobility of the transistor in Sample A was 18.8 cm$^2$/Vsec.

The field-effect mobility of the transistor in Sample B was 32.2 cm$^2$/Vsec.

The field-effect mobility of the transistor in Sample C was 34.5 cm$^2$/Vsec.

According to observations of cross sections of oxide semiconductor layers, which were formed by deposition methods similar to respective those of Sample A to Sample C, with a transmission electron microscope (TEM), crystallinity was observed in samples formed by the deposition methods similar to respective those of Sample B and Sample C whose substrates have been heated during deposition.

Surprisingly, the sample whose substrate had been heated during deposition had a non-crystalline portion and a crystalline portion was aligned in the c-axis direction.

In a normal polycrystal, the crystalline portion is not aligned. Therefore, the sample whose substrate has been heated during deposition has a novel crystal structure.

Comparison of FIG. 34A to FIG. 34C leads to understanding that heat treatment performed to the substrate during or after deposition can remove an hydrogen element serving as a donor, so that the threshold voltage of the n-channel transistor can be shifted in the positive direction.

That is, the threshold voltage of Sample B in which heating was performed to the substrate during deposition is shifted in the positive direction more than the threshold voltage of Sample A in which heating was not performed to the substrate during deposition.

In addition, comparing Sample B and Sample C, substrates of which were heated during deposition, it is found that the threshold voltage of Sample C in which heat treatment was performed after deposition is shifted in the positive direction more than the threshold voltage of Sample B in which heat treatment was not performed after deposition.

Furthermore, the higher the temperature of heat treatment is, the more the light element such as a hydrogen element tends to be removed; thus, hydrogen is more likely to be removed as the temperature of heat treatment is higher.

It was therefore found that the threshold voltage can be shifted more in the positive direction by further increasing of the temperature of heat treatment.

(Results of the Gate BT Stress Test of Sample B and Sample C)

The gate BT stress test was performed on Sample B (without heat treatment after deposition) and Sample C (with heat treatment after deposition).

First, $V_g$-$I_d$ characteristics of the transistors were measured at a substrate temperature of 25° C. and $V_{ds}$ of 10 V to measure characteristics of the transistors before heat treatment and high positive voltage application.

Then, the substrate temperature was set to 150° C. and $V_{ds}$ was set to 0.1 V.

After that, 20 V of $V_g$ was applied to the gate insulating film and the condition was kept for one hour.

Next, $V_g$ was set to 0 V.

Then, $V_g$-$I_d$ characteristics of the transistors were measured at a substrate temperature of 25° C. and $V_{ds}$ of 10 V to measure characteristics of the transistors after heat treatment and high positive voltage application.

Comparing characteristics of transistors before and after heat treatment and high positive voltage application in the above manner is called a positive BT test.

In a similar manner, $V_g$-$I_d$ characteristics of the transistors were measured at a substrate temperature of 25° C. and $V_{ds}$ of 10 V to measure characteristics of the transistors before heat treatment and high negative voltage application.

Then, the substrate temperature was set to 150° C. and $V_{ds}$ was set to 0.1 V.

After that, −20 V of $V_g$ was applied to the gate insulating film and the condition was kept for one hour.

Next, $V_g$ was set to 0 V.

Then, $V_g$-$I_d$ characteristics of the transistors were measured at a substrate temperature of 25° C. and $V_{ds}$ of 10 V to measure characteristics of the transistors after heat treatment and high negative voltage application.

Comparing characteristics of transistors before and after heat treatment and high negative voltage application in the above manner is called a negative BT test.

Figure 35A:
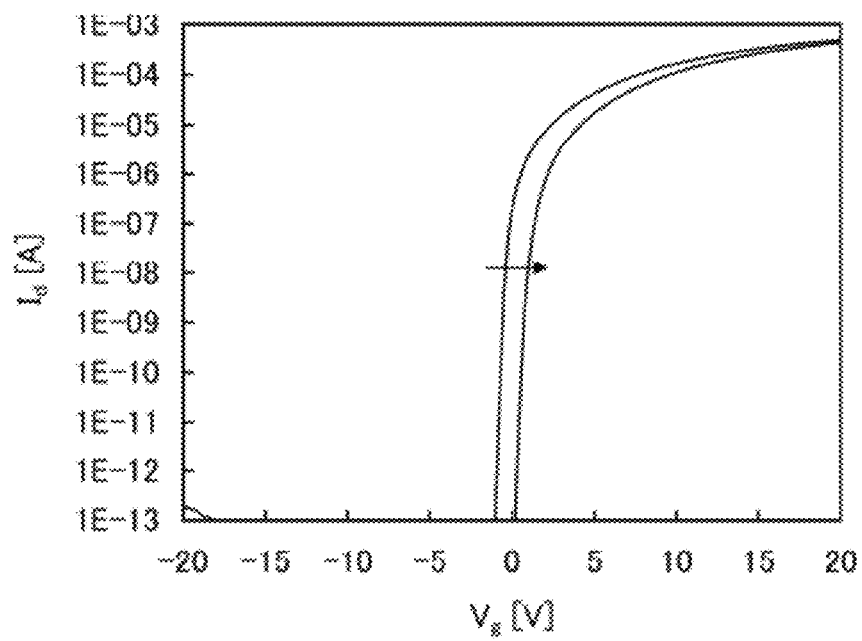
FIGS. 35A and 35B are graphs each showing the characteristics of a transistor.
Figure 35B:
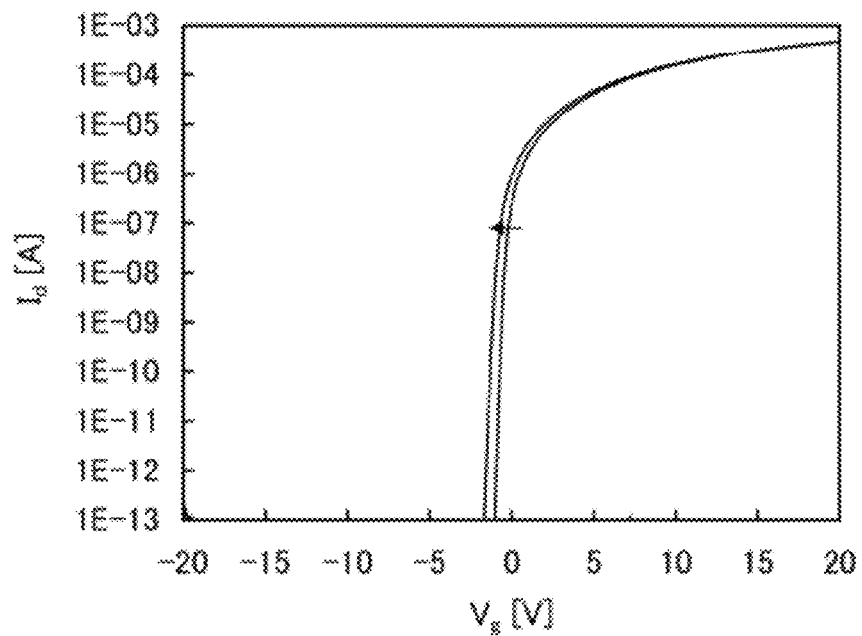

FIG. 35A shows a result of the positive BT test of Sample B and FIG. 35B shows a result of the negative BT test of Sample B.

Figure 36A:
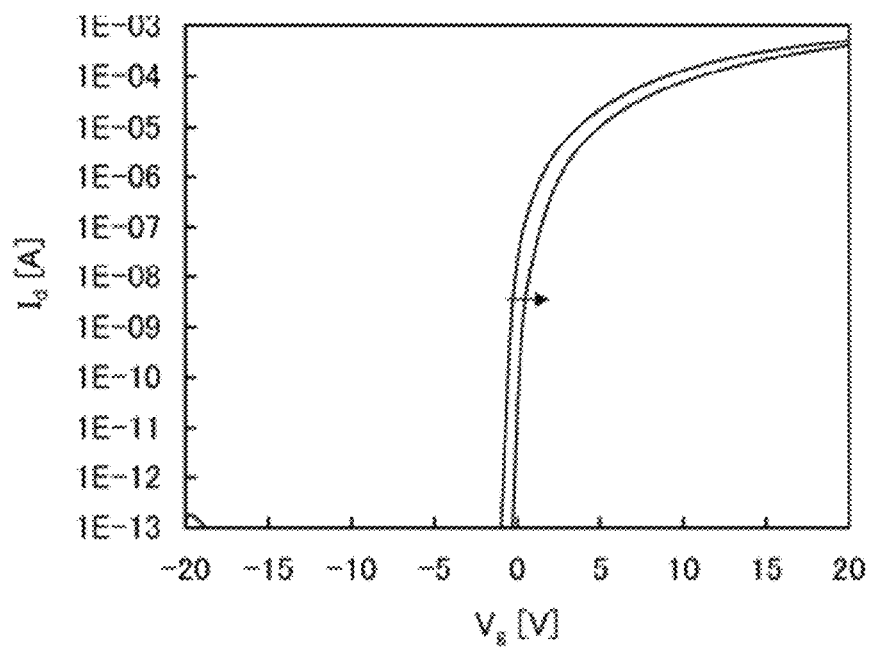
FIGS. 36A and 36B are graphs each showing the characteristics of a transistor.
Figure 36B:
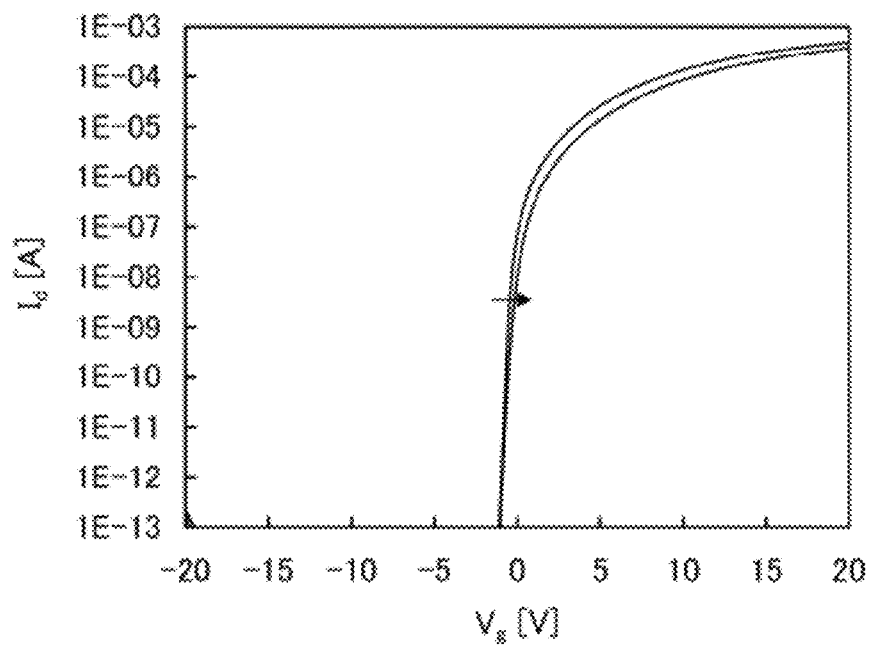

FIG. 36A shows a result of the positive BT test of Sample C and FIG. 36B shows a result of the negative BT test of Sample C.

Although the positive BT test and the negative BT test are tests used to determine the deterioration level of a transistor, with reference to FIG. 35A and FIG. 36A, it is found that the threshold voltage can be shifted in the positive direction by performing at least the positive BT test.

In FIG. 35A shows that a transistor becomes a normally-off transistor by being subjected to the positive BT test.

Therefore, it is revealed that the shift of the threshold voltage in the positive direction can be increased and a normally-off transistor can be formed by performing the positive BT test in addition to the heat treatment at the time of manufacturing the transistor.

Figure 37:
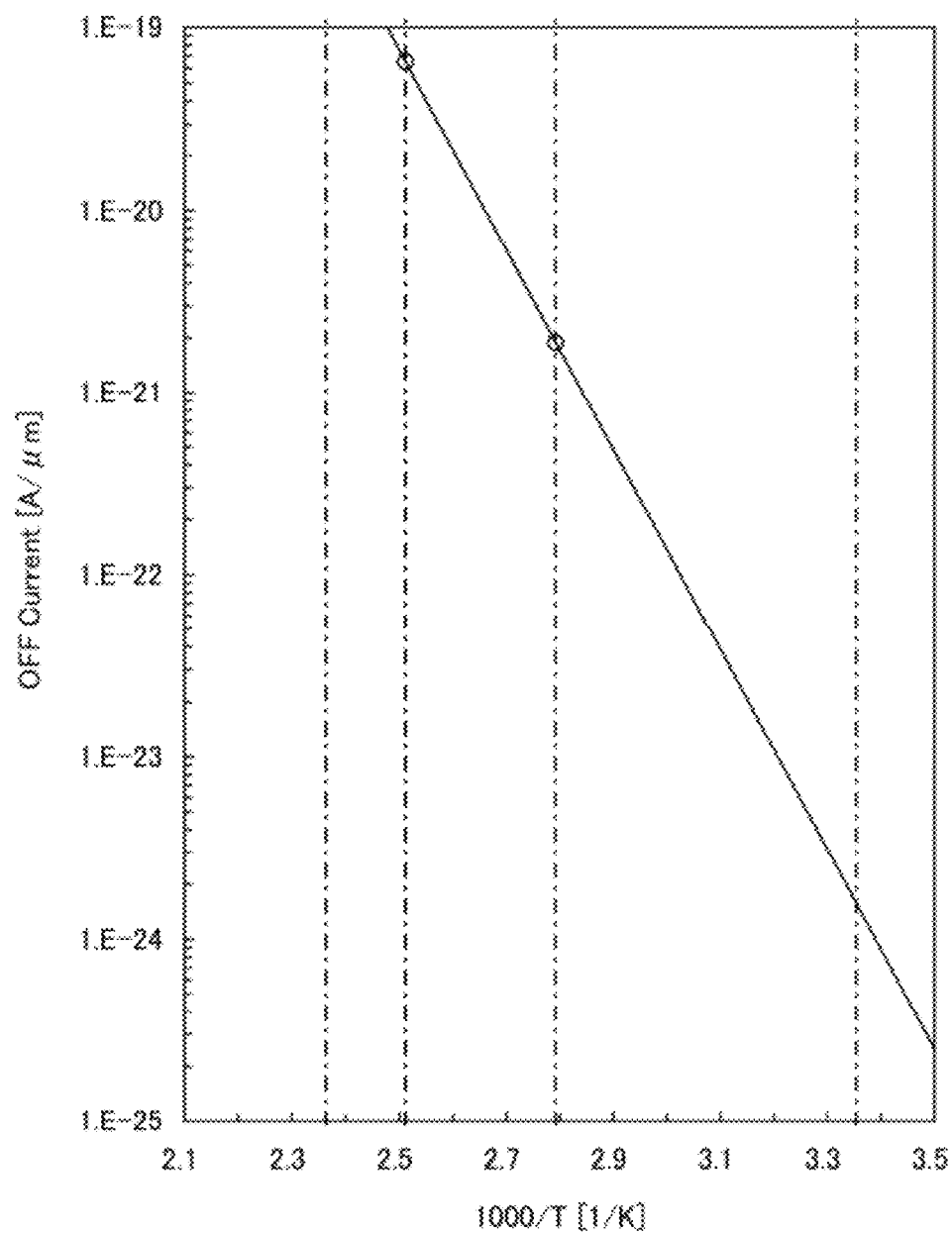
FIG. 37 is a graph showing a relation between off-state current and a substrate temperature in measurement of a transistor.

FIG. 37 shows a relation between the off-state current of a transistor in Sample A and the inverse of substrate temperature (absolute temperature) at measurement.

Here, the abscissa represents a value (1000/T) obtained by multiplying an inverse of substrate temperature at measurement by 1000.

Note that FIG. 37 illustrates the amount of current in the case where the channel width is 1 μm.

The off-state current was lower than or equal to $1 \times 10^{-19}$ A when the substrate temperature was 125° C. (1000/T is approximately 2.51).

Further, the off-state current was lower than or equal to $1 \times 10^{-20}$ A when the substrate temperature was 85° C. (1000/T is approximately 2.79).

That is, it is found that the off-state current is extremely low compared to a transistor including a silicon semiconductor.

Note that as the temperature is lower, the off-state current is decreased; thus, it is clear that the off-state current at room temperature is further lower.

The contents of this example or part thereof can be implemented in combination with any of the other embodiments and example.

[Example 2]

A memory element according to one embodiment of the present invention can be used in a signal processing circuit. For example, a memory element according to one embodiment of the present invention can be used in a register of a signal processing circuit or a memory device included in a signal processing circuit. The use of the memory element in the signal processing circuit allows the signal processing circuit to hold data for a long time even after supply of a power supply voltage is stopped. Therefore, when the supply of the power supply voltage restarts, the signal processing circuit can immediately start predetermined processing using the held data. Therefore, stop of the power supply for a short time can be performed frequently in the signal processing circuit, so that power consumption can be further reduced. In addition, the number of rewritable times of data can be increased, and when the memory element in which writing errors or reading errors of data hardly occur is used in the signal processing circuit, the reliability of the signal processing circuit can be improved. In addition, the use of the memory element whose writing speed is high in the signal processing circuit makes it possible to also improve the operation speed of the signal processing circuit.

Electronic devices each including the signal processing circuit formed according to an embodiment of the present invention can be used for display devices, laptop personal computers, or image reproducing devices provided with recording media (typically, devices which reproduce the content of recording media such as digital versatile discs (DVDs) and have displays for displaying the reproduced images). Other than the above, as electronic devices which can employ the signal processing circuit formed according to one embodiment of the present invention, mobile phones, portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. In particular, in the case where a portable electronic device which has difficulty in continuously receiving power, an advantage of an increase in continuous operating time can be obtained when the signal processing circuit according to one embodiment of the present invention is added as a component of the device.

Figure 24:
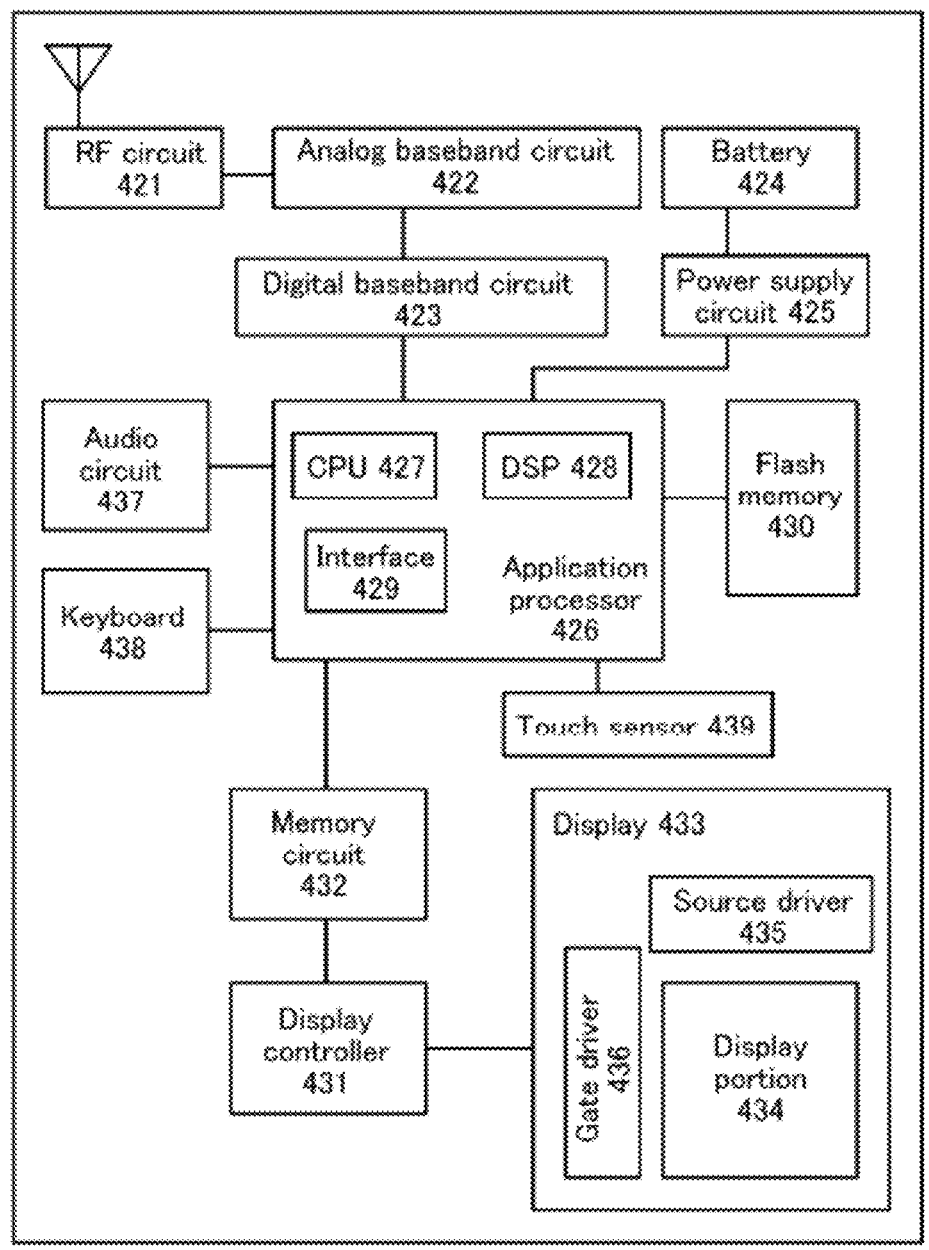
FIG. 24 is a block diagram of a portable electronic device.

A case where a signal processing circuit according to one embodiment of the present invention is applied to mobile electronic devices such as a mobile phone, a smartphone, and an electronic book reader is described FIG. 24 is a block diagram of a portable electronic device. The portable electronic device illustrated in FIG. 24 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a digital signal processor (DSP) 428, and an interface 429. The signal processing circuit described in the above embodiment is employed for the CPU 427 or the DSP 428, whereby power consumption can be reduced.

Figure 25:
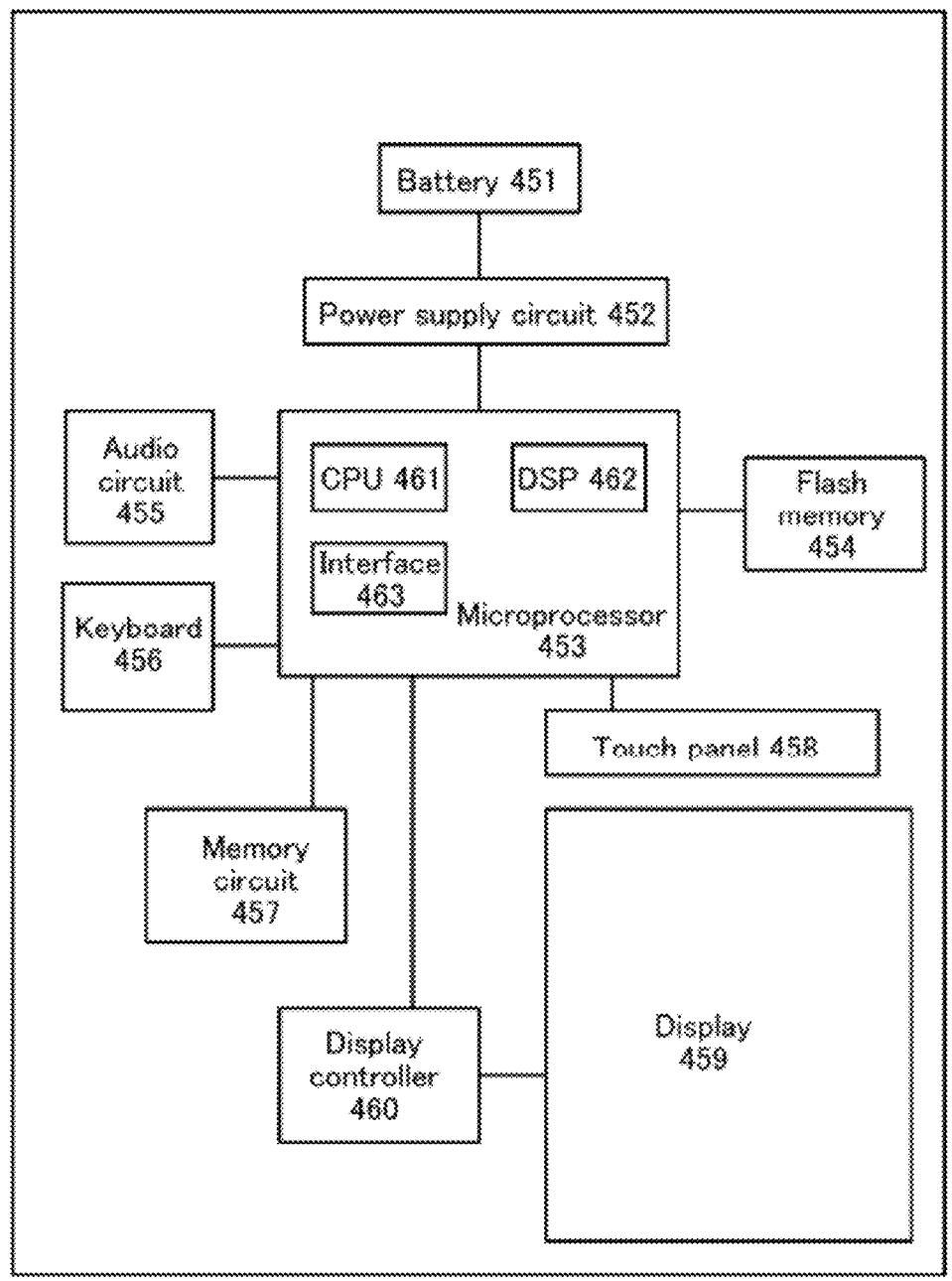
FIG. 25 is a block diagram of an e-book reader.

Next, FIG. 25 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a CPU 461, a DSP 462, and an interface (IF) 463. The signal processing circuit described in the above embodiment is employed for the CPU 461 or the DSP 462, whereby power consumption can be reduced.

This example can be implemented in combination with any of the embodiments or the other example as appropriate.

This application is based on Japanese Patent Application serial No. 2011-050025 filed with Japan Patent Office on Mar. 8, 2011 and Japanese Patent Application serial No. 2011-108904 filed with Japan Patent Office on May 14, 2011, the entire contents of which are hereby incorporated by reference.

What is claimed is:
1. A memory element comprising:
a volatile memory circuit and a switch;
a data input terminal connected to an output of the volatile memory circuit;
a first circuit comprising a first transistor and a second transistor, a gate of the second transistor being functionally connected to the data input terminal through a source and a drain of the first transistor;
a second circuit comprising a third transistor and a fourth transistor, a gate of the fourth transistor being functionally connected to the data input terminal through a source and a drain of the third transistor; and
a sense amplifier comprising an input terminal and an output terminal, the input terminal being functionally connected to one of a source and a drain of the second transistor and to one of a source and a drain of the fourth transistor, and the output terminal being electrically connected to an input terminal of the volatile memory circuit through the switch,
wherein the memory element is wired so that, when a first current is output from the one of the source and the drain of the second transistor toward the input terminal of the sense amplifier and a second current is output from the one of the source and the drain of the fourth transistor toward the sense amplifier, the first current and the second current go through a same electrical node,
wherein the memory element is wired so as to input simultaneously a same signal to a gate of the first transistor and to a gate of the third transistor,
wherein the memory element is wired so as to input simultaneously a first signal to the gate of the second transistor and a second signal to the gate of the fourth transistor, the second signal being one of the first signal and an inverted signal of the first signal,
wherein the first signal and the second signal correspond to a same bit of data and originate from the data input terminal, and
wherein the memory element is configured to hold data of the volatile memory circuit in the first circuit and the second circuit when power supply voltage is stopped.

2. The memory element according to claim 1, further comprising a switch,
wherein the input terminal of the sense amplifier is functionally connected to the one of the source and the drain of the second transistor and to the one of the source and the drain of the fourth transistor through the switch.

3. The memory element according to claim 1,
wherein the first transistor and the third transistor each include an oxide semiconductor layer in which a channel is to be formed.

4. The memory element according to claim 1,
further comprising an inverter circuit through which the data input terminal is functionally connected to the gate of the fourth transistor,
wherein the second transistor and the fourth transistor are of different polarities,
wherein the inverter circuit is configured to output the inverted signal of the first signal, and
wherein the second signal is the inverted signal of the first signal.

5. The memory element according to claim 1,
wherein the second transistor and the fourth transistor are of different polarities.

6. The memory element according to claim 1,
wherein the memory element is further configured to return the data backed up in the first circuit and in the second circuit to the volatile memory circuit when power supply voltage restarts.

7. The memory element according to claim 6,
wherein the output terminal of the volatile memory circuit is directly connected to the data input terminal.

8. The memory element according to claim 1,
wherein the memory element is configured to hold a first signal potential and a second signal potential in the gate of the second transistor and the gate of the fourth transistor, respectively, and
wherein the first signal potential and the second signal potential correspond to the same bit of data.

9. A signal processing circuit comprising the memory element according to claim 1.

10. The memory element according to claim 1,
wherein the first transistor includes a first oxide semiconductor layer in which a first channel is to be formed,
wherein the second transistor includes a second silicon layer in which a second channel is to be formed,
wherein the third transistor includes a third oxide semiconductor layer in which a third channel is to be formed, and
wherein a polarity of the second transistor is different from a polarity of the fourth transistor.

11. A memory element comprising:
a volatile memory circuit and a switch;
a data input terminal connected to an output of the volatile memory circuit;
a first circuit comprising a first transistor and a second transistor, a gate of the second transistor being functionally connected to the data input terminal through a source and a drain of the first transistor;
a second circuit comprising a third transistor and a fourth transistor, a gate of the fourth transistor being functionally connected to the data input terminal through a source and a drain of the third transistor;
a precharge circuit; and
a sense amplifier comprising an input terminal and an output terminal, the input terminal being functionally connected to one of a source and a drain of the second transistor and to one of a source and a drain of the fourth transistor through the precharge circuit, and the output terminal being electrically connected to an input terminal of the volatile memory circuit through the switch,
wherein the memory element is wired so that, when a first current is output from the one of the source and the drain of the second transistor toward the input terminal of the sense amplifier and a second current is output from the one of the source and the drain of the fourth transistor toward the sense amplifier, the first current and the second current go through a same electrical node,
wherein the memory element is wired so as to input simultaneously a same signal to a gate of the first transistor and to a gate of the third transistor,
wherein the memory element is wired so as to input simultaneously a first signal to the gate of the second transistor and a second signal to the gate of the fourth transistor, the second signal being one of the first signal and an inverted signal of the first signal,
wherein the first signal and the second signal correspond to a same bit of data and originate from the data input terminal, and
wherein the memory element is configured to hold data of the volatile memory circuit in the first circuit and the second circuit when power supply voltage is stopped.

12. The memory element according to claim 11,
wherein the precharge circuit comprises a first switch and a second switch, and
wherein the sense amplifier is functionally connected to the one of the source and the drain of the second transistor and to the one of the source and the drain of the fourth transistor through the first switch.

13. The memory element according to claim 11,
wherein the first transistor and the third transistor each include an oxide semiconductor layer in which a channel is to be formed.

14. The memory element according to claim 1,
further comprising an inverter circuit through which the data input terminal is functionally connected to the gate of the fourth transistor,
wherein the second transistor and the fourth transistor are of different polarities,
wherein the inverter circuit is configured to output the inverted signal of the first signal, and
wherein the second signal is the inverted signal of the first signal.

15. The memory element according to claim 11,
wherein the second transistor and the fourth transistor are of different polarities.

16. The memory element according to claim 11,
wherein the memory element is further configured to return the data backed up in the first circuit and in the second circuit to the volatile memory circuit when power supply voltage restarts.

17. The memory element according to claim 16,
wherein the output terminal of the volatile memory circuit is directly connected to the data input terminal.

18. The memory element according to claim 11,
wherein the memory element is configured to hold a first signal potential and a second signal potential in the gate of the second transistor and the gate of the fourth transistor, respectively, and
wherein the first signal potential and the second signal potential correspond to the same bit of data.

19. A signal processing circuit comprising the memory element according to claim 11.

20. The memory element according to claim 11,
wherein the first transistor includes a first oxide semiconductor layer in which a first channel is to be formed,
wherein the third transistor includes a third oxide semiconductor layer in which a third channel is to be formed, and
wherein a polarity of the second transistor is different from a polarity of the fourth transistor.

21. The memory element according to claim 11,
wherein the third transistor includes a third oxide semiconductor layer in which a third channel is to be formed, and
wherein a polarity of the second transistor is different from a polarity of the fourth transistor.

22. The memory element according to claim 11,
wherein a polarity of the second transistor is different from a polarity of the fourth transistor.

23. A memory element comprising:
a volatile memory circuit;
a data input terminal connected to an output of the volatile memory circuit;
a first circuit comprising a first transistor and a second transistor, a gate of the second transistor being functionally connected to the data input terminal through a source and a drain of the first transistor;

a second circuit comprising a third transistor and a fourth transistor, a gate of the fourth transistor being functionally connected to the data input terminal through a source and a drain of the third transistor; and a sense amplifier comprising functionally connected to one of a source and a drain of the second transistor and to one of a source and a drain of the fourth transistor, wherein the memory element is wired so as to input simultaneously a same signal to a gate of the first transistor and to a gate of the third transistor, wherein the memory element is wired so as to input simultaneously a first signal to the gate of the second transistor and a second signal to the gate of the fourth transistor, the second signal being one of the first signal and an inverted signal of the first signal, and wherein the first signal and the second signal correspond to a same bit of data and originate from the data input terminal, and wherein the memory element is configured to hold data of the volatile memory circuit in the first circuit and the second circuit when power supply voltage is stopped.

24. The memory element according to claim 23, further comprising:

a first precharge circuit connected in series between a first input terminal of the sense amplifier and one of a source and a drain of the second transistor; and a second precharge circuit connected in series between a second input terminal of the sense amplifier and one of a source and a drain of the fourth transistor; and wherein the first precharge circuit comprises a first switch and a second switch, wherein the sense amplifier is functionally connected to the one of the source and the drain of the second transistor through the first switch, wherein the second precharge circuit comprises a third switch and a fourth switch, and wherein the sense amplifier is functionally connected to the one of the source and the drain of the fourth transistor through the third switch.

25. The memory element according to claim 23, further comprising an inverter circuit through which the data input terminal is functionally connected to the gate of the fourth transistor, wherein the second transistor and the fourth transistor are of different polarities, wherein the inverter circuit is configured to output the inverted signal of the first signal, and wherein the second signal is the inverted signal of the first signal.

26. The memory element according to claim 23, wherein the second transistor and the fourth transistor are of different polarities.

27. The memory element according to claim 23, further comprising a switch, wherein an output terminal of the volatile memory circuit is electrically connected to the data input terminal, wherein an output terminal of the sense amplifier is electrically connected to an input terminal of the volatile memory circuit through the switch, and wherein the memory element is further configured to return the data backed up in the first circuit and in the second circuit to the volatile memory circuit when power supply voltage restarts.

28. The memory element according to claim 27, wherein the output terminal of the volatile memory circuit is directly connected to the data input terminal.

29. The memory element according to claim 23, wherein the memory element is configured to hold a first signal potential and a second signal potential in the gate of the second transistor and the gate of the fourth transistor, respectively, and wherein the first signal potential and the second signal potential correspond to the same bit of data.

30. A signal processing circuit comprising the memory element according to claim 23.

31. The memory element according to claim 23, wherein the first transistor and the third transistor each include an oxide semiconductor layer in which a channel is to be formed.

* * * * *

UNITED STATES PATENT AND TRADEMARK OFFICE
CERTIFICATE OF CORRECTION

PATENT NO. : 9,508,448 B2
APPLICATION NO. : 13/405422
DATED : November 29, 2016
INVENTOR(S) : Masami Endo Page 1 of 1

It is certified that error appears in the above-identified patent and that said Letters Patent is hereby corrected as shown below:

In the Specification

Column 14, Line 40, replace "iN" with --IN--;

Column 15, Line 13, after "terminal" replace "N" with --IN--;

Column 21, Line 11, after "terminals" replace "51" with --S1--;

Column 35, Line 18, after "terminal" replace "1*1*," with --W1,--;

Column 43, Line 61, replace " $In:Zn:O = X:Y:Z,$ " with --In:Zn:O=X:Y:Z,--;

Column 68, Line 55, after "Sample" replace "S" with --A--; and

In the Claims

Column 74, Line 12, in Claim 14, after "claim" replace "1," with --11,--.

Signed and Sealed this
Eleventh Day of April, 2017

Michelle K. Lee
*Director of the United States Patent and Trademark Office*